United States Patent
Baumann et al.

(10) Patent No.: US 11,367,848 B2
(45) Date of Patent: Jun. 21, 2022

(54) LIGHT-EMITTING LAYER SUITABLE FOR BRIGHT LUMINESCENCE

(71) Applicant: CYNORA GMBH, Bruchsal (DE)

(72) Inventors: Thomas Baumann, Karlsruhe (DE);
Mathias Mydlak, Karlsruhe (DE);
Harald Flugge, Karlsruhe (DE);
Charlotte Flechon, Bruchsal (DE);
Georgios Liaptsis, Mannheim (DE)

(73) Assignee: CYNORA GMBH, Bruchsal (DE)

( * ) Notice: Subject to any disclaimer, the term of this patent is extended or adjusted under 35 U.S.C. 154(b) by 528 days.

(21) Appl. No.: 15/510,523

(22) PCT Filed: Sep. 7, 2015

(86) PCT No.: PCT/EP2015/070342
§ 371 (c)(1),
(2) Date: Mar. 10, 2017

(87) PCT Pub. No.: WO2016/041802
PCT Pub. Date: Mar. 24, 2016

(65) Prior Publication Data
US 2017/0250363 A1   Aug. 31, 2017

(30) Foreign Application Priority Data

Sep. 16, 2014 (EP) .................................. 14003195

(51) Int. Cl.
| H01L 51/54 | (2006.01) |
| H01L 51/50 | (2006.01) |
| H01L 51/00 | (2006.01) |
| H01L 51/52 | (2006.01) |
| H01L 51/56 | (2006.01) |

(52) U.S. Cl.
CPC ........ H01L 51/5028 (2013.01); H01L 51/009 (2013.01); H01L 51/0091 (2013.01);
(Continued)

(58) Field of Classification Search
CPC .............. H01L 51/0032; H01L 51/005; H01L 51/0052; H01L 51/0058; H01L 51/0062; H01L 51/0067; H01L 51/0071; H01L 51/0072; H01L 51/0073; H01L 51/0074; H01L 51/0077; H01L 51/009; H01L 51/0091; H01L 51/50; H01L 51/5012; H01L 51/5016; H01L 51/5004; H01L 51/5024; H01L 51/5028; H01L 51/5036; H01L 51/504; H01L 51/5044; H01L 51/5056; H01L 51/5072; H01L 51/5096; H01L 51/5206; H01L 51/5221; H01L 2251/00; H01L 2251/30; H01L 2251/50; H01L 2251/5384; H01L 2251/5376; H01L 2251/55; H01L 2251/552; H01L 2251/301; H01L 2251/303; H01L 2251/306; H01L 2251/308; Y02E 10/549; C09K 11/06; C09K 2211/00; C09K 2211/1003; C09K 2211/1011; C09K 2211/1018; C09K 2211/1022; C09K 2211/1025; C09K 2211/1029; C09K 2211/1044; C09K 2211/1059; C09K 2211/1088; C09K 2211/1092; C09K 2211/1096; C09K 2211/1033; C09K 2211/1037; C09K 2211/1048; C09K 2211/1051; C09K 2211/1062; C09K 2211/1066; C09K 2211/18; C09K 2211/188; C09K 2211/185; C07D 209/82; C07D 403/00; C07D 403/02; C07D 403/10; C07D 409/00;
(Continued)

(56) References Cited

U.S. PATENT DOCUMENTS

| 2010/0090592 A1* | 4/2010 | Shiobara ............. H01L 27/3211 313/504 |
| 2010/0213452 A1* | 8/2010 | Sisk .................... C07D 213/38 257/40 |
| 2011/0155954 A1 | 3/2011 | Yersin et al. |
| 2012/0184738 A1 | 7/2012 | Yersin et al. |
| 2012/0217869 A1 | 8/2012 | Adachi et al. |
| 2014/0077172 A1 | 3/2014 | So et al. |
| 2014/0103310 A1 | 4/2014 | Krestel et al. |

(Continued)

FOREIGN PATENT DOCUMENTS

| EP | 2175503 A2 | 4/2010 |
| WO | 2010/031485 A1 | 3/2010 |
| WO | 2010/149748 A1 | 12/2010 |
| WO | 2011/161417 A1 | 12/2011 |
| WO | 2012/016074 A1 | 2/2012 |
| WO | 2012/130571 A1 | 10/2012 |
| WO | 2013/001086 A1 | 1/2013 |

(Continued)

OTHER PUBLICATIONS

International Search Report for PCT/EP2015/070342 dated Jan. 13, 2016.

(Continued)

*Primary Examiner* — Andrew K Bohaty
(74) *Attorney, Agent, or Firm* — J. A. Lindeman & Co. PLLC

(57) ABSTRACT

The present invention relates to a light-emitting layer B comprising a first emitter compound (a) having a non-exited state S0(a), a first excited singlet state S1(a) and a first excited triplet state T1(a); a second emitter compound (b) having a non-exited state S0(b), a first excited singlet state S1(b) and a first excited triplet state T1(b), wherein the energy level of S1(a) is higher than that of S1(b), the energy level of S1(b) is higher than that of T1(b) and wherein the rate of reverse intersystem crossing from T1(a) to S1(a) is higher than the rate of excitation energy transfer from S1(a) to S1(b) and/or the rate of excitation energy transfer from T1(a) to T1(b), and/or wherein the energy level of T1(b) is higher than that of T1(a). Further, the present invention also refers to an opto-electronic device comprising such light-emitting layer B and use thereof.

20 Claims, 8 Drawing Sheets

Figure 1:
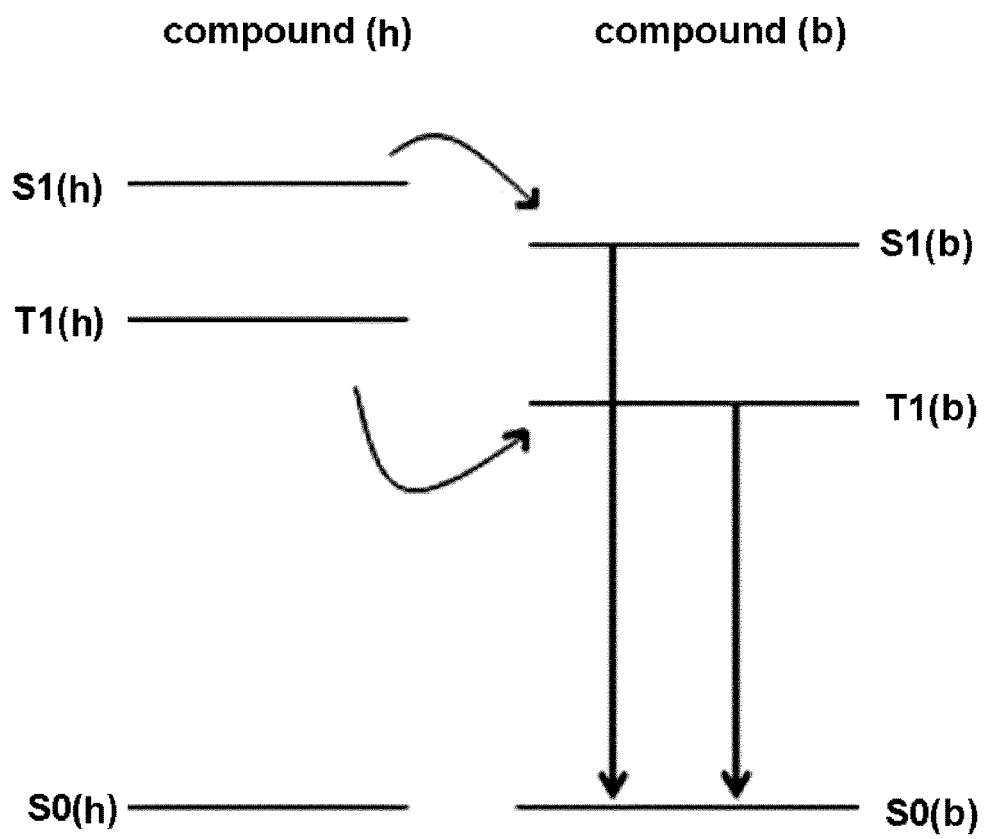

(52) U.S. Cl.
CPC ...... *H01L 51/5004* (2013.01); *H01L 51/5016* (2013.01); *H01L 51/5056* (2013.01); *H01L 51/5072* (2013.01); *H01L 51/5096* (2013.01); *H01L 51/5206* (2013.01); *H01L 51/5221* (2013.01); *H01L 51/56* (2013.01); *H01L 51/504* (2013.01); *H01L 51/5036* (2013.01); *H01L 51/5044* (2013.01); *H01L 2251/301* (2013.01); *H01L 2251/303* (2013.01); *H01L 2251/306* (2013.01); *H01L 2251/308* (2013.01); *H01L 2251/5376* (2013.01); *H01L 2251/5384* (2013.01); *H01L 2251/55* (2013.01); *H01L 2251/552* (2013.01); *Y02E 10/549* (2013.01)

(58) Field of Classification Search
CPC .. C07D 409/02; C07D 409/10; C07D 407/00; C07D 407/02; C07D 407/10; C07F 1/00; C07F 1/08
USPC ....... 428/690, 691, 411.4, 336, 917; 427/58, 427/66; 313/500–512; 257/40, 88–104, 257/E51.001–E51.052; 252/301.16–301.35
See application file for complete search history.

(56) References Cited

U.S. PATENT DOCUMENTS

| | | | |
|---|---|---|---|
| 2014/0142258 A1 | 5/2014 | Baumann et al. | |
| 2014/0142259 A1 | 5/2014 | Volz et al. | |
| 2014/0166944 A1 | 6/2014 | Baumann et al. | |
| 2014/0167027 A1 | 6/2014 | Yersin et al. | |
| 2014/0213806 A1 | 7/2014 | Wesemann et al. | |
| 2014/0235006 A1 | 8/2014 | Baumann et al. | |
| 2014/0326981 A1 | 11/2014 | Baumann et al. | |
| 2015/0105564 A1* | 4/2015 | Adachi | C07D 209/18 548/440 |
| 2015/0340614 A1 | 11/2015 | Volz et al. | |

FOREIGN PATENT DOCUMENTS

| | | |
|---|---|---|
| WO | 2013/007707 A1 | 1/2013 |
| WO | 2013/007709 A2 | 1/2013 |
| WO | 2013/007710 A1 | 1/2013 |
| WO | 2013/014066 A1 | 1/2013 |
| WO | 2013/017675 A1 | 2/2013 |
| WO | 2013/072508 A1 | 5/2013 |
| WO | WO-2013154064 A1 * | 10/2013 |
| WO | 2014/102079 A1 | 7/2014 |

OTHER PUBLICATIONS

Written Opinion of the International Searching Authority for PCT/EP2015/070342 dated Mar. 24, 2016.
Sigma-Aldrich "Tris[1-phenylisoquinoline-C2,N]iridium(III)," Product Catalogue, XP-002752474, accessed date Dec. 18, 2015.
Sigma-Aldrich "Tris[2-(4,6-difluorophenyl)pyridinato-C2,N]iridium (III)," Product Catalogue, XP-002752475, accessed date Dec. 18, 2015.

* cited by examiner

LIGHT-EMITTING LAYER SUITABLE FOR BRIGHT LUMINESCENCE

The present invention relates to a light-emitting layer B comprising a first emitter compound (a) having a non-exited state S0(a), a first excited singlet state S1(a) and a first excited triplet state T1(a); a second emitter compound (b) having a non-exited state S0(b), a first excited singlet state S1(b) and a first excited triplet state T1(b), wherein the energy level of S1(a) is higher than that of S1(b), the energy level of S1(b) is higher than that of T1(b) and wherein the rate of reverse intersystem crossing from T1(a) to S1(a) is higher than the rate of excitation energy transfer from S1(a) to S1(b) and/or the rate of excitation energy transfer from T1(a) to T1(b), and/or wherein the energy level of T1(b) is higher than that of T1(a). Further, the present invention also refers to an opto-electronic device comprising such light-emitting layer B and use thereof.

Opto-electronic devices based on organics such as, e.g., organic light emitting diodes (OLEDs), light emitting electrochemical cells (LECs), organic lasers, organic solar cells (OSCs) and optical sensors, gain increasing importance. In particular, OLEDs and LECs are promising devices for electronic products such as, e.g., screens, displays and illumination devices. In contrast to most opto-electronic devices essentially based on inorganics only, opto-electronic devices based on organics are often rather flexible and producible in particularly thin layers. The OLED-based screens and displays already available today bear particularly beneficial brilliant colors, contrasts and are comparably efficient with respect to their energy consumption.

Two of the mayor challenges when generating opto-electronic light-emitting devices is to improve the illumination level of the devices and to improve the light spectrum. In order to improve the illumination level achieved by a device per introduced electric energy, today, often emitter compounds having a comparably strong spin-orbit interaction and thus an increased intersystem crossing (ISC) rate between the excited singlet energy level S1 to the excited triplet energy level T1 and vice versa (triplet harvesting and singlet harvesting, respectively). This allows the use of singlet as well as triplet states for the emission of light and thereby enables to obtain a theoretical quantum yield of 100%. Often metal complexes are used for such purpose.

Too high densities of emitters often lead to self-quenching resulting in a lower quantum yield. Therefore, often host molecules spatially separating the single molecules of the emitter compound from another are used. Sometimes, such hosts are also used to increase the charge carrier mobility of a luminescent layer comprising the emitter compound, or optimize the morphology or thermal stability.

Some of the hosts used in the art can also improve the efficiency of the opto-electronic device due to energy transfer from the host to the emitter compound. In the ideal case of such host-emitter systems, all excitons are transferred via energy and/or charge transfer from the host to the excited singlet S1 or triplet T1 energy levels of the emitter compound. Therefore, in the art, it is desired to obtain combinations of hosts with emitter compounds, wherein the excited singlet and triplet energy levels of the emitter compound are lower than the S1 and T1 of the host. Such system is exemplarily shown in US 2014/0077172.

Such systems however show undesired roll-off effects within short use times of the device, in particular at higher electrical current flow, especially where relatively high energies and relatively long transient times are involved. For example, blue phosphorescent OLEDs (PHOLEDs) may have relatively short operational lifetimes. The probability of non-radiative decay of an exciton is considerably high. This, on the one hand, significantly decreases the maximal quantum yield obtainable by the device and, thereby, the maximally obtainable brightness. Further, this may, under certain circumstances, even lead to the occurrence of triplet-triplet annihilation (TTA) effects that are so strong that the device is entirely inoperative for higher electrical current flows or longer-lasting illumination.

Moreover, such systems typically bear considerably strong bathochrome shift due to the loss of energy by transference to the low energy level of the T1 of the emitter compound. Therefore, many of the devices known in the art are merely able to emit light of rather long wavelengths (i.e., yellow or red light) and do not emit sufficient amounts of blue light. Other systems bear combinations of two compounds wherein only one is able to emit light and the other serves as non-emissive and even quenched host (WO 2011/161417 and US 2012/0217869). Thereby, quantum yield typically drops and the emission band is comparably narrow.

In the view of the above, there is still an unmet need for light-emitting layers having a suitable luminescence efficiency (i.e, brightness per current) even at higher electrical current flows and enabling also the emittance of light of shorter wavelengths.

Surprisingly, we found that a system of at least two emitters (a) and (b), wherein either both energy levels, S1(b) as well as the T1(b), of one of the emitters (b) are below the S1(a) and above the T1(a) of the other emitter (a), or both energy levels, S1(b) as well as the T1(b), of one of the emitters (b) are both below the S1(a) and the T1(a) of the other emitter (a) (S1(b) is either above or below T1(a)) with $k_{RISC}(T1(a) \rightarrow S1(a))$ and/or $k_{FT}(S1(a) \rightarrow S1(b)) \gg k_T$ T1(a)→T1(b) leads to a desirably high luminescence efficiency, even at higher electrical current flows, and enables also the emittance of light of longer wavelengths.

In a first aspect, the present invention relates to a light-emitting layer B comprising:
(a) a first emitter compound (a) having a non-exited state S0(a), a first excited singlet state S1(a) and a first excited triplet state T1(a);
(b) a second emitter compound (b) having a non-exited state S0(b), a first excited singlet state S1(b) and a first excited triplet state T1(b); and
(c) optionally, one or more host components (c),
wherein the energy level of S1(a) is higher than that of S1(b), the energy level of S1(b) is higher than that of T1(b) and wherein:
(i) the rate of reverse intersystem crossing (RISC) from T1(a) to S1(a) ($k_{RISC}(T1(a) \rightarrow S1(a))$) is higher than the rate of excitation energy transfer from S1(a) to S1(b) ($k_{EET}(S1(a) \rightarrow S1(b))$) and/or the rate of excitation energy transfer from T1(a) to T1(b) ($k_{EET}(T1(a) \rightarrow T1(b))$), and/or
(ii) the energy level of T1(b) is higher than that of T1(a).

The person skilled in the art will notice that, preferably, in the light-emitting layer B, the energy level of S1(a) is higher than that of T1(b). This is also reflected by the Figures show below.

In the light-emitting layer B, the energy level of S1(a) is often higher than that of T1(b). This is also reflected by the Figures show below. Optionally, the emission spectrum of the first emitter compound (a) may overlap or partly overlap with the absorption spectrum of the second emitter compound (b) and/or the emission spectrum of the second emitter compound (b) may overlap or partly overlap with the absorption spectrum of the first emitter compound (a).

Herein, the emission spectrum may include the emission from the respective S1 state and/or the respective T1 state.

Optionally, herein, the energy level of T1(b) is higher than that of T1(a) and the rate of reverse intersystem crossing from T1(a) to S1(a) is higher than the rate of excitation energy transfer from S1(a) to S1(b) and/or the rate of excitation energy transfer from T1(a) to T1(b). In this context, S1(b) may be lower, equal, or higher than T1(a).

Optionally, herein, the energy level of T1(b) is higher than that of T1(a) and the rate of reverse intersystem crossing from T1(a) to S1(a) is higher than the rate of excitation energy transfer from S1(a) to S1(b) and the rate of excitation energy transfer from T1(a) to T1(b). In this context, S1(b) may be lower, equal, or higher than T1(a).

Alternatively, herein, the energy level of T1(b) is lower than that of T1(a) and the rate of reverse intersystem crossing from T1(a) to S1(a) is higher than the rate of excitation energy transfer from S1(a) to S1(b) and/or the rate of excitation energy transfer from T1(a) to T1(b). In this context, S1(b) may be lower, equal, or higher than T1(a).

Optionally, herein, the energy level of T1(b) is lower than that of T1(a) and the rate of reverse intersystem crossing from T1(a) to S1(a) is higher than the rate of excitation energy transfer from S1(a) to S1(b) and the rate of excitation energy transfer from T1(a) to T1(b). In this context, S1(b) may be lower, equal, or higher than T1(a).

Alternatively, herein, the energy level of T1(b) is equal than that of T1(a) and the rate of reverse intersystem crossing from T1(a) to S1(a) is higher than the rate of excitation energy transfer from S1(a) to S1(b) and/or the rate of excitation energy transfer from T1(a) to T1(b). In this context, S1(b) may be lower, equal, or higher than T1(a).

Optionally, herein, the energy level of T1(b) is equal than that of T1(a) and the rate of reverse intersystem crossing from T1(a) to S1(a) is higher than the rate of excitation energy transfer from S1(a) to S1(b) and the rate of excitation energy transfer from T1(a) to T1(b). In this context, S1(b) may be lower, equal, or higher than T1(a).

The light-emitting layer B as used herein may be any layer enabling the emittance of light, preferably in the visible range (i.e., of wavelengths of between 400 and 800 nm).

Preferably, the emission and/or excitation maximum of emitter compound (a) differs at least by 20 nm from the emission and/or excitation maximum of emitter compound (b), more preferably by 25 nm or more, in particular by 30 nm or more.

Preferably, the excited singlet state S1(a) of the first compound (a) can decay radiatively (i.e., by emitting light due to fluorescence) and can also be transferred to the excited singlet state S1(b) of the second compound (b).

Likewise, the excited triplet state T1(a) of the first compound (a) can preferably also decay radiatively (i.e., by emitting light due to phosphorescence) and can also undergo reverse intersystem crossing (reverse ISC) from the T1(a) to S1(a). Herein, the possibility of reverse ISC may be due to the small energy difference $\Delta E_{ST}(a)$ between S1(a) and T1(a) (small singlet-triplet splitting).

Preferably, energy transfer from S1(a) to S1(b) and radiative decay from S1(b) to S0(b) may occur in the light-emitting layer B. For that, reverse intersystem crossing (RISC) from T1(a) to S1(a) may be faster than Förster or Dexter transfer from T1(a) to T1(b).

Likewise, also the excited triplet state T1(b) of the second compound (b) can preferably decay radiatively (i.e., by emitting light due to phosphorescence) and can also be transferred to the excited triplet state T1(a) of the first compound (a). Further, the excited triplet state T1(b) of the second compound (b) can preferably also undergo reverse intersystem crossing (reverse ISC) from the T1(b) to S1(b). Herein, the possibility of reverse ISC may be due to the small energy difference $\Delta E_{ST}(b)$ between S1(b) and T1(b) (small singlet-triplet splitting).

In view of the aforementioned, it may be noticed that in the light-emitting layer B according to the present invention (based on a two emitter system with the aforementioned characteristics), the excitons may, directly or indirectly, be recycled from all excited energy levels of the two emitters (i.e, S1(a), T1(a), S1(b), and T1(b)) into all the others. Thereby the probability of non-radiative decay is particularly low. Further, herein, the triplet density may be spread on both emitters lowering the occurrence of triplet-triplet annihilation (TTA). These properties may improve the efficiency and the lifetime of the device.

Moreover, the emission wavelength of the devices can be tuned by changing the ratio between emitting compound (a) and emitting compound (b). Therefore, the light-emitting layer B according to the present invention is particularly suitable for adjusting the wavelength of the emitted light.

In the context of the present invention, a light-emitting layer B may be understood in the broadest sense as any optically active layer that is, depending on certain conditions, able to emit light when introduced in an opto-electronic device.

Accordingly, the light-emitting layer B may indeed be used to generate light. For generating light, the light-emitting layer B is typically incorporated into an opto-electronic device. Then, electrical or chemical energy is fed to such device. Preferably, an electrical current flow is led through the opto-electronic device and thereby through the light-emitting layer B incorporated therein. Thereby, the electrical current flow excites one or both of the emitter compounds (a) and/or (b) included therein, leading to excitons (i.e., one or more excited state(s) selected from the group consisting of S1(a), T1(a), S1(b), and T1(b) and optionally also higher energy level(s) such as, e.g., S2(a), S2(b) etc.) that may relax into the basic energy level(s) corresponding to the respective non-exited state(s) S0(a) and/or S0(b) by concomitantly emitting light. As mentioned above, the energy of the exciton may also be transferred into other excited states.

The light-emitting layer B may, however, also be used to absorb light and thereby convert light energy into electric energy (i.e., separation of charge and/or current flow).

Preferably, the light-emitting layer B may be mainly composed of both inorganic compounds and organic components, i.e., hydrocarbons which may optionally also comprise heteroatoms such as, e.g., nitrogen, oxygen, phosphor and/or sulfur as substituents. Optionally, the light-emitting layer B is mainly composed of organic components.

The term "layer" as used in the context of the present invention preferably is a body that bears an extensively planar geometry. The light-emitting layer B preferably bears a thickness of not more than 1 mm, more preferably not more than 0.1 mm, even more preferably not more than 10 µm, even more preferably not more than 1 µm, in particular not more than 0.1 µm.

Unless otherwise specified, any of the layers of the various embodiments may be deposited by any suitable method. The layers in the context of the present invention, including the light-emitting layer B, may optionally be prepared by means of liquid processing (also designated as "film processing", "fluid processing", solution processing or "solvent processing"). This means that the components comprised in the respective layer are applied to the surface of a part of a device in liquid state. Preferably, the layers in the context of the present invention, including the light-emitting layer B, may be prepared by means of spin-coating. This method well-known to those skilled in the art allows obtaining thin and (essentially) homogeneous layers.

Alternatively, the layers in the context of the present invention, including the light-emitting layer B, may be prepared by other methods based on liquid processing such as, e.g., casting (e.g., dropcasting) and rolling methods, and printing methods (e.g., inkjet printing, gravure printing, blade coating). This may optionally be carried out in an inert atmosphere (e.g., in a nitrogen atmosphere).

Alternatively, the layers in the context of the present invention, including the light-emitting layer B, may be prepared by any other method known in the art, including but not limited to vacuum processing methods well-known to those skilled in the art such as, e.g., thermal evaporation, organic vapor phase deposition (OVPD), and deposition by organic vapor jet printing (OVJP).

When preparing layers by means of liquid processing, the solutions including the components of the layers (i.e., with respect to the light-emitting layer B, a first emitter compound (a), a second emitter compound (b), and, optionally, one or more host component(s) (c) may further comprise a volatile organic solvent. Such volatile organic solvent may optionally be one selected from the group consisting of: tetrahydrofuran, dioxane, chlorobenzene, diethylene glycol diethyl ether, 2-(2-Ethoxyethoxy)ethanol, gamma-butyrolactone, N-methyl pyrollidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate).

Also a combination of two or more solvents may be used. In order to improve the flow properties, one or more additive(s) may optionally be added. Exemplarily, such an additives may be selected from the group consisting of polyethyloxides (polyethylene glycols), polyethylene diamines, polyacrylates (e.g., poly(methyl methacrylate) (PMMA), polyacrylic acid and salts thereof (superabsorber)), substituted or unsubstituted polystyrenes (e.g., polyhydroxystyrene), polyvinylalcohols, Polyesters or polyurethanes, polyvinylcarbazoles, polytriaryamines, polythiophenes and poly(vinylidene phenylenes). Also a combination of two or more additives may be used. After applied in liquid state, the layer may subsequently be dried and/or hardened bay any means of the art, exemplarily at ambient conditions, at increased temperature (e.g., about 50° C. or about 60° C.) or at diminished pressure.

Optionally, the light-emitting layer B may also comprise fluorescent polymers (e.g., superyellow (SY)), photoluminescent nanoparticles (e.g., of silicium), quantum dots, cadmium selenide and/or exciplexes, optionally diluted with one or more host component(s). Exemplarily, such host component may be selected from those shown in WO 2013/007709 or WO 2013/007710, also without conjugation between host and emitter. Particularly for preparing LECs, also guanidinium compounds such as those shown in WO 2012/130571 and/or poly(ethylene oxide) (PEO) may be used.

In order to modify the emission spectrum and/or the absorption spectrum of the light-emitting layer B further, the light-emitting layer B may further comprise one or more dye(s).

Such dye may be any dye known in the art. The dye may optionally be a fluorescent and/or phosphorescent dye which is able to shift the emission spectrum and/or the absorption spectrum of the light-emitting layer B. Optional, it may also provoke two-photon effects (i.e., the absorption of two photons of half the energy of the absorption maximum).

Typically, when using a fluorescent and/or phosphorescent dye, a bathochromer shift of the emission spectrum is achieved (exemplarily due to thermal loss). By means of a two-photon effect, also hypsochromer shifting may be achieved.

The light-emitting layer B may also (in particular when it is intended for a light-emitting electrochemical cell (LEC)) comprise an ionic fluid or a combination of two or more ionic liquids. Exemplarily, such ionic fluid may be such selected from the group consisting of: methylimidazolium hexafluorophosphates (e.g., 1-alkyl-3-methylimidazolium hexafluorophosphate such as 1-methyl-3-methylimidazolium hexafluorophosphate, 1-ethyl-3-methylimidazolium hexafluorophosphate, 1-propyl-3-methylimidazolium hexafluorophosphate, 1-butyl-3-methylimidazolium hexafluorophosphate, 1-benzyl-3-methylimidazolinium hexafluorophosphate), dimethylimidazolium hexafluorophosphates (e.g., 1-alkyl-2,3-dimethylimidazolium hexafluorophosphate such as 1-butyl-2,3-dimethylimidazolium hexafluorophosphate), 3-methylimidazolium hexafluorophosphates (e.g., 1-alkyl-methylimidazolium hexafluorophosphates such as 1-methyl-3-methylimidazolium hexafluorophosphate, 1-ethyl-3-methylimidazolium hexafluorophosphate, 1-propyl-3-methylimidazolium hexafluorophosphate, 1-butyl-3-methylimidazolium hexafluorophosphate, 1-pentyl-3-methylimidazolium hexafluorophosphate, 1-hexyl-3-methylimidazolium hexafluorophosphate), 1-butyl-1-(3,3,4,4,5,5,6,6,7,7,8,8-tridecafluorooctyl)imidazolium hexafluorophosphate, 1-methyl-3-(3,3,4,4,5,5,6,6,7,7,8,8,8-tridecafluorooctyl)imidazolium hexafluorophosphate, 1-methyl-3-octylimidazolium hexafluorophosphate, methylimidazolium tetrafluoroborates (e.g., 1,3-dimethylimidazolium tetrafluoroborate, 1-ethyl-3-methyl-imidazolium tetrafluoroborate, 1-propyl-3-methylimidazolium tetrafluoroborate, 1-butyl-3-methyl-imidazolium tetrafluoroborate), 1-butyl-2,3-dimethylimidazolium tetrafluoroborate, 1-hexyl-3-methylimidazolium tetrafluoroborate, 1-methyl-3-octyl-imidazolium tetrafluoroborate, methylimidazolium trifluoromethanesulfonates (e.g., 1-methyl-3-methylimidazolium trifluoromethanesulfonate, 1-ethyl-3-methylimidazolium trifluoromethanesulfonate, 1-propyl-3-methylimidazolium trifluoromethanesulfonate, 1-butyl-3-methylimidazolium trifluoromethanesulfonate), 1,2,3-trimethylimidazolium trifluoromethanesulfonate, 1-ethyl-3-methylimidazolium bis(pentafluoroethylsulfonyl)imide, 1-butyl-3-methylimidazolium bis(trifluoromethylsulfonyl)imide, 1-butyl-3-methylimidazolium methanesulfonate, Tetrabutylammonium bistrifluoromethane sulfonimidate, Tetrabutylammonium methane sulfonate, Tetrabutylammonium nonafluorobutane sulfonate, Tetrabutylammonium heptadecafluorooctane sulfonate, tetrahexylammonium tetrafluoroborate, Tetrabutylammonium trifluoromethanesulfonate, tetrabutylammoniumbenzoate, Tetrabutylammonium halogenide (e.g., tetrabutylammoniumchloride, Tetrabutylammoniumbromide), 1-benzyl-3-methylimidazolium tetrafluoroborate, trihexyl-tetradecylphosphonium hexafluorophosphate, tetrabutyl-phosphonium methanesulfonate, tetrabutyl-phosphonium tetrafluoroborate, tetrabutyl-phosphoniumbromide, 1-butyl-3-methylpyridinium-bis(trifluormethylsulfonyl)imide, 1-butyl-4-methylpyridinium hexafluorophosphate, 1-butyl-4-methylpyridinium tetrafluoroborate, sodium tetraphenylborate, tetrabutylammonium tetraphenylborate, sodiumtetrakis(1-imidazolyl)borate and cesium tetraphenylborate.

Additionally or alternatively, the emitter layer may comprise one or more electrolyte(s) such as, e.g., $KCF_3SO_3$, $LiF_3SO_3$, poly(ethylene oxide), (polyethylene oxide)dimethyl acrylate, trimethylolpropane ethyoxylate.

The materials described herein as useful for a particular layer in an organic light emitting device may be used in combination with a wide variety of other materials present in the opto-electronic device.

Exemplarily, emitter compounds (i.e., emissive dopants) disclosed herein may be used in conjunction with a wide variety of hosts, transport layers, blocking layers, injection layers, electrodes and other layers that may be present. The materials described herein are merely non-limiting examples of materials that may be useful in combination with the compounds and components disclosed herein, and those skilled in the art are readily able to consult the literature to identify other materials that may be useful in combination herewith.

Optionally, the light-emitting layer B may also comprise one or more of the following compounds selected from the group consisting of an aromatic compound (e.g., benzene, biphenyl, triphenyl, triphenylene, naphthalene, anthracene, phenalene, phenanthrene, fluorene, pyrene, chrysene, perylene, azulene), an heteroaromatic compound (e.g., dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, selenophenodipyridine). Optionally, two or more of these structures may also be conjugated with another either directly or, e.g., via at least one of oxygen atom, nitrogen atom, sulfur atom, silicon atom, phosphorus atom, boron atom, or an optionally substituted hetero(alkylene), hetero(alkenylene), hetero(alkinylene) or (hetero)arylene residue. Herein each residue may optionally be substituted by a substituent selected from the group consisting of deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

As used throughout the present application, the terms "aryl" and "aromatic" may be understood in the broadest sense as any mono-, bi- or polycyclic aromatic moieties. An aryl may also be optionally substituted by one or more substituents which are exemplified further throughout the present application. Accordingly, the term "arylene" refers to a divalent residue that bears two binding sites to other molecular structures and thereby serving as a linker structure. As used throughout the present application, the terms "heteroaryl" and "heteroaromatic" may be understood in the broadest sense as any mono-, bi- or polycyclic heteroaromatic moieties that include at least one heteroatom, in particular which bear from one to three heteroatoms per aromatic ring. Exemplarily, a heteroaromatic compound may be pyrrole, furan, thiophene, imidazole, oxazole, thiazole, triazole, pyrazole, pyridine, pyrazine and pyrimidine, and the like. A heteroaryl may also be optionally substituted by one or more substituents which are exemplified further throughout the present application. Accordingly, the term "heteroarylene" refers to a divalent residue that bears two binding sites to other molecular structures and thereby serving as a linker structure.

As used throughout the present application, the term "alkyl" may be understood in the broadest sense as both, straight or branched chain alkyl residue. Preferred alkyl residues are those containing from one to fifteen carbon atoms. Exemplarily, an alkyl residue may be methyl, ethyl, propyl, isopropyl, butyl, isobutyl, tert-butyl, and the like. An alkyl may also be optionally substituted by one or more substituents which are exemplified further throughout the present application. Accordingly, the term "alkylene" refers to a divalent residue that bears two binding sites to other molecular structures and thereby serving as a linker structure.

As used throughout the present application, the term "heteroalkyl" may be understood in the broadest sense as both straight or branched chain alkyl residue wherein one or more carbon atom(s) are replaced by one or more heteroatom(s). A heteroalkyl may also be optionally substituted by one or more substituents which are exemplified further throughout the present application. Accordingly, the term "heteroalkylene" refers to a divalent residue that bears two binding sites to other molecular structures and thereby serving as a linker structure.

As used throughout the present application, the term "alkenyl" may be understood in the broadest sense as both, straight or branched chain alkyl residue. Preferred alkenyl residues are those containing from two to fifteen carbon atoms. Exemplarily, an alkyl residue may be ethenyl, propenyl, etc. An alkenyl may also be optionally substituted by one or more substituents which are exemplified further throughout the present application. Accordingly, the term "alkenylene" refers to a divalent residue that bears two binding sites to other molecular structures and thereby serving as a linker structure.

As used throughout the present application, the term "heteroalkenyl" may be understood in the broadest sense as both, straight or branched chain alkyl residue wherein one or more carbon atom(s) are replaced by one or more heteroatom(s). A heteroalkenyl may also be optionally substituted by one or more substituents which are exemplified further throughout the present application. Accordingly, the term "heteroalkenylene" refers to a divalent residue that bears two binding sites to other molecular structures and thereby serving as a linker structure.

As used throughout the present application, the term "alkinyl" may be understood in the broadest sense as both, straight or branched chain alkyl residue. Preferred alkinyl residues are those containing from two to fifteen carbon atoms. Exemplarily, an alkyl residue may be ethenyl, propenyl, etc. An alkinyl may also be optionally substituted by one or more substituents which are exemplified further throughout the present application. Accordingly, the term "alkinylene" refers to a divalent residue that bears two binding sites to other molecular structures and thereby serving as a linker structure.

As used throughout the present application, the term "heteroalkinyl" may be understood in the broadest sense as both, straight or branched chain alkyl residue wherein one or more carbon atom(s) are replaced by one or more heteroatom(s). A heteroalkinyl may also be optionally substituted by one or more substituents which are exemplified further throughout the present application. Accordingly, the term "heteroalkinylene" refers to a divalent residue that bears two binding sites to other molecular structures and thereby serving as a linker structure.

As used throughout the present application, the term "cycloalkyl" may be understood in the broadest sense as any cyclic alkyl residue. Preferred cycloalkyl residues are those containing from one to seven atoms in the cycle. Exemplarily, an cycloalkyl residue may be cyclopropyl, cyclopentyl, cyclohexyl, and the like. A cycloalkyl may also be optionally substituted by one or more substituents which are exemplified further throughout the present application. Accordingly, the term "cycloalkylene" refers to a divalent residue that bears two binding sites to other molecular structures and thereby serving as a linker structure. Correspondingly, the terms "cycloalkenyl" and "cycloalkinyl" will be understood.

As used throughout the present application, the term "heterocycloalkyl" may be understood in the broadest sense as a cycloalkyl residue wherein one or more carbon atom(s) are replaced by one or more heteroatom(s). A heterocycloalkyl may also be optionally substituted by one or more substituents which are exemplified further throughout the present application. Accordingly, the term "heterocycloalkylene" refers to a divalent residue that bears two binding sites to other molecular structures and thereby serving as a linker structure. Correspondingly, the terms "heterocycloalkenyl" and "heterocycloalkinyl" will be understood.

As used throughout the present application, the terms "halogen" and "halo" may be understood in the broadest sense as being preferably fluorine, chlorine, bromine or iodine.

As used throughout the present application, the term "aralkyl" may be understood in the broadest sense as an alkyl residue substituted by an aryl residue. An aralkyl may also be optionally substituted by one or more substituents which are exemplified further throughout the present application.

The term "emitter compound" may be understood in the broadest sense as any optically active compound that is, depending on certain conditions, able to emit light when introduced into the light-emitting layer B in an opto-electronic device. Accordingly, an emitter compound may indeed be used to generate light. When subjected to an electrical current flow in a suitable strength, at least one of the emitter compounds (a) and (b) is excited to form an exciton (i.e., an excited state selected from the group consisting of S1(a), T1(a), S1(b), and T1(b) and optionally also a higher energy level such as, e.g., S2(a), S2(b) etc.). The exciton may then relax into the basic energy level corresponding to the respective non-exited state S0(a) or S0(b) by concomitantly emitting light. As mentioned above, the energy of the exciton may also be transferred into other excited states.

An emitter compound may also be used to transport or inject charges and thereby helps to transport charges onto the emitting materials. An emitter compound may also be used to absorb light and thereby convert light energy into electric energy (i.e., separation of charge and/or current flow).

The one or more host component(s) as optionally comprised in the light-emitting layer may be any host component(s) known in the art. Exemplarily, a host may bear a polymeric structure. A host component may preferably be able to adjust the spatially distances between the emitter compounds (a) and (b). The spatial distance between two emitter compounds of the same type (i.e, two emitter compounds of type (a) or two emitter compounds of type (b)) should not be too small in order to prevent self-quenching and triplett-triplett annihilation (TTA). On the other hand, the spatial distance between emitter compounds of both types (a) and (b) to each other should be sufficiently small enough to enable Förster resonance energy transfer (FRET, also designated as "fluorescence resonance energy transfer") between the excited states of both emitter compounds (in particular energy transfer from S1(a) to S1(b)). Further, the one or more host component(s) may optionally improve conductibility of the light-emitting layer B. This may improve the brightness obtainable by the opto-electronic device comprising such light-emitting layer B even further. Moreover, the one or more host component(s) may optionally also serve as energy-providing source for exciting one or both emitter compound(s). Exemplarily, a host compound may be such as disclosed in WO 2013/007709 or WO 2013/007710 (in particular for organic light-emitting diodes (OLEDs)) or WO 2012/130571 (in particular for light-emitting electrochemical cells (LECs)).

In a preferred embodiment, at least one of the emitter compounds (a) and (b) is a thermally activated delayed fluorescence (TADF) emitter. In a more preferred embodiment, both emitter compounds (a) and (b) are thermally activated delayed fluorescence (TADF) emitters. In an alternative more preferred embodiment, emitter compound (a) is a thermally activated delayed fluorescence (TADF) emitter and emitter compound (b) is a fluorescence or phosphorescence emitter. In an alternative more preferred embodiment, emitter compound (a) is phosphorescence emitter and emitter compound (b) is a thermally activated delayed fluorescence emitter.

Accordingly, the energy level of S1(a) may be higher than that of S1(b), while the energy level of S1(b) may be higher than that of T1(b) and the energy level of T1(b) may equal or lower than that of T1(a) if the rate of reverse intersystem crossing ($k_{RISC}$) from T1(a) to S1(a) and/or rate of energy transition ($k_{FT}$) from S1(a) to S1(b) is faster than Förster or Dexter transfer from T1(a) to T1(b). As such, transfer from S1(a) to S1(b) and radiative decay from S1(b) to S0(b) may be preferred. The energy level of S1(a) will typically be higher than that of T1(a).

Exemplarily, both emitter compounds (a) and (b) may show thermally activated delayed fluorescence (TADF) and/or fluorescence, wherein preferably at least one is a TADF emitter compound. Exemplarily, the emitter compound (a) may show thermally activated delayed fluorescence, and the emitter compound (b) may show fluorescence. Exemplarily, the emitter compound (a) may show thermally activated delayed fluorescence, and the emitter compound (b) may show phosphorescence. Exemplarily, the emitter compound (a) may show phosphorescence, and the emitter compound (b) may show thermally activated delayed fluorescence.

Optionally, in order to create an at least two color light-emitting layer B, several combinations of emitter compounds (a) and (b) may allow for different energy transfer processes. Exemplarily, the following combinations may be chosen:

(i) a combination of a higher energy TADF emitter as compound (a) which also feeds the excited singlet and/or triplet state of a lower energy phosphorescent emitter (compound (b)): the emission is a variable composition of TADF from compound (a) and phosphorescence from compound (b);

(ii) a combination of a phosphorescent emitter (compound (a)) which also feeds the excited singlet and/or triplet state of a TADF emitter (compound (b)), wherein several energetic alignments of the excited singlet and triplets states of compound (a) and (b) are possible:

(iia) S1(b) and T1(b) are both lower than S1(a) and higher than T1(a): the emission is a variable composition of phosphorescence from compound (a) and TADF from compound (b);

(iib) T1(b) is lower than T1(a): the emission is a variable composition of phosphorescence from compound (a) and TADF from compound (b).

Further examples are provided below and, in particular in the Figures enclosed herewith.

In a preferred embodiment, exciton energy is transferred from compound (a) to compound (b).

In a preferred embodiment, exciton energy is transferred from compound (a) to compound (b).

Exemplarily, at least 1%, at least 2%, at least 5%, at least 10%, at least 20% or more of the exciton energy of compound (a) is transferred to compound (b). Exemplarily, at least 1%, at least 2%, at least 5%, at least 10%, at least 20% or more of the exciton energy of S1(a) (above S0) is transferred to compound (b) and/or at least 1%, at least 2%, at least 5%, at least 10%, at least 20% or more of the exciton energy of T1(a) (above S0) is transferred to compound (b).

Preferably, at least one of the emitter compounds (a) and/or (b) bears a relatively small energy gap between the S1 and T1 states of said compound(s), such as not more than 7000 $cm^{-1}$, more preferably not more than 3000 $cm^{-1}$ or less.

In such compound, due to the relatively small energy gap, energy can transition between the S1 and the T1 state. This thermal activation process may be fast enough that non-radiative decay from the T1 state to the S0 state is minimal or negligible, thus allowing a quantum yield of (nearly) 100% (triplet and/or singlet harvesting).

Herein, it will be understood that S1 of compound (a) is S1(a), T1 of compound (a) is T1(a), S1 of compound (b) is S1(b) and T1 of compound (b) is T1(b).

Typically, the energy difference $\Delta E_{ST}(a)$ between S1(a) and T1(a) may be any $\Delta E_{ST}(a)>0$, meaning that S1(a) and T1(a) are not equal wherein the energy level of S1(a) is typically higher than T1(a). Preferably, $\Delta E_{ST}(a)$ is comparably small. This may preferably allow considerable rates of reverse intersystem crossing (RISC) from T1(a) to S1(a).

In a preferred embodiment, the energy difference $\Delta E_{ST}(a)$ between S1(a) and T1(a) is not higher than 7000 $cm^{-1}$, preferably not higher than 6000 $cm^{-1}$, more preferably not higher than 5000 $cm^{-1}$, even more preferably not higher than 3000 $cm^{-1}$, even more preferably not higher than 2000 $cm^{-1}$, even more preferably not higher than 1500 $cm^{-1}$, in particular not higher than 1000 $cm^{-1}$.

Optionally, the energy difference $\Delta E_{ST}(a)$ between S1(a) and T1(a) is higher than 0.2 eV, in particular between 0.25 and 1 eV. Typically, also the energy difference $\Delta E_{ST}(b)$ between S1(b) and T1(b) may be any $\Delta E_{ST}(a)>0$, meaning that S1(b) and T1(b) are not equal wherein the energy level of S1(b) is typically higher than T1(b). Preferably, $\Delta E_{ST}(b)$ is comparably small. This may preferably allow considerable rates of reverse intersystem crossing (RISC) from T1(b) to S1(b).

In a preferred embodiment, the energy difference $\Delta E_{ST}(b)$ between S1(b) and T1(b) is not higher than 10000 $cm^{-1}$, preferably not higher than 8000 $cm^{-1}$, more preferably not higher than 5000 $cm^{-1}$, even more preferably not higher than 3000 $cm^{-1}$, even more preferably not higher than 2000 $cm^{-1}$, even more preferably not higher than 1500 $cm^{-1}$, in particular not higher than 1000 $cm^{-1}$.

Optionally, the energy difference $\Delta E_{ST}(b)$ between S1(b) and T1(b) is at least 0.2 eV, in particular between 0.2 and 0.8 eV.

The energy level of the highest occupied molecular orbital (HOMO) (highest occupied energy level) of the first compound (a) is preferably higher than that of the second compound (b). In a preferred embodiment, the energy difference $\Delta E_{Homo}(a,b)$ between the highest occupied energy level of the first emitter compound HOMO(a) and the highest occupied energy level of the second emitter compound HOMO(b) is not higher than 1.8 eV, more preferably not higher than 1 eV, in particular not higher than 0.5 eV.

The energy level of the lowest unoccupied molecular orbital (LUMO) (lowest unoccupied energy level) of the first compound (a) is preferably higher than that of the second compound (b).

In a preferred embodiment, the energy difference $\Delta E_{LUMO}(a,b)$ between the lowest unoccupied energy level of the first emitter compound LUMO(a) and the lowest unoccupied energy level of the second emitter compound LUMO(b) is not higher than 2 eV, more preferably not higher than 1.5 eV, in particular not higher than 1 eV.

As indicated above, with respect to the excited triplet state T1(a) there may be either an energy transference to the excited singlet state S1(a) (by means of reverse intersystem crossing (reverse ISO)) or an energetic decay to the non-excited state S0(a) (mostly radiative, i.e., accompanied by emittance of light (phosphorescence)), or an energy transference to the excited triplet state of the second emitter compound T1(b) (by means of Förster resonance energy transfer (FRET)). Therefore, these three processes compete with another. There may be various ratios.

In a preferred embodiment, the rate of the reverse intersystem crossing from T1(a) to S1(a) is higher than the rate of the radiative or non-radiative transition from T1(a) to S0(a).

Alternatively, the rate of the reverse intersystem crossing from T1(a) to S1(a) may also be lower than the rate of the radiative transition from T1(a) to S0(a). (then, emitter compound (a) is a triplet emitter) and/or the rate of energy transference from the excited triplet state of the first emitter compound T1(a) to the excited triplet state of the second emitter compound T1(b).

In a preferred embodiment, the rate of radiative transition from S1(b) to S0(b) differs from the transition rate from S1(a) to S1(b), preferably the radiative transition from S1(b) to S0(b) is faster than the transition from S1(a) to S1(b), in particular wherein the transition from S1(a) to S1(b) is faster than the radiative transition from S1(a) to S0(a);

In a preferred embodiment, the rate of reverse intersystem crossing from T1(a) to S1(a) is higher than Förster or Dexter energy transfer from T1(a) to T1(b);

In a preferred embodiment, the rate of intersystem crossing from S1(b) to T1(b) differs from the rate of transition from S1(a) to S1(b), preferably the intersystem crossing from S1(b) to T1(b) is faster than the transition from S1(a) to S1(b), in particular wherein the transition from S1(a) to S1(b) is faster than the radiative transition from S1(a) to S0(a).

In a preferred embodiment, the rate of the Förster resonance energy transfer from both the excited singlet and the excited triplet state of the first emitter compound S1(a) and T1(a) to the excited singlet and excited triplet state of the second emitter compound S1(b) and T1(b) is higher than the rate of the radiative transition from T1(a) to S0(a). As also indicated above, with respect to the excited singlet state S1(a) there may be either an energy transference to the excited singlet state of the second emitter compound S1(b) (by means of Förster resonance energy transfer (FRET)) or an energetic decay to the non-excited state S0(a) (mostly radiative, i.e., accompanied by emittance of light (fluorescence)), or an energy transference to the excited triplet state T1(a) (by means of intersystem crossing (ISC)). Therefore, these three processes compete with another. There may be various ratios.

The ratio of the emitter compounds (a) and (b) may be variable and depend on the purpose of the light-emitting layer B and the color to be obtained. It may also be adopted to the respective environmental conditions such as, e.g., solvents, host component(s) etc.

In a preferred embodiment, the molar ratio between the first emitter compound (a) and the second emitter compound (b) (a):(b) is from 1:99 to 99:1, preferably from 10:90 to 95:5, more preferably from 20:80 to 95:5, even more preferably from 40:60 to 95:5, even more preferably from 50:50 to 95:5, even more preferably from 60:40 to 95:5, in particular from 70:30 to 95:5.

Alternatively, the weight ratio between the first emitter compound (a) and the second emitter compound (b) (a):(b) is from 1:99 to 99:1, preferably from 10:90 to 95:5, more preferably from 20:80 to 95:5, even more preferably from 40:60 to 95:5, even more preferably from 50:50 to 95:5, even more preferably from 60:40 to 95:5, in particular from 70:30 to 95:5.

Both emitter compounds (a) and (b) may show thermally activated delayed fluorescence (TADF) and/or fluorescence, thus, the radiative transition from S1(a) to S0(a) and from S1(b) to S0(b) may both occur in a combination. Alternatively, one emitter compound may show phosphorescence and the other emitter may show thermally activated delayed fluorescence (TADF). In particular, the second emitter compound (b) may be an efficient fluorescence emitter, thus, the radiative transition from S1(b) to S0(b) is efficient.

Preferably, the light-emitting layer may be characterized in that the radiative transition from S1(b) to S0(b) is faster than the transition from S1(a) to S1(b), and the transition from S1(a) to S1(b) is faster than the radiative transition from S1(a) to S0(a).

Therefore, the main fluorescence signal obtainable from a light-emitting layer B according to the present invention results from the second emitter compound (b), whereas the first emitter compound (a) feeds (b).

In the view of the above, the light-emitting layer may be characterized in that the rate of the reverse intersystem crossing from T1(a) to S1(a) is higher than the rate of the radiative or non-radiative transition from T1(a) to S0(a), and the rate of the Förster resonance energy transfer (FRET) from the excited singlet state of the first emitter compound S1(a) to the excited singlet state of the second emitter compound S1(b) is higher than the rate of the radiative transition from S1(a) to S0(a).

The light-emitting layer may also be characterized in that the rate of the reverse intersystem crossing from T1(a) to S1(a) is higher than the rate of the radiative or non-radiative transition from T1(a) to S0(a), and the radiative transition from S1(b) to S0(b) is faster than the transition from S1(a) to S1(b), and the transition from S1(a) to S1(b) is faster than the radiative transition from S1(a) to S0(a).

The light-emitting layer may also be characterized in that the rate of the Förster resonance energy transfer (FRET) from the excited singlet state of the first emitter compound S1(a) to the excited singlet state of the second emitter compound S1(b) is higher than the rate of the radiative transition from S1(a) to S0(a), and the radiative transition from S1(b) to S0(b) is faster than the transition from S1(a) to S1(b).

The light-emitting layer may also be characterized in that the rate of the reverse intersystem crossing from T1(a) to S1(a) is higher than the rate of the radiative or non-radiative transition from T1(a) to S0(a), the rate of the Förster resonance energy transfer (FRET) from the excited singlet state of the first emitter compound S1(a) to the excited singlet state of the second emitter compound S1(b) is higher than the rate of the radiative transition from S1(a) to S0(a), and the radiative transition from S1(b) to S0(b) is faster than the transition from S1(a) to S1(b).

Optionally, the light-emitting layer may also be characterized in that the rate of the intersystem crossing from S1(a) to T1(a) is higher than the rate of the radiative or non-radiative transition from S1(a) to S0(a), and the rate of the Förster resonance energy transfer (FRET) from both the excited singlet and the excited triplet state of the first emitter compound S1(a) and T1(a) to the excited singlet and excited triplet state of the second emitter compound S1(b) and T1(b) is higher than the rate of the radiative transition from T1(a) to S0(a). Likewise, the rate of the reverse intersystem crossing from T1(b) to S1(b) may optionally be higher than the rate of the radiative or non-radiative transition from T1(b) to S0(b).

In the view of the above, it may be noted that first emitter compound (a) will typically emit light of a shorter wavelength ("bluer" light) than the second emitter compound (b). The light-spectrum obtainable from the light-emitting layer B therefore depends on the ratio between the two emitter compounds (a) and (b) (i.e., the (a):(b) ratio). Further, due to the energy transference between both compounds (e.g., by means of FRET), the (a):(b) ratio may also have an effect on the total brightness and luminescence efficiency. Depending on the intended purpose, the (a):(b) ratio will be chosen individually.

The emitter compounds (a) and (b) may be any emitter compounds known in the art having the characteristics according to the present invention. The emitter compounds (a) and (b) may be any compounds known in the art.

In a preferred embodiment, at least one of the emitter compounds (a) or (b) is either a purely organic thermally activated delayed fluorescence (TADF) emitter compound and/or a metal complex comprising a transition metal bearing a $d^{10}$ configuration as complexed metal M. When at least one of the emitter compounds (a) or (b) is a metal complex comprising a transition metal bearing a $d^{10}$ configuration as complexed metal M, in a more preferred embodiment, said complexed metal M is selected from the group consisting of Cu(I), Ag(I), Au(I) and Zn(II), preferably Cu(I).

Preferably, at least one of the emitter compounds (a) or (b) is a Cu(I) complex.

In a more preferred embodiment, at least one of the emitter compounds (a) or (b) is a metal complex which is a Cu(I) complex of one of the following structures (I)-(III):

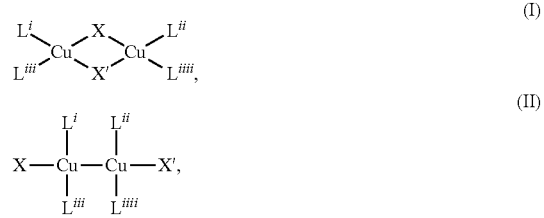

-continued

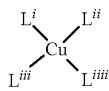

(III)

wherein $L^i$-$L^{iiii}$ are each independently selected from:
A) suitable organic ligands L, which may be the same or different, or
B) residues of organic ligands, which may be the same or different,
wherein optionally two or more of $L^i$-$L^{iiii}$ may be covalently bound with another;
wherein X and X' each independently represent an inorganic ligand, such as, e.g., an anion selected from the group consisting of $Cl^-$, $Br^-$, $I^-$, $SCN^-$, $CN^-$, $RS^-$, $RSe^-$, $RR'N^-$, $RR'P^-$, and $R-C\equiv C^-$,
wherein R and R' are an organic residue, in particular an organic residue independently selected from the group consisting of an unsubstituted or substituted $C_{1\text{-}20}$-alkyl residue (e.g., methyl, ethyl, n-propyl, iso-propyl, n-butyl), an adamantadyl residue, an unsubstituted or substituted $C_{7\text{-}40}$-alkylaryl residue, an unsubstituted or substituted $C_{7\text{-}40}$-arylalkyl residue, an unsubstituted or substituted $C_{7\text{-}40}$-alkylarylalkyl residue, an unsubstituted or substituted $C_{6\text{-}14}$-aryl residue (e.g., phenyl, toloyl, naphtyl, $C_6F_5$), an unsubstituted or substituted $C_{2\text{-}13}$-heteroaryl residue (e.g., furyl, thienyl, pyridyl, pyrimiedyl), an unsubstituted or substituted $C_{2\text{-}20}$-alkenyl residue (e.g., $CR=CR''R'''$), an unsubstituted or substituted $C_{2\text{-}20}$-alkinyl residue, —OR'', and —NR''R''',
wherein R'', R''' are defined as R any may optionally also be H.

Exemplarily, $L^i$ may be covalently bound to $L^{iii}$, $L^{ii}$ may be covalently bound to $L^{iiii}$, $L^i$ may be covalently bound to $L^{ii}$, $L^{iii}$ may be covalently bound to $L^{iiii}$, $L^i$ may be covalently bound to $L^{iiii}$, $L^{ii}$ may be covalently bound to $L^{iii}$, $L^i$ may be covalently bound to $L^{ii}$ and $L^{iii}$, $L^i$ may be covalently bound to $L^{ii}$ and $L^{iv}$, $L^i$ may be covalently bound to $L^{iii}$ and $L^{iv}$, $L^{ii}$ may be covalently bound to $L^{iii}$ and $L^{iv}$, or all ligand $L^i$-$L^{iv}$ may be covalently bound to another.

The organic residues R, R', R'' and R''' may also be deuterated, halogenated or substituted by other residues such as, e.g., further organic residues R.

Exemplarily, two or more of $L^i$-$L^{iiii}$ may be optionally covalently bound with another via a compound selected from

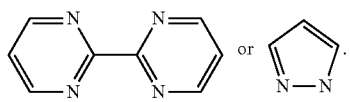

Further examples are depicted in the Example section below such as structures A-N''.

A Cu(I) complex may also be such comprising two Cu(I) not bridged with another, but based on Cu(I)-Cu(I) interactions. In this case, preferably two ligands are selected from $Cl^-$, $Br^-$ and $I^-$.

These complexes according to claims (I), (II) and (III) may be charged (e.g, +1 or −1) or may be uncharged. In charged complexes, the charge will be typically compensated by one or more counter ions.

Exemplarily, positively charged counter ions (cations) may be selected from the group consisting of metal ions (e.g., alkali metal ions), $(NH_4)^+$, $(NR^{ki}_4)^+$, $(PH_4)^+$, and $(PR^{ki}_4)^+$, wherein $R^{ki}$ represents an organic residue selected from the group consisting of an alkyl (e.g., methyl, ethyl, n-propyl, iso-propyl, n-butyl, t-butyl), adamantly, aryl (e.g., phenyl, toloyl, naphtyl, $C_6F_5$), heteroaryl (e.g., furyl, thienyl, pyridyl, pyrimidyl), alkenyl, alkinyl, methoxyalkyl, tertiary amines.

Exemplarily, negatively charged counter ions (anions) may be selected from the group consisting of $PF_6^-$, $BF_4^-$, $AsF_6^-$, $SbF_6^-$, $ClO_4^-$, $NO_3^-$, $BR^{ki}_4^-$, wherein $R^{ki}$ is defined as above.

Examples for such compounds are provided below.

Figure 14A:
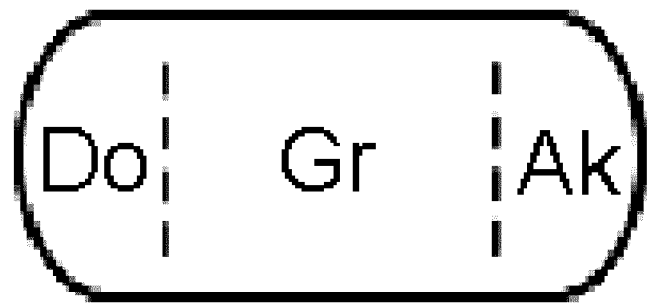
Figure 14B:
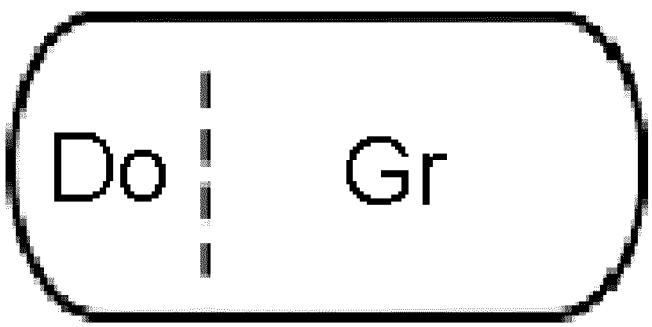
Figure 14C:
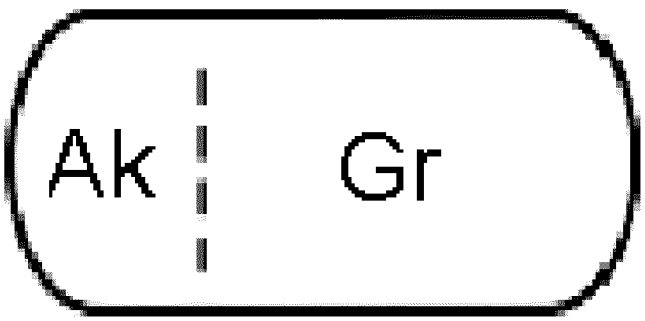

Other preferred basic structures that the emitter compounds (a) and/or (b) according to the present invention could have is depicted in FIG. 14. Preferably, emitter compounds comprising such basic structure are TADF emitter compounds.

Examples for electron donators (Do) may be selected from the group consisting of —O(-), amines groups (e.g., primary, secondary or tertiary amines), —OH, methoxy alkyls, ester groups ((—(—O—CO—)), amide groups, (hetero)aryl moieties, phenoxazinyl, phenothiazinyl, carbazolyl, and dihydrophenazinyl residues.

Examples for electron acceptors (Ak) may be selected from the group consisting of halogen, carbonyl groups, carboxylate groups, ester groups (—CO—O—), —(CO)Cl, —$CF_3$, —$BF_2$, —CN, —$S(O)_2OH$, —$S(O)_2O$-Alkyl, —$NH_3^+$, ammonium groups, —$NO_2$, halogenated alkyl, and tertiary boranes.

Examples for the organic scaffolds (Gr) may be selected from the group consisting of aromatic, heteroaromatic and/or aliphatic moieties comprising conjugated double bonds. Preferably, the organic scaffold comprises or consists of (hetero)aromatic rings of less than 15 ring atoms, more preferably not more than 10 ring atoms, in particular not more than seven ring atoms. One or more of such (hetero)aromatic ring(s) may be conjugated to aliphatic moieties comprising not more than 10, in particular not more than 6 or even not more than 3 atoms in length. The organic scaffolds may also comprise non-conjugated double bonds or even no conjugated double bonds at all.

The molecular orbitals of Ak and Gr and of Do and Gr, respectively, overlap with another.

Preferred examples of emitter compounds that can serve as emitter compounds (a) and (b) in the context of the present invention are also depicted below.

Particular combinations of emitter compounds that can serve as emitter compounds (a) and those that can serve as emitter compounds (b) are also depicted in the example section below.

The light-emitting layer B may further fulfill other purposes in an opto-electronic device it is introduced in. This may depend on the properties of the opto-electronic device, which is particularly preferably an organic light-emitting diode (OLED).

In a preferred embodiment, the light-emitting layer B concomitantly has a functionality selected from the group consisting of: an electron transport layer, a hole blocking layer, a hole transport layer and an electron blocking layer.

The light-emitting layer B may be prepared by any means known in the art.

According to a further aspect, the present invention relates to a method of preparing a light-emitting layer B of the present invention, comprising the step of bringing the first emitter compound (a) and the second emitter compound (b) in close proximity with each other, preferably by means of:

(i) admixing the first emitter compound (a) and the second emitter compound (b) and optionally one or more host components (c) with each other, optionally in a solvent where (a), (b) and optionally (c) are dissolved in;

(ii) providing a first layer comprising the first emitter compound (a) directly contacted with a second layer comprising the second emitter compound (b) and optionally one or more host components (c);

(iii) providing a first layer comprising the first emitter compound (a) and optionally one or more host components (c) separated from a second layer comprising the second emitter compound (b) and optionally one or more host components (c) by a third layer that is a charge generation layer;

(iv) using vacuum processing where the first emitter compound (a) and the second emitter compound (b) and optionally one or more host components (c) are co-deposited to form a mixed layer of the two emitter compounds (a) and (b); or (v) using vacuum processing where the first emitter compound (a) and the second emitter compound (b) and optionally one or more host components (c) are co-deposited to form a gradient of the two emitter compounds (a) and (b).

In this context a solvent may be any solvent. Exemplarily, the solvent may be selected from the group consisting of: tetrahydrofuran, dioxane, chlorobenzene, diethylene glycol diethyl ether, 2-(2-Ethoxyethoxy)ethanol, gamma-butyrolactone, N-methyl pyrollidinon, ethoxyethanol, xylene, toluene, anisole, phenetol, acetonitrile, tetrahydrothiophene, benzonitrile, pyridine, trihydrofuran, triarylamine, cyclohexanone, acetone, propylene carbonate, ethyl acetate, benzene and PGMEA (propylen glycol monoethyl ether acetate). The solvent may also be a mixture of two or more thereof.

As indicated above, the light-emitting layer B typically fulfills its function when it is introduced into an opto-electronic device.

Accordingly, a further aspect of the present invention relates to an opto-electronic device comprising a light-emitting layer B according to the preset invention. In this context, the light-emitting layer B is defined in the broadest sense as specified in the present application.

Preferably, the whole opto-electronic device is mainly composed of organic components, i.e., hydrocarbons which may optionally also comprise heteroatoms such as, e.g., nitrogen, oxygen, phosphor and/or sulfur as substituents. Optionally, the opto-electronic device may also comprise inorganic compounds.

The content of emitter compounds (a) and (b) in the light-emitting layer B may be in the range of from 0.1 to 100% (w/w). Therefore, the light-emitting layer B may be essentially composed of emitter compounds (a) and (b) or may merely comprise a small or larger proportion thereof. In some opto-electronic devices, such as LECs, the content of emitter compounds (a) and (b) in the light-emitting layer B may be larger than 30% (w/w), larger than 40% (w/w), larger than 50% (w/w), larger than 60% (w/w), larger than 70% (w/w), larger than 80% (w/w), or even larger than 90% (w/w).

The opto-electronic device may be intransparent, semitransparent or (essentially) transparent.

The opto-electronic device may be any opto-electronic device comprising the light-emitting layer B according to the present invention.

In a preferred embodiment, the opto-electronic device is a device selected from the group consisting of an organic light emitting diode (OLED), a light emitting electrochemical cell (LEC), a transistor, a light-emitting transistor, an organic solar cell (OSC), and an optical sensor.

The opto-electronic device may have any set-up. In a preferred embodiment, the opto-electronic device according to the present invention comprises at least the layers:

A) an anode layer A, preferably comprising indium tin oxide, indium zinc oxide, PbO, SnO, graphite, doped silicium, doped germanium, doped GaAs, doped polyaniline, doped polypyrrole and/or doped polythiophene;

B) a light-emitting layer B according to the present invention; and

C) a cathode layer C, preferably comprising Al, Au, Ag, Pt, Cu, Zn, Ni, Fe, Pb, In, W, Pd, LiF, Ca, Ba, Mg, and/or mixtures or alloys of two or more thereof.

Preferably, the order of the layers herein is A-B-C, thus the light-emitting layer B is located between the anode layer A and the cathode layer C. This does, of course, not exclude that optionally further layers are comprised between those layers therein.

Exemplarily, when the opto-electronic device is an OLED, it may optionally comprise the following layer structure:

A) an anode layer A, preferably comprising indium tin oxide (ITO);

HTL) a hole transport layer HTL;

B) a light-emitting layer B according to the present invention as described herein;

ETL) an electron transport layer ETL; and

C) a cathode layer, preferably comprising Al, Ca and/or Mg.

Preferably, the order of the layers herein is A-HTL-B-ETL-C.

Furthermore, the opto-electronic device may optionally comprise one or more protective layers protecting the device from damaging exposure to harmful species in the environment including, exemplarily moisture, vapor and/or gases.

An OLED may exemplarily be an essentially white OLED that may comprise at least one deep blue emitter compound and one or more emitter compound(s) emitting green and/or red light. Then, there may also be energy transmittance between two or more compounds as described above.

As used herein, if not defined more specifically in a particular context, the designation of the colors of emitted and/or absorbed is as follows:

violet: wavelength range of >380-420 nm;

blue: wavelength range of >420-480 nm;

green: wavelength range of >480-560 nm;

yellow: wavelength range of >560-580 nm;

orange: wavelength range of >580-620 nm;

red: wavelength range of >620-800 nm.

With respect to emitter compounds, such colors refer to the emission maximum. Therefore, exemplarily, a blue emitter has an emission maximum in the range of from 420 to 480 nm, a green emitter has an emission maximum in a range of from 480 to 560 nm, a red emitter has an emission maximum in a range of from 620 to 800 nm.

A deep blue emitter may preferably have an emission maximum of below 480 nm, more preferably below 470 nm, even more preferably below 460 nm or even below 450 nm. It will typically be above 400 nm, preferably above 410 nm, more preferably above 420 nm.

An optical sensor may be a sensor determining the light intensity either unspecifically or wavelength-specific. It may also form a part of an array of sensors such as, e.g., an image sensor usable in a digital camera.

The opto-electronic device as a whole may also form a thin layer of a thickness of not more than 5 mm, more than 2 mm, more than 1 mm, more than 0.5 mm, more than 0.25 mm, more than 100 µm, or more than 10 µm. The opto-electronic device may also have a thickness in the range of 8-9 µm, 7-8 µm, 6-7 µm, 5-6 µm, 4-5 µm, 3-4 µm, 2-3 µm, 1-2 µm or less than 1 µm.

Particularly preferably, the opto-electronic device is an organic light emitting diode (OLED).

It is well-known by those skilled in the art that OLEDs are typically composed of several layers. Mostly, an anode layer A is located on the surface of a substrate. The substrate may be formed by any material or composition of materials. Most frequently, glass slides are used as substrates. Alternatively, thin metal layers (e.g., copper, gold, silver or aluminium films) or plastic films or slides may be used. This may allow a higher degree of flexibility.

The anode layer A is mostly composed of materials allowing to obtain an (essentially) transparent film. As at least one of both electrodes should be (essentials) transparent in order to allow light emission from the OLED, either the anode layer A or the cathode layer C transparent. Preferably, the anode layer A comprises a large content or even consists of transparent conductive oxides (TCOs). Such anode layer A may exemplarily comprise indium tin oxide, aluminium zinc oxide, fluor tin oxide, indium zinc oxide, PbO, SnO, zirconium oxide, molybdenum oxide, vanadium oxide, wolfram oxide, graphite, doped Si, doped Ge, doped GaAs, doped polyaniline, doped polypyrrole and/or doped polythiophene. Particularly preferably, the anode layer A (essentially) consists of indium tin oxide (ITO) (meist $(InO_3)_{0.9}(SnO_2)_{0.1}$).

The roughness of the anode layer A caused by the transparent conductive oxides (TCOs) may be compensated by using a hole injection layer (HIL). Further, the HIL may facilitate the injection of quasi charge carriers (i.e., holes) in that the transport of the quasi charge carriers from the TCO to the hole transport layer (HTL) is facilitated. The hole injection layer (HIL) may comprise poly-3,4-ethylendioxy thiophene (PEDOT), polystyrene sulfonate (PSS), $MoO_2$, $V_2O_5$, CuPC or CuI, in particular a mixture of PEDOT and PSS. The hole injection layer (HIL) may also prevent the diffusion of metals from the anode layer A into the hole transport layer (HTL).

Adjacent to the anode layer A or hole injection layer (HIL) typically a hole transport layer (HTL) is located. Herein, any hole transport compound may be used. Exemplarily, electron-rich heteroaromatic compounds such as triarylamines and/or carbazoles may be used as hole transport compound.

The HTL may decrease the energy barrier between the anode layer A and the light-emitting layer B (serving as emitting layer (EML)). The hole transport layer (HTL) may also be an electron blocking layer (EBL). Preferably, hole transport compounds bear comparably high energy levels of their triplet states T1. Exemplarily the hole transport layer (HTL) may comprise a star-shaped heterocycle such as tris(4-carbazoyl-9-ylphenyl)amine (TCTA).

Adjacent to the hole transport layer (HTL), typically the light-emitting layer B is located. This is specified in detail in the context of the present invention.

Adjacent to the light-emitting layer B an electron transport layer (ETL) may be located. Herein, any electron transporter may be used. Exemplarily, compounds poor of electrons such as, e.g., benzimidazoles, pyridines, triazoles, oxadiazoles (e.g., 1,3,4-oxadiazole), phosphinoxides and sulfone, may be used. Exemplarily, an electron transporter may also be a star-shaped heterocycle such as 1,3,5-tri(1-phenyl-1H-benzo[d]imidazol-2-yl)phenyl (TPBi). The electron transport layer (ETL) may also block holes.

Adjacent to the electron transport layer (ETL), a cathode layer C may be located. Exemplarily, the cathode layer C may comprise or may consist of a metal (e.g., Al, Au, Ag, Pt, Cu, Zn, Ni, Fe, Pb, LiF, Ca, Ba, Mg, In, W, or Pd) or a metal alloy. For practical reasons, the cathode layer may also consist of (essentially) intransparent metals such as Mg, Ca or Al. Alternatively or additionally, the cathode layer C may also comprise graphite and or carbon nanotubes (CNTs). Alternatively, the cathode layer C may also consist of nanoscalic silver wires.

An OLED may further, optionally, comprise a protection layer between the electron transport layer (ETL) and the cathode layer C (which may be designated as electron injection layer (EIL)). This layer may comprise lithium fluoride, cesium fluoride and/or silver.

Next to the common uses, OLEDs may exemplarily also be used as luminescent films, "smart packaging" labels, or innovative design elements. Further they are usable for cell detection and examination (e.g., as bio labelling).

In the OLED, electrodes migrate from the cathode layer C to the anode layer A. Holes and electrons fuse in the light-emitting layer B and concomitantly form excited states of at least one of the emitter compounds (a) and (b) (excitons).

In an organic solar cell (OSC), the content of emitter compounds (a) and (b) in the light-emitting layer B (serving as absorber layer) is preferably between 30 and 100% (w/w). Like in an OLED, also an OSC comprises two electrodes. The light-emitting layer B (serving as absorber layer) is located in between the two electrodes. As mentioned above, the emitter compounds (a) and (b) may also serve as light-absorbing compounds.

The layers comprised in an OSC are similar to those described above and well-known to those skilled in the art. A single-layer OSC is typically mounted on a substrate. A multilayer OSC may exemplarily be composed similar to an OLED.

A further aspect of the present invention relates to a method for generating light of a desired wavelength range, comprising the step of providing an opto-electronic device according to any the present invention. Exemplarily, the wavelength of the emitter light may also be adjusted to a short wavelength of blue light. Accordingly, the present invention also relates to a method for generating blue, green, yellow, orange and red light.

Preferably, light in the wavelength range of 400-800 nm (i.e., in the visible range) may be emitted, such as, e.g., in the range of 400-500 nm, of 450-550 nm, of 500-600 nm, of 550-650 nm, of 600-700 nm, of 650-750 nm and/or of 700-800 nm.

An OLED according to the present invention may also be used as large-area illuminating device, as luminescent wallpaper, luminescent window frame or glass, luminescent label, luminescent poser or flexible screen or display.

An OSC according to the present invention may also be used as flexible and optionally even rollable solar cell (e.g., for smartphones, laptops, tablets, etc.), as architectural item (e.g., as a part for covering a wall or a roof), or a functional component of vehicles (e.g., automobiles, plains, railways, and/or ships). Such products comprising an opto-electronic device according to the present invention are also embraced by the present invention.

In the following some exemplary structures of emitter compounds are provided that may serve as the first emitter compound (a) and/or as the second emitter compound (b) in the context of the present invention. The person skilled in the art will however know a number of other emitter compounds that are also usable in the context of the present invention.

The Examples, the Figures shown below and the claims further exemplify the invention.

FIG. 1 shows a common example of energy transferal in a composition comprising two optically active compounds. Herein, energy transitions between a compound (h) harvesting light and an emitter compound (b) serving (i) as phosphorescent emitter compound, (ii) as singlet harvesting emitter compound and/or (iii) as thermally activated delayed fluorescence compound (TADF) emitter compound occurs. Herein, energy is transferred from the excited states (singlet state S1(h) and triplet state T1(h)) of the compound (h) to the respective excited states (singlet state S1(b) and triplet state T1(b)) of the emitter compound (b). Therefore, (nearly) solely emitter compound (b) emits light (cf., solid arrows).

Figure 2:
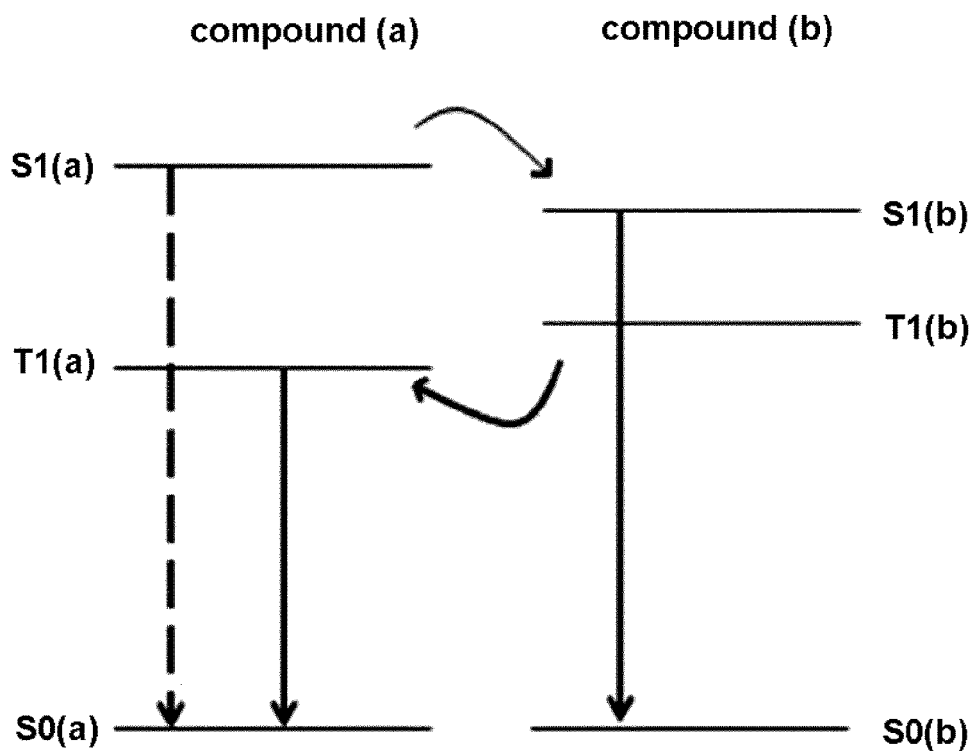

FIG. 2 shows an example of energy transferal in a composition comprising a phosphorescent emitter compound (a) and a fluorescent emitter compound (b). Herein, energy is transferred from S1(a) to S1(b) and from T1(b) to T1(a). Emitter compound (a) mainly emits light from its excited triplet state T1(a) (cf., solid arrow, phosphorescence) and, with a lower intensity, from its excited singlet state S1(a) (cf., dashed arrow, fluorescence). Emitter compound (b) (nearly) only emits light from its excited singlet state S1(b) (cf., solid arrow, fluorescence). This composition enables energy recycling between the emitter compounds (a) and (b).

Figure 3:
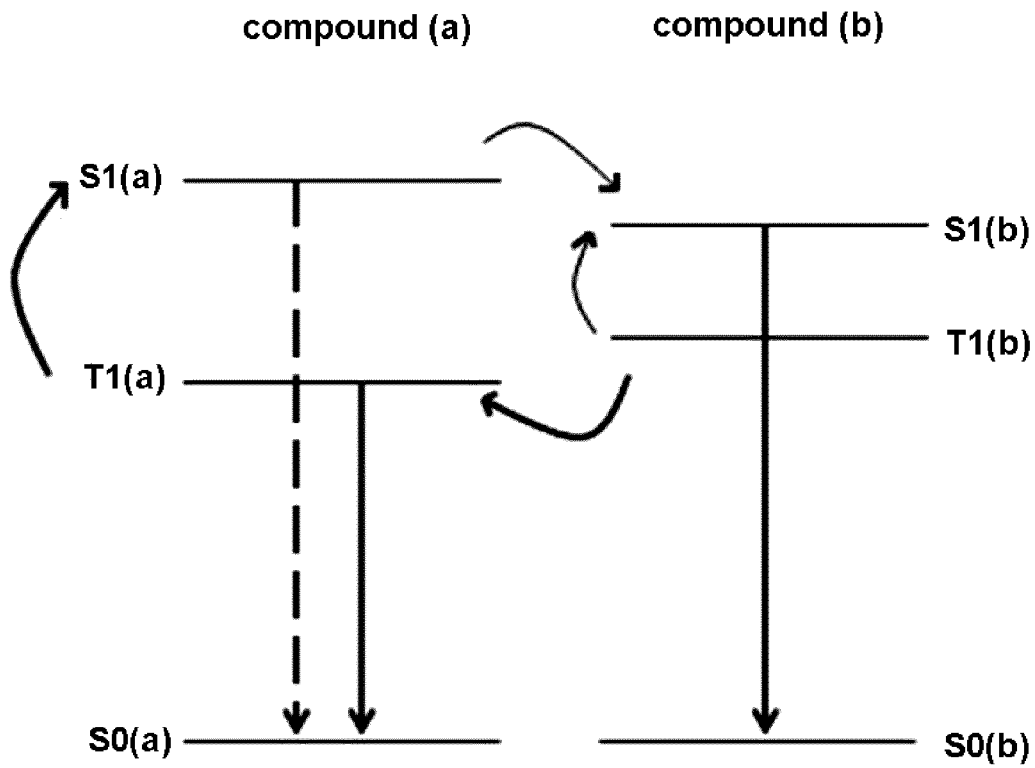

FIG. 3 shows an example of energy transferal in a composition comprising a singlet harvesting emitter compound (a) and a fluorescent TADF emitter compound (b). Herein, energy is transferred from S1(a) to S1(b) and from T1(b) to T1(a). Emitter compound (a) mainly emits light from its excited triplet state T1(a) (cf., solid arrow, phosphorescence) and, with a lower intensity, from its excited singlet state S1(a) (cf., dashed arrow, fluorescence). Emitter compound (b) (nearly) only emits light from its excited singlet state S1(b) (cf., solid arrow, fluorescence). Both emitter compounds (a) and (b) show each reversed intersystem crossing, i.e., energy transferal from the excited triplet states T1 to the excited singlet states S1 energetically above the respective triplet states. Preferably, emitter compound (a) shows a particularly high rate of intersystem crossing. This composition enables particularly efficient energy recycling between the emitter compounds (a) and (b).

Figure 4:
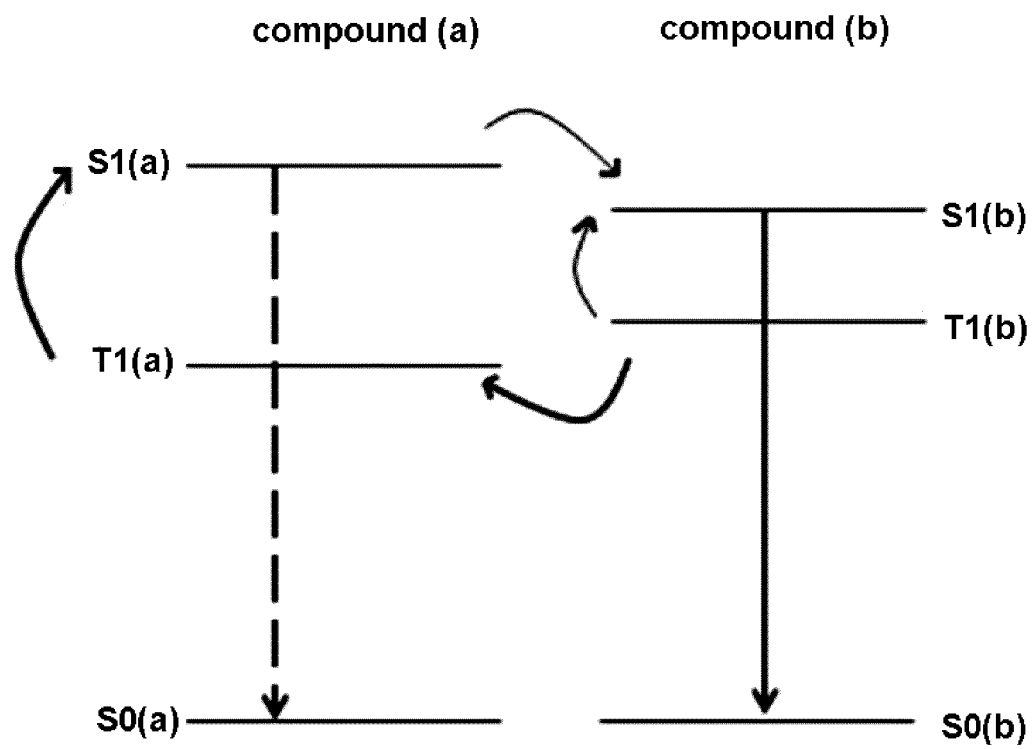

FIG. 4 shows an example of energy transferal in a composition comprising a TADF emitter compound (a) and a fluorescent TADF emitter compound (b). Herein, energy is transferred from S1(a) to S1(b) and from T1(b) to T1(a). Emitter compound (a) (nearly) only emits light from its excited singlet state S1(a) (cf., dashed arrow, fluorescence) at a comparable low intensity. Emitter compound (b) (nearly) only emits light from its excited singlet state S1(b) (cf., solid arrow, fluorescence). Therefore, in this composition, mainly emitter compound (b) emits light by means of fluorescence. Both emitter compounds (a) and (b) show each reversed intersystem crossing, i.e., energy transferal from the excited triplet states T1 to the excited singlet states S1 energetically above the respective triplet states. Preferably, emitter compound (a) shows a particularly high rate of intersystem crossing. This composition enables particularly efficient energy recycling between the emitter compounds (a) and (b).

Figure 5:
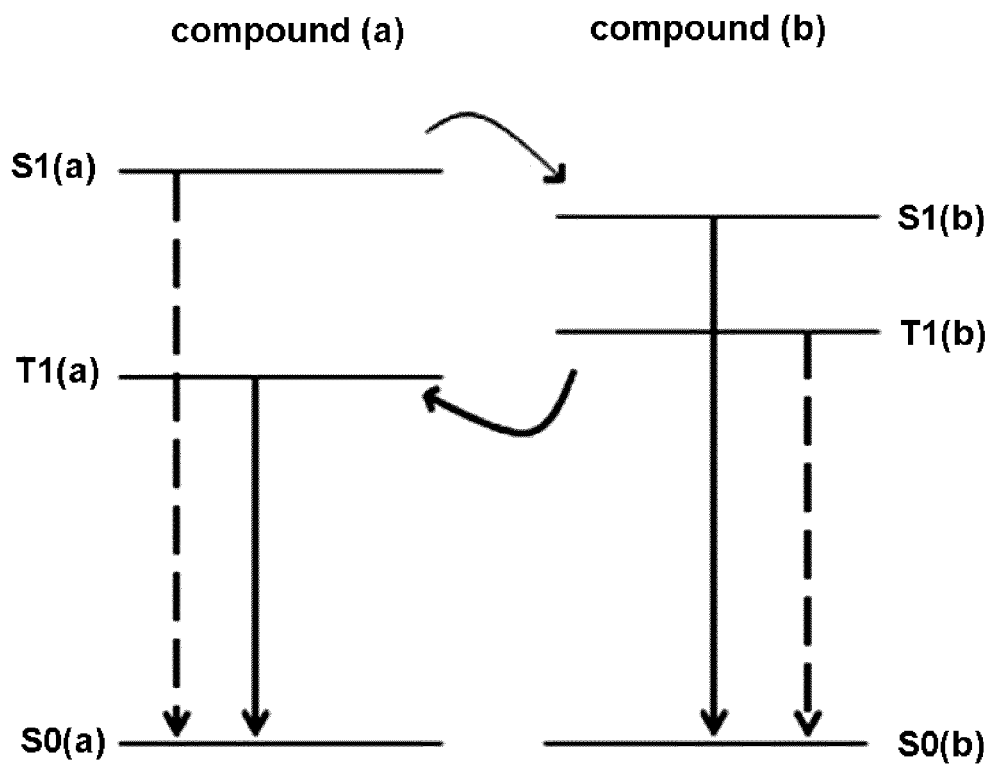

FIG. 5 shows an example of energy transferal in a composition comprising a phosphorescent emitter compound (a) and a phosphorescent emitter compound (b). Herein, energy is transferred from S1(a) to S1(b) and from T1(b) to T1(a). Emitter compound (a) mainly emits light from its excited triplet state T1(a) (cf., solid arrow, phosphorescence) and, with a lower intensity, from its excited singlet state S1(a) (cf., dashed arrow, fluorescence). Emitter compound (b) mainly emits light from its excited singlet state S1(b) (cf., solid arrow, fluorescence) and, with a lower intensity, from its excited triplet state T1(b) (cf., dashed arrow, phosphorescence). This composition enables some energy recycling between the emitter compounds (a) and (b).

Figure 6:
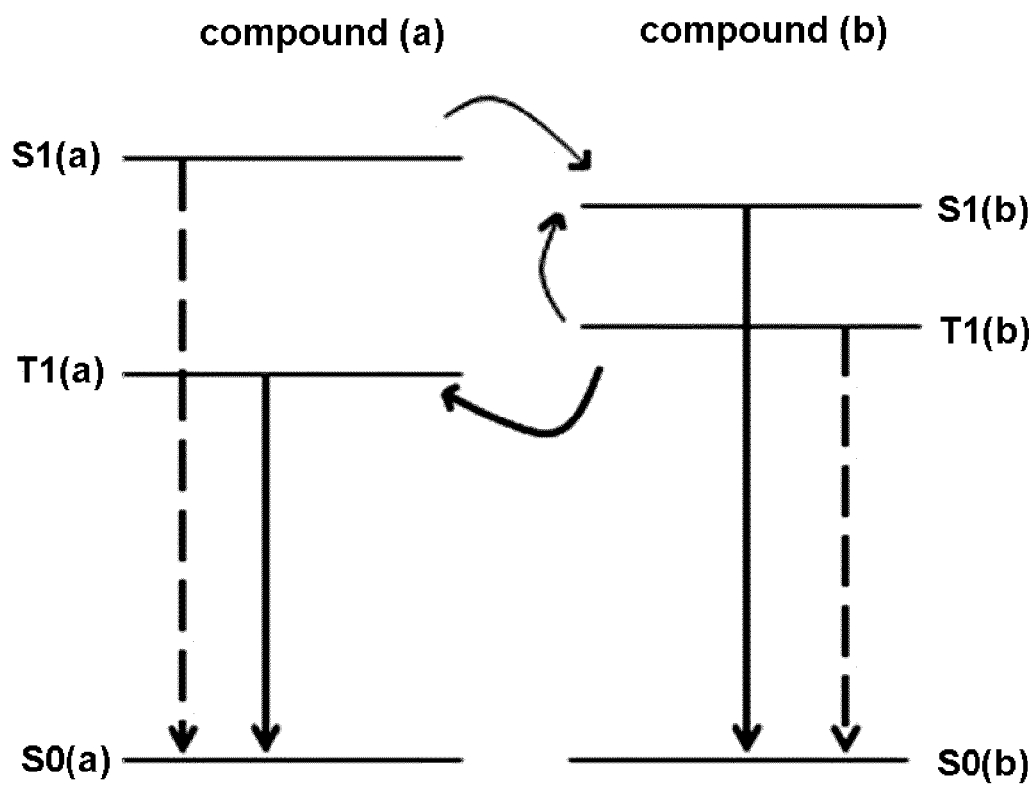

FIG. 6 shows an example of energy transferal in a composition comprising a phosphorescent emitter compound (a) and a singlet harvesting emitter compound (b). Herein, energy is transferred from S1(a) to S1(b) and from T1(b) to T1(a). Emitter compound (a) mainly emits light from its excited triplet state T1(a) (cf., solid arrow, phosphorescence) and, with a lower intensity, from its excited singlet state S1(a) (cf., dashed arrow, fluorescence). Emitter compound (b) mainly emits light from its excited singlet state S1(b) (cf., solid arrow, fluorescence) and, with a lower intensity, from its excited triplet state T1(b) (cf., dashed arrow, phosphorescence). Furthermore, in emitter compound (b), reversed intersystem crossing occurs. This composition enables energy recycling between the emitter compounds (a) and (b).

Figure 7:
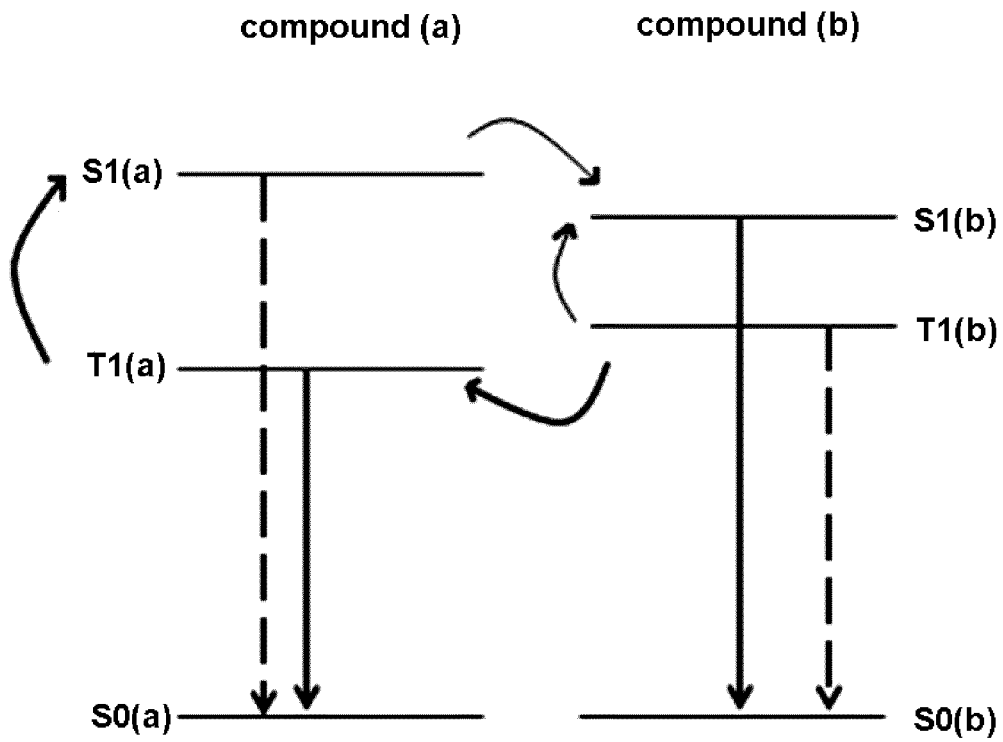

FIG. 7 shows an example of energy transferal in a composition comprising a singlet harvesting emitter compound (a) and a singlet harvesting emitter compound (b). Herein, energy is transferred from S1(a) to S1(b) and from T1(b) to T1(a). Emitter compound (a) mainly emits light from its excited triplet state T1(a) (cf., solid arrow, phosphorescence) and, with a lower intensity, from its excited singlet state S1(a) (cf., dashed arrow, fluorescence). Emitter compound (b) mainly emits light from its excited singlet state S1(b) (cf., solid arrow, fluorescence) and, with a lower intensity, from its excited triplet state T1(b) (cf., dashed arrow, phosphorescence). Furthermore, in both emitter compounds (a) and (b), reversed intersystem crossing occurs. This composition enables particularly efficient energy recycling between the emitter compounds (a) and (b).

Figure 8:
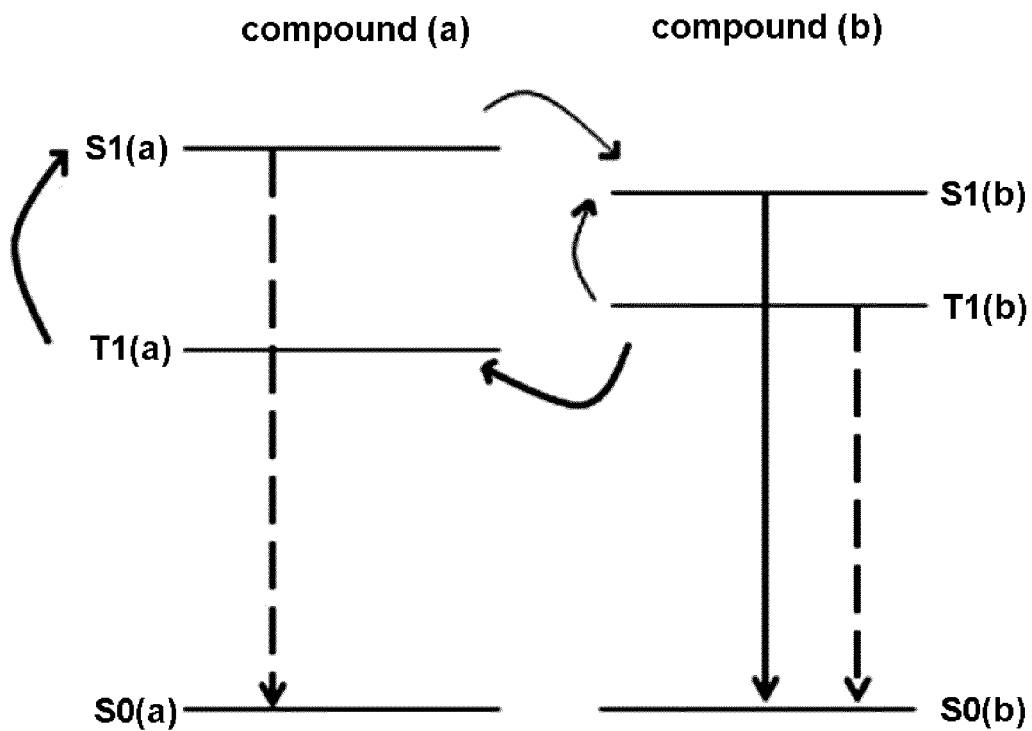

FIG. 8 shows an example of energy transferal in a composition comprising a TADF emitter compound (a) and a singlet harvesting emitter compound (b). Herein, energy is transferred from S1(a) to S1(b) and from T1(b) to T1(a). Emitter compound (a) (nearly) only emits light from its excited singlet state S1(a) (cf., dashed arrow, fluorescence) with a comparably low intensity. Emitter compound (b) mainly emits light from its excited singlet state S1(b) (cf., solid arrow, fluorescence) and, with a lower intensity, from its excited triplet state T1(b) (cf., dashed arrow, phosphorescence). Accordingly, light emission mainly occurs from fluorescence of emitter compound (b). Furthermore, in both emitter compounds (a) and (b), in particular in emitter compound (a), reversed intersystem crossing occurs. This composition enables particularly efficient energy recycling between the emitter compounds (a) and (b).

Figure 9:
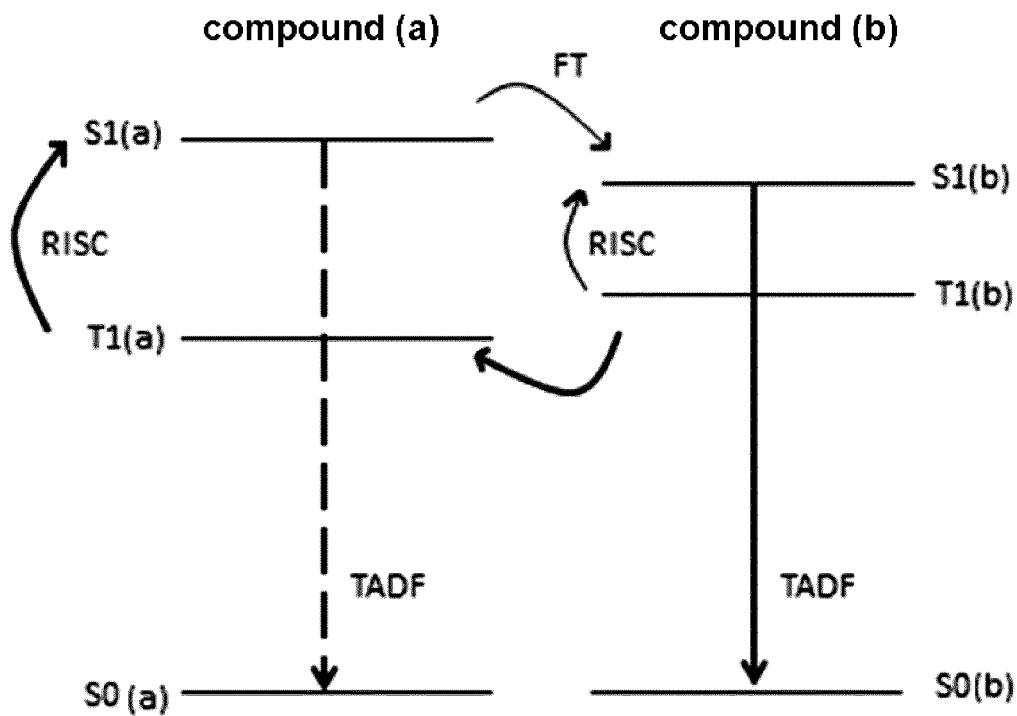

FIG. 9 shows an example of energy transferal in a composition comprising a singlet harvesting TADF emitter compound (a) and a singlet harvesting TADF emitter compound (b). Herein, energy is transferred from S1(a) to S1(b) and from T1(b) to T1(a). Emitter compound (a) (essentially) only emits light from its excited singlet state S1(a) (cf., dashed arrow, fluorescence) with a comparably low intensity. Emitter compound (b) (essentially) only emits light from its excited singlet state S1(b) (cf., solid arrow, fluorescence). Accordingly, light emission mainly occurs from fluorescence of emitter compound (b). Furthermore, in both emitter compounds (a) and (b), in particular in emitter compound (a), reversed intersystem crossing (RISC) occurs. Energy transferal from S1(a) to S1(b) may be a particularly fast transfer (FT). This composition enables energy recycling between the emitter compounds (a) and (b).

Figure 10A:
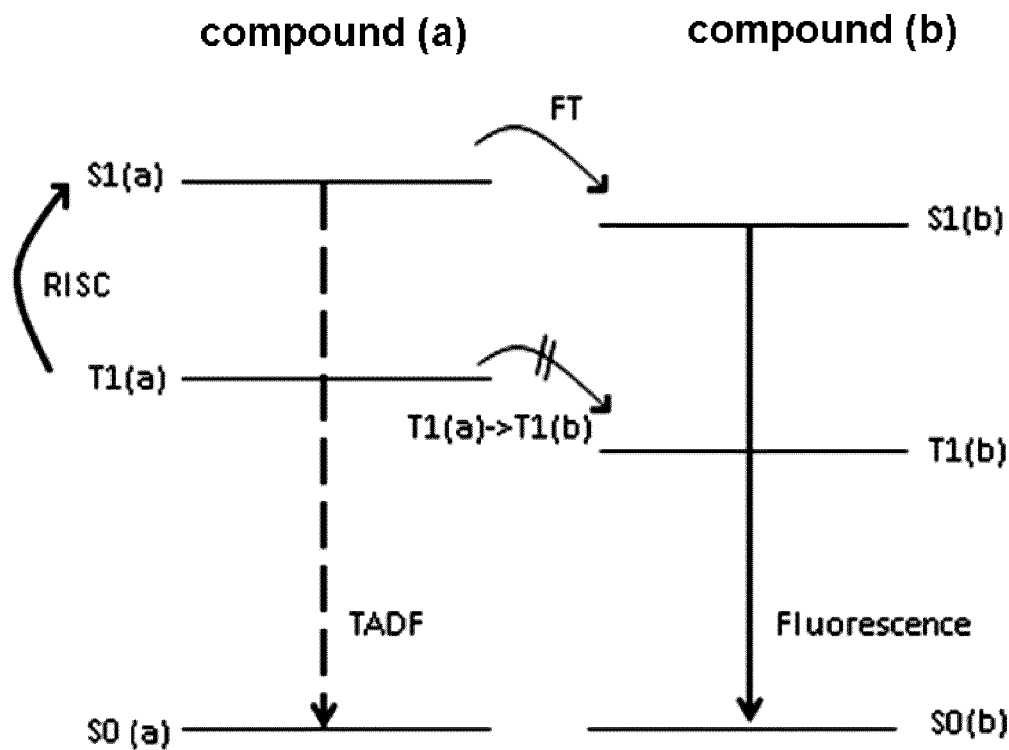
Figure 10B:
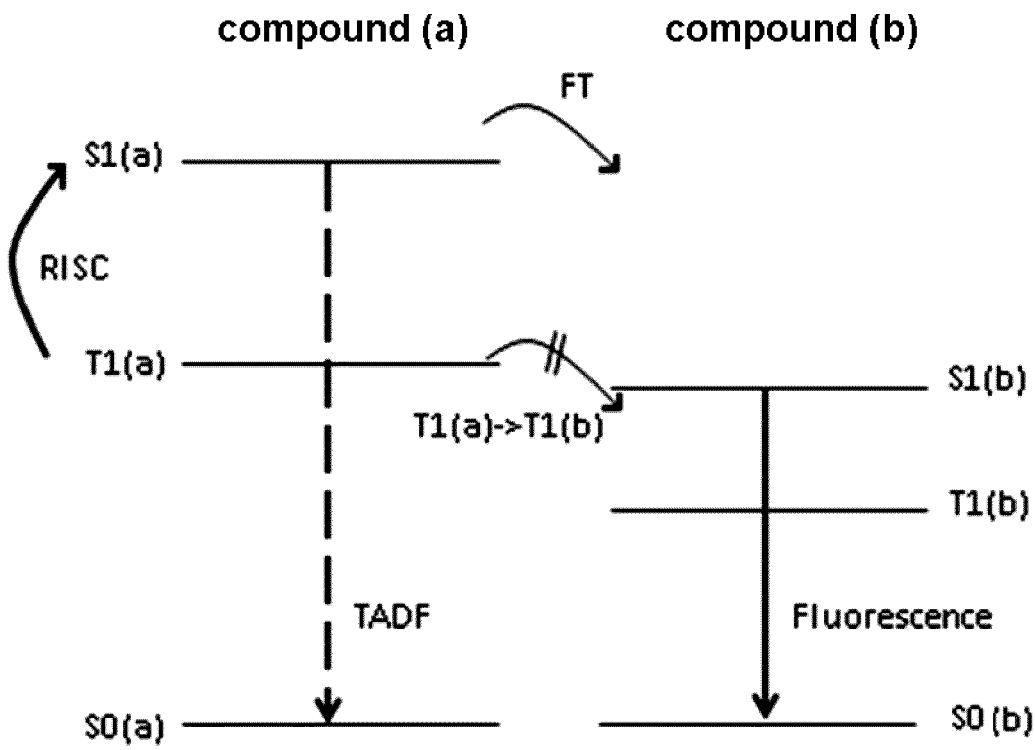

FIG. 10 shows an example of energy transferal in a composition comprising a singlet harvesting TADF emitter compound (a) and a fluorescent emitter compound (b), wherein S1(b) is either energetically higher than T1(a) (FIG. 10a) or lower than T1(a) (FIG. 10b). Herein, energy is transferred from S1(a) to S1(b), while there is (essentially) no energy transfer from T1 (a) to T1 (b) although the energy level of T1 (b) is below that of T1 (a). Emitter compound (a) (essentially) only emits light from its excited singlet state S1(a) (cf., dashed arrow, fluorescence) with a comparably low intensity. Emitter compound (b) (essentially) only emits light from its excited singlet state S1(b) (cf., solid arrow, fluorescence). Accordingly, light emission mainly occurs from fluorescence of emitter compound (b). Furthermore, in emitter compound (a) reversed intersystem crossing (RISC) occurs. Energy transferal from S1(a) to S1(b) may be a particularly fast transfer (FT). Accordingly, the rate of reversed intersystem crossing from T1(a) to S1(a) and/or the rate of energy transfer from S1(a) to S1(b) is significantly higher that the rate of energy transfer from T1 (a) to T1 (b).

Figure 11:
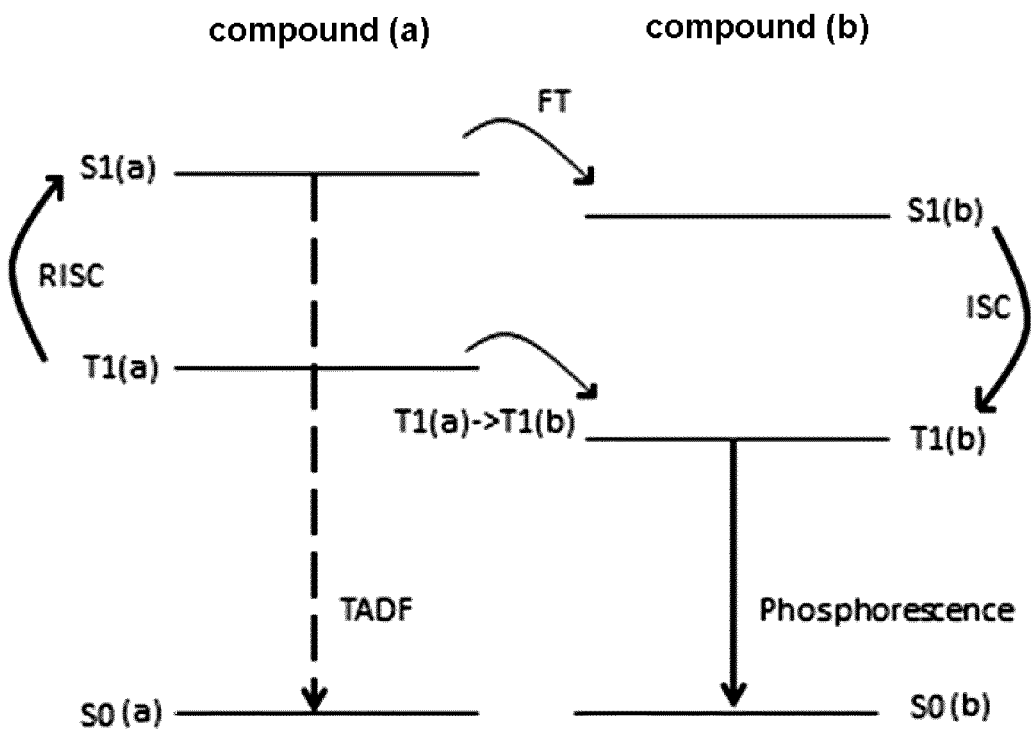

FIG. 11 shows an example of energy transferal in a composition comprising a singlet harvesting TADF emitter compound (a) and a phosphorescent emitter compound (b). Herein, energy is transferred from S1(a) to S1(b) as well as from T1(a) to T1(b). Emitter compound (a) (essentially) only emits light from its excited singlet state S1(a) (cf., dashed arrow, fluorescence) with a comparably low intensity. Emitter compound (b) (essentially) only emits light from its excited triplet state T1(b) (cf., solid arrow, phosphorescence). Accordingly, light emission mainly occurs from phosphorescence of emitter compound (b). Furthermore, in emitter compound (a), reversed intersystem crossing (RISC) occurs, while in emitter compound (b) intersystem crossing (ISC) occurs. Energy transferal from S1(a) to S1(b) may be a particularly fast transfer (FT).

Figure 12:
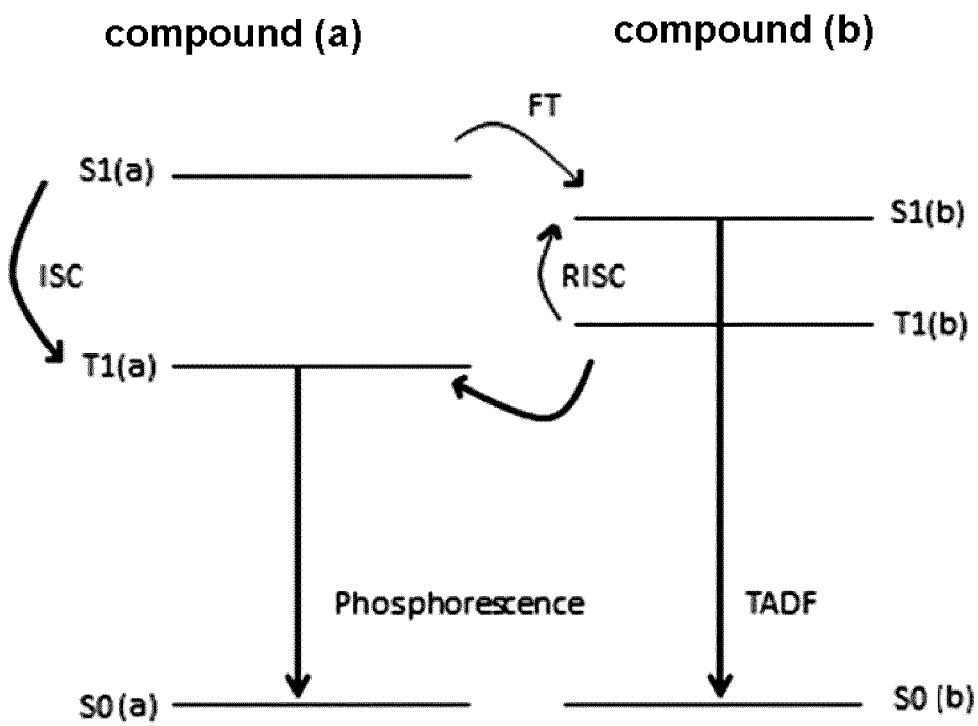

FIG. 12 shows an example of energy transferal in a composition comprising a phosphorescent emitter compound (a) and a singlet harvesting TADF emitter compound (b). Herein, energy is transferred from S1(a) to S1(b) and from T1(b) to T1(a). Emitter compound (a) (essentially) only emits light from its excited triplet state T1(a) (cf., solid arrow, phosphorescence). Emitter compound (b) (essentially) only emits light from its excited singlet state S1(b) (cf., solid arrow, fluorescence). Accordingly, both compounds (a) and (b) significantly emit light. In emitter compound (a), reversed intersystem crossing (RISC) occurs, while in emitter compound (b), intersystem crossing (ISC) occurs.

Figure 13:
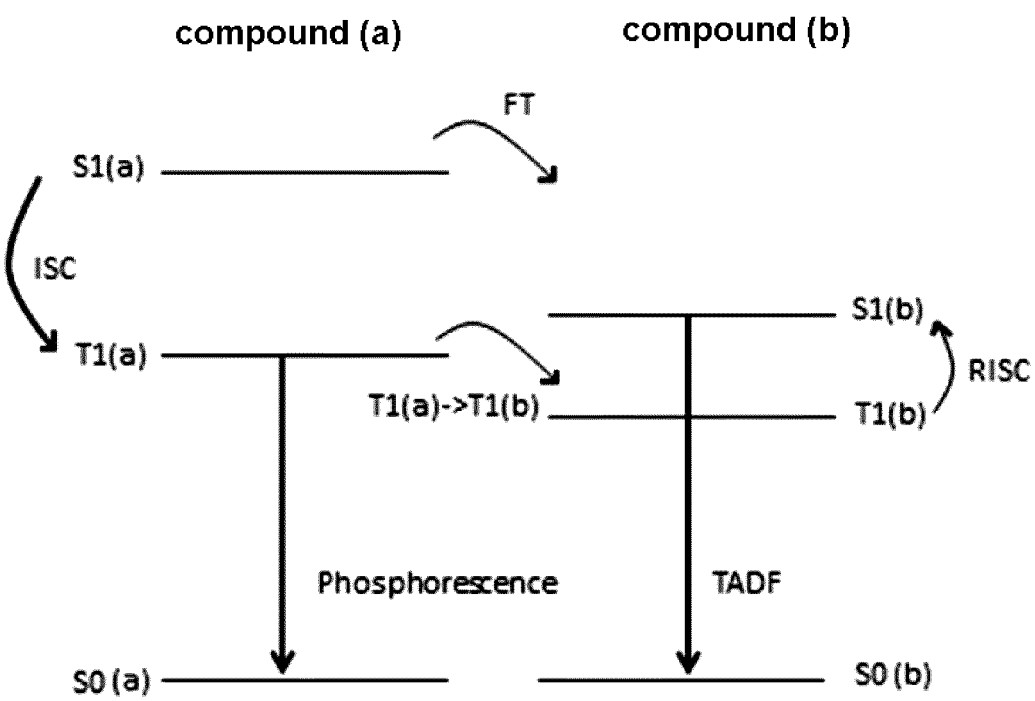

FIG. 13 shows an example of energy transferal in a composition comprising a phosphorescent emitter compound (a) and a singlet harvesting TADF emitter compound (b). Herein, energy is transferred from S1(a) to S1(b) and from T1(a) to T1(b). Emitter compound (a) (essentially) only emits light from its excited triplet state T1(a) (cf., solid arrow, phosphorescence). Emitter compound (b) (essentially) only emits light from its excited singlet state S1(b) (cf., solid arrow, fluorescence). Accordingly, both compounds (a) and (b) significantly emit light. In emitter compound (a), intersystem crossing (ISC) occurs, while in emitter compound (b), reverse intersystem crossing (RISC) occurs.

FIG. 14 shows an example of the basic structure of emitter compounds having a dipole moment >0. Herein, Do, Ak and Gr are defined as follows:

Do: electron donator, i.e., one or more residue(s) shifting electrons that may be present in the emitter compound once, twice or more often, may be the same or different from another;

Ak: electron acceptor, i.e., one or more residue(s) subtracting electrons that may be present in the emitter compound once, twice or more often, may be the same or different from another;

Gr: organic scaffold, typically comprising conjugated double bonds, exemplarily Gr is selected from the group consisting of aromatic, heteroaromatic and/or aliphatic moieties comprising conjugated double bonds, wherein the molecular orbitals of Ak and Gr and of Do and Gr, respectively, overlap.

EXAMPLES

Examples of Specific Combinations of Emitter Compounds

One general example is that energy is partly transferred from an excited S1 energy level of a high energy delayed fluorescent emitter compound (a) to the lower S1(b) and/or T1(b) energy level(s) of another emitter compound (b). Herein, compound (a) may be a blue copper-based singlet harvesting emitter. Compound (b) may be a fluorescent or a phosphorescent emitter. Compounds (a) and (b) may be mixed in a common layer or separated in two adjacent layers. Two adjacent layers may preferably be obtained by using orthogonal solvents, or cross-linkable layers, or by subsequent thermal evaporation.

Example I

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green copper complex blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example II

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green copper complex and an organic host compound blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example III

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green pure organic TADF emitter blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example IV

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green pure organic TADF emitter and an organic host compound blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example V

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green fluorescent emitter blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example VI

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green fluorescent emitter and an organic host compound blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example VII

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue copper complex and a green phosphorescent emitter blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example VIII

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue phosphorescent metal complex and a green copper-complex emitter blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Example IX

On an indium tin oxide (ITO) electrode, a 30 nm thick poly(3,4-ethylenedioxythiophene) polystyrene sulfonate copolymer (PEDOT:PSS) layer is deposited by spin-coating. The emitting layer consisted of a blue phosphorescent metal complex and a green copper-complex emitter and an organic host compound blended together in toluene and deposited by spin coating. The electron transporting layer is a 50 nm thick 1,3,5-tri(1-phenyl-1H-benzo[d]imidazol-2-yl)phenyl (TPBi) layer. The electrodes are a lithium fluoride (LiF) layer (1 nm) and an aluminum layer (100 nm).

Examples X-XVI: Further Emitter Compounds in the Context of the Present Invention In the following Examples X-XVI, emitter compounds that could serve as emitter compound (a) and/or emitter compound (b) are provided.

In general, if not otherwise defined, in the chemical structures, the following definitions may apply:

N represents nitrogen;
P represents phosphor;
O represents oxygen;
H represents hydrogen;
D represents deuterium;
Ph represents a phenyl residue;
Me represents a methyl residue;
Ar represents an unsubstituted or substituted aryl residue;
M and M' each represents a metal, in particular metal (I);
Cu represents copper, in particular Cu(I);
X and X' each represents represent an anion;
an alkyl residue may exemplarily be an unsubstituted or substituted methyl residue, ethyl residue, propyl residue, butyl residue, pentyl residue, hexyl residue, heptyl residue, octyl residue, nonyl residue, or decyl residue etc.;
an alkylene residue may exemplarily be an unsubstituted or substituted methylene residue, ethylene residue, propylene residue, butylene residue, pentylene residue, hexylene residue, heptyl residue, octylene residue, nonylene residue, or decylene residue etc.
an alkenyl residue may exemplarily be an unsubstituted or substituted methenyl residue, ethenyl residue, propenyl residue, butenyl residue, pentenyl residue, hexenyl residue, heptenyl residue, octenyl residue, nonenyl residue, or decenyl residue etc.; and
an alkenylene residue may exemplarily be an unsubstituted or substituted methenylene residue, ethenylene residue, propenylene residue, butenylene residue, pentenylene residue, hexenylene residue, heptenyl residue, octenylene residue, nonenylene residue, or decenylene residue etc.

Residues (in particular R, with or without further indices) that are not defined in more detail may represent any (unsubstituted or substituted organic) residue comprising not more than 40 carbon atoms. Likewise, each Z with or without further indices that is not defined in more detail may represent any divalent (unsubstituted or substituted organic) linker comprising not more than 40 carbon atoms or a bond.

A ligand designated by two letters interconnected by "^" means that the ligand is the structure between the first letter to the second letter comprising the structural elements depicted in the respective chemical structure.

Example X: Emitter Compound of Structure A

Exemplarily, the first emitter compound (a) and/or the second emitter compound (b) may be a Cu(I) complex having a structure according to one of the following formulae A, A', A" or A'". Examples for respective complexes are also provided in WO 2013/007707 (cf., exemplarily Examples 1-6 thereof)

formula A

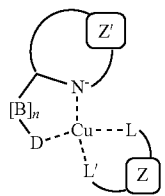

formula A'

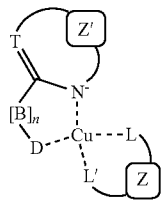

formula A"

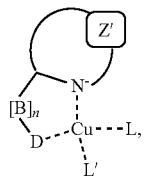

formula A'"

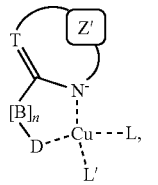

wherein the ligand comprising L, L' and Z (L^L') is a neutral, bidentate ligand that is bound to the Cu via non-ionic groups;
wherein the ligand comprising D, [B]$_n$, N$^-$ (and Z') (D^N$^-$) is bound to the Cu via an anionic group;
wherein D is a residue comprising at least one substituent D* selected from the group consisting of a bivalent carbene C*, N, O, P, S, As and Sb or consisting of D*,
wherein D* binds to Cu,
wherein D may further comprise a residue of up to 40 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups, wherein the substituents may optionally form a cyclic or anellated structure with each other and/or with residue D;
wherein N$^-$ is anionic nitrogen;
wherein Z' is —R$^u$—, —R$^u$—NR$^{u''}$—, —NR$^{u''}$—R$^u$—, —R$^u$—NR$^{u''}$—R$^{u'}$—, —R$^u$—SiR$^{u''}$R$^{u'''}$—R$^{u'}$—, —R$^u$—SiR$^{u''}$R$^{u'''}$—SiR$^{u''}$R$^{u'''}$—R$^{u'}$—, —R$^u$—GeR$^{u''}$R$^{u'''}$—R$^{u'}$—, —R$^u$—GeR$^{u''}$R$^{u'''}$—, —GeR$^{u''}$R$^{u'''}$—R$^{u'}$—, —R$^u$—O—R$^{u'}$—, —R$^u$—CO—R$^{u'}$—, —R$^u$—CO—O—R$^{u'}$—, —R$^u$—O—CO—O—R$^{u'}$—, —R$^u$—O—R$^{u'}$—, —R$^u$—CS—R$^{u'}$—, —R$^u$—CO—S—R$^{u'}$—, —R$^u$—S—CO—R$^{u'}$—, —R$^u$—CO—NH—R$^{u'}$—, —R$^u$—NH—CO—R$^{u'}$—, —R$^u$—O—, —R$^u$—S—R$^{u'}$—, —S—R$^{u'}$—, —R$^u$—S—, —R$^u$—SO—R$^{u'}$—, —SO—R$^{u'}$—, —R$^u$—SO—, —R$^u$—SO$_2$—R$^{u'}$—, —SO$_2$—R$^{u'}$—, or —R$^u$—SO$_2$—,
wherein R$^u$ and R$^{u'}$ each independently from another are a residue of up to 40 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups,
wherein the substituents may optionally form a cyclic or anellated structure with each other and/or with residue D,
wherein R$^{u''}$ and R$^{u'''}$ each independently from another are a residue of up to 40 carbon atoms selected from the group consisting of hydrogen, halogen, —R$^t$, —OC(O)R$^t$, —COOH, —OR$^t$, —NR$^t$R$^{t'}$, —SiR$^t$R$^{t'}$R$^{t''}$, —GeR$^t$R$^{t'}$R$^{t''}$, —SR$^t$, —SOR$^t$, —SO$_2$R$^t$ and other donor or acceptor groups such as exemplarily carboxylates and esters thereof, and CF$_3$— groups,
wherein R$^t$, R$^{t'}$ and R$^{t''}$ are each independently from another selected from the group consisting of H, OH, NH$_2$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue,
wherein two or more of the residues R$^t$, R$^{t'}$, R$^{t''}$, R$^u$, R$^{u'}$, R$^{u''}$, and R$^{u'''}$ may optionally also form anellated cyclic structures;
wherein each B is a bivalent organic linker independently from another selected from the group consisting of =CR$^z$—, —CR$^z$R$^y$—, —NR$^z$—, —O—, —SiR$^z$R$^y$—, —GeR$^z$R$^y$—, —S—, —S(O)—, and —S(O)$_2$— or a bond,
wherein R$^z$ and R$^y$ are each independently from another selected from the group consisting of hydrogen, halogen, —OR$^x$, —O—C(O)—R$^x$, —NR$^x$R$^{x'}$, —SiR$^x$R$^{x'}$R$^{x''}$, —GeR$^x$R$^{x'}$R$^{x''}$, —SR$^x$, —SOR$^x$, and —SO$_2$R$^x$,
wherein R$^x$, R$^{x'}$ and R$^{x''}$ are each independently from another selected from the group consisting of H, OH, NH$_2$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue,
wherein R$^x$, R$^{x'}$ and R$^{x''}$ may optionally also form anellated cyclic structures wherein B may exemplarily be a part of a phenyl and/or substituted phenyl moiety,
wherein each B may be the same of different,
wherein there is at least one carbon atom between N and D*, wherein one or more substituents of D and/or of N⁻ may optionally form cyclic, aliphatic, conjugated, aromatic and/or anellated systems;

wherein T is $CR^w$ or nitrogen, wherein $R^w$ is a residue selected from the group consisting of hydrogen, halogen, —$R^v$, —$OC(O)R^v$, —COOH, —$OR^v$, —$NR'R^{v'}$, —$SiR^vR^{v'}R^{v'''}$, —$GeR^vR^{v'}R^{v''}$, —$SR^v$, —$SOR^v$, —$SO_2R^v$ and other donor or acceptor groups such as exemplarily carboxylates and esters thereof, and $CF_3$— groups, wherein $R^v$, $R^{v'}$ and $R^{v''}$ are each independently from another selected from the group consisting of H, OH, $NH_2$, $NHR^{v'''}$, $NHR^{v'''}R^{v''''}$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein $R^{v'''}$ and $R^{v''''}$ are each independently from another selected from the group consisting of OH, $NH_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of $R^v$, $R^{v'}$, $R^{v'''}$ and $R^w$ may optionally also form anellated cyclic structures, wherein T may form one or more anellated cyclic structures with one or more B;

wherein n represents an integer from 1 to 9;

wherein L and L' are each independently from another bound to the Cu, wherein L comprises a residue L* and L' comprises a residue L'*, wherein L* and L'* are each independently from another selected from the group consisting of a bivalent carbene C*, N, O, P, S, As and Sb and wherein each of L* and L'* binds to the Cu, wherein L comprises one or more, preferably three, residues bound to the L*, and L' comprises one or more, preferably three, residues bound to the L'*, wherein the residues bound to L* and L'* are each independently a residue of up to 40 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and $CF_3$— groups, wherein the substituents may optionally form a cyclic or anellated structure with each other;

wherein each one residue bound to the L* and one residue bound to the L'* may be linked by Z, in particular wherein the other residues bound to L* and L'* are aryl residues, wherein Z is —O—, a bond, —$R^{ub}$—, —$R^{ub}$—$NR^{ub''}$—, —$NR^{ub''}$—$R^{ub}$—, —$R^{ub}$—$NR^{ub''}$—$R^{ub'}$—, —$R^{ub}$—$SiR^{ub''}R^{ub'''}$—$R^{ub'}$—, —$R^{ub}$—$SiR^{ub''}R^{ub'''}$—, —$SiR^{ub''}R^{ub'''}$—$R^{ub'}$—, —$R^{ub}$—$GeR^{ub''}R^{ub'''}$—$R^{ub'}$—, —$R^{ub}$—$GeR^{ub''}R^{ub'''}$—, —$GeR^{ub''}R^{ub'''}$—$R^{ub}$—, —$R^{ub}$—O—$R^{ub'}$—, —$R^{ub}$—CO—$R^{ub'}$—, —$R^{ub}$—CO—O—$R^{ub'}$—, —$R^{ub}$—O—CO—O—$R^{ub'}$—, —$R^{ub}$—O—CO—$R^{ub'}$—, —O—$R^{ub'}$—, —$R^{ub}$—CS—$R^{ub'}$—, —$R^{ub}$—CO—S—$R^{ub'}$—, —$R^{ub}$—S—CO—$R^{ub'}$—, —$R^{ub}$—CO—NH—$R^{ub'}$—, —$R^{ub}$—NH—CO—$R^{ub'}$—, —$R^{ub}$—O—, —$R^{ub}$—S—$R^{ub'}$—, —S—$R^{ub'}$—, —$R^{ub}$—S—, —$R^{ub}$—SO—$R^{ub'}$—, —SO—$R^{ub'}$—, —$R^{ub}$—SO—, —$R^{ub}$—$SO_2R^{ub'}$, —$SO_2$—$R^{ub'}$—, —$R^{ub}$—CO—$NR^{v'''}$—$R^{ub'}$—, —$R^{ub}$—$NR^{v''''}$—CO—$R^{ub'}$— or —$R^{ub}$—$SO_2$— or may be missing and, gus, not linking L and L', wherein $R^{ub}$ and $R^{ub'}$ are each independently from another a substituent of up to 40 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and $CF_3$— groups, wherein the substituents may optionally form a cyclic or anellated structure with each other;

wherein $R^{ub''}$ and $R^{ub'''}$ each independently from another are a residue of up to 40 carbon atoms selected from the group consisting of hydrogen, halogen, —$R^{t'''}$, —$OC(O)R^{t'''}$, —COOH, —$OR^{t'''}$, —$NR^{t'''}R^{t''''}$, —$SiR^{t'''}R^{t''''}R^{t'''''}$, —$GeR^{t'''}R^{t''''}R^{t'''''}$, —$SR^{t'''}$, —$SOR^{t'''}$, —$SO_2R^{t'''}$ and other donor or acceptor groups such as exemplarily carboxylates and esters thereof, and $CF_3$— groups, wherein $R^{t'''}$, $R^{t''''}$ and $R^{t'''''}$ are each independently from another selected from the group consisting of H, OH, $NH_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein the residues $R^{t'''}$, $R^{t''''}$, $R^{t'''''}$, $R^{ub}$, $R^{ub'}$, $R^{ub''}$, and $R^{ub'''}$ may optionally form a cyclic or anellated structure with each other.

In a preferred embodiment, N' together with Z' of formula A, A', A" or A'" represents an anion of an unsaturated or saturated N-heterocyclic moiety of 5 to 14 ring atoms that is obtained from N-deprotonating a residue selected from the group consisting of purinyl, pyrryl, indyl, carbazolyl, triazolyl, benzotriazolyl, pyrazolyl, benzopyrazolyl, imidazolyl, benzimidazolyl, and tetrazolyl, that may optionally be substituted further.

Alternatively, also two or more Z may link L and L'.

As can be seen from above, Z may also be also missing. Then, L and L' are both each binding to the but are not linked directly with another.

In a preferred embodiment, the residue D of the ligand comprising D, $[B]_n$, N⁻ (and Z') (D^N⁻) of formula A, A', A" or A'" is selected from the group consisting of (wherein the ligand does not comprise more than 20 carbon atoms):

(i) a carbene C* that is a part of a carbene ligand selected from the group consisting of:

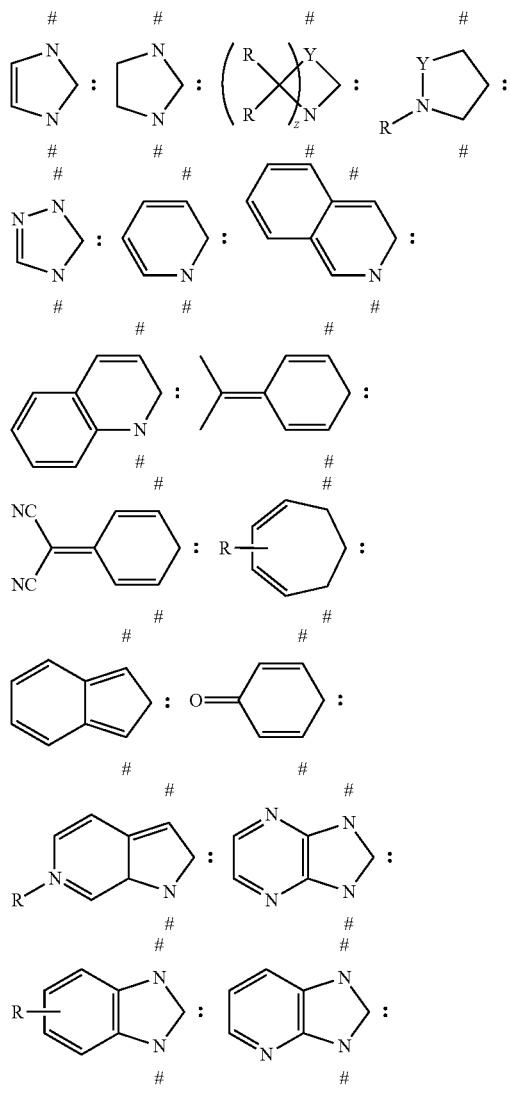

wherein the two dots ":" represent a bivalent carbene that is coordinated with the Cu, and wherein the carbene ligand is conjugated to B via one of the binding sites indicated by #, wherein the other binding site indicated by # represents the binding site to the residue selected from the group consisting of hydrogen, deuterium, nitrogen, $-OR^s$, $-O-C(O)-R^s$, $-NR^sR^{s'}$, $-SiR^sR^{s'}R^{s''}$, $-GeR^sR^{s'}R^{s''}$, $-SR^s$, $-SOR^s$ and $-SO_2R^s$,
wherein R is each independently from another selected from the group consisting of hydrogen, deuterium, hydroxyl, OH, $NH_2$, $-R^s$, $-OR^s$, $-O-C(O)-R^s$, $-NR^sR^{s'}$, $-SiR^sR^{s'}R^{s''}$, $-GeR^sR^{s'}R^{s''}$, $-SR^s$, $-SOR^s$ and $-SO_2R^s$,
wherein $R^s$, $R^{s'}$ and $R^{s''}$ are each independently from another selected from the group consisting of hydrogen, deuterium, OH, $NH_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues R, $R^s$, $R^{s'}$ and $R^{s''}$ may also form anellated cyclic structures with each other;
wherein Y is nitrogen or $CR^r$,
wherein $R^r$ is a residue selected from the group consisting of hydrogen, deuterium, halogen, $-R^q$, $-OC(O)R^q$, $-COOH$, $-OR^q$, $-NR^qR^{q'}$, $-SiR^qR^{q'}R^{q''}$, $-GeR^qR^{q'}R^{q''}$, $-SR^q$, $-SOR^q$, $-SO_2R^q$ and other donor or acceptor groups such as exemplarily carboxylates and esters thereof, and $CF_3-$ groups,
wherein $R^q$, $R^{q'}$ and $R^{q''}$ are each independently from another selected from the group consisting of H, OH, $NH_2$, $NR^sR^{s'}$, $NHR^s$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein two or more of the residues $R^q$, $R^{q'}$, $R^{q''}$ and $R^r$ may optionally form anellated cyclic structures; and
wherein z represent an integer of 1, 2, 3 or 4;
(ii) an unsaturated or aromatic N-heterocyclic moiety of 4 to 8 ring atoms, wherein the Cu is coordinated via a nitrogen atom of the N-heterocyclic moiety, selected from the group consisting of pyridyl, pyrimidyl, pyridazyl, pyrazyl, pyranyl, cumaryl, pteridyl, thiophenyl, benzothiophenyl, furyl, benzofuryl, oxazolyl, thiazolyl, imidazolyl, pyrazolyl, thienothienyl, dithiaindacenyl, chinolyl, isochinolyl, chinoxalyl, acridyl, azanaphthyl, phenanthrolyl, triazinyl, thienyl, thiadiazolyl, isoxazolyl, isothiazolyl, 1,2,3-triazolyl, 1,2,4-triazolyl, 1,2,4-oxadiazolyl, 1,2,4-thiadiazolyl, tetrazolyl, 1,2,3,4-oxatriazolyl and 1,2,3,4-thiatriazolyl, that may optionally be further substituted and/or anellated, and an N-heterocyclic moiety selected from the group consisting of:

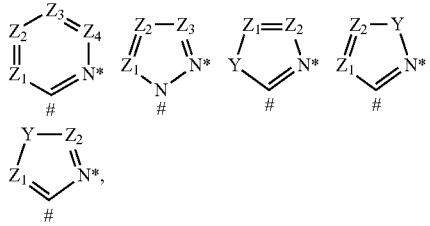

wherein the moiety is conjugated to B at the site indicated by #, and * represents the atom that form a complex binding to Cu,
wherein $Z_1$, $Z_2$, $Z_3$ and $Z_4$ are each independently from another $CR^i$ or nitrogen,
wherein $R^i$ a residue selected from the group consisting of hydrogen, deuterium, halogen, $-R^k$, $-OC(O)R^k$, $-COOH$, $-OR^k$, $-NR^kR^{k'}$, $-SiR^kR^kR^{k''}$, $-GeR^kR^{k'}R^{k''}$, $-SR^k$, $-SOR^k$, $-SO_2R^k$ and other donor or acceptor groups such as exemplarily carboxylates and esters thereof, and $CF_3-$ groups,
wherein $R^k$, $R^{k'}$ and $R^{k''}$ are each independently from another selected from the group consisting of H, OH, $NH_2$, $NR^sR^{s'}$, $NHR^s$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^k$, $R^{k'}$, $R^{k''}$ and $R^l$ may optionally form anellated cyclic structures, wherein Y may be defined as above;

(iii) a phosphanyl, arsenyl or antimonyl moiety of the structure -$ER^iR^j$, wherein E is selected from the group consisting of P, As and Sb, that coordinate to the Cu, wherein $R^i$ and $R^j$ are each independently from another selected from the group consisting of hydrogen, deuterium, halogen, —$R^k$, —OC(O)$R^k$, —COOH, —O$R^k$, —N$R^kR^{k'}$, —Si$R^kR^{k'}R^{k''}$, —Ge$R^kR^{k'}R^{k''}$, —S$R^k$, —SO$R^k$, —SO$_2R^k$ and other donor or acceptor groups such as exemplarily carboxylates and esters thereof, and CF$_3$— groups, wherein $R^k$, $R^{k'}$ and $R^{k''}$ are each independently from another selected from the group consisting of H, OH, NH$_2$, N$R^sR^{s'}$, NH$R^s$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues $R^k$, $R^{k'}$, $R^{k''}$, $R^i$ and $R^j$ may optionally form anellated cyclic structures.

In a preferred embodiment, the carbene C* of the ligand comprising D, [B]$_n$ and N$^-$ of formula A, A', A'' or A''' forms part of a moiety having one of the following structures:

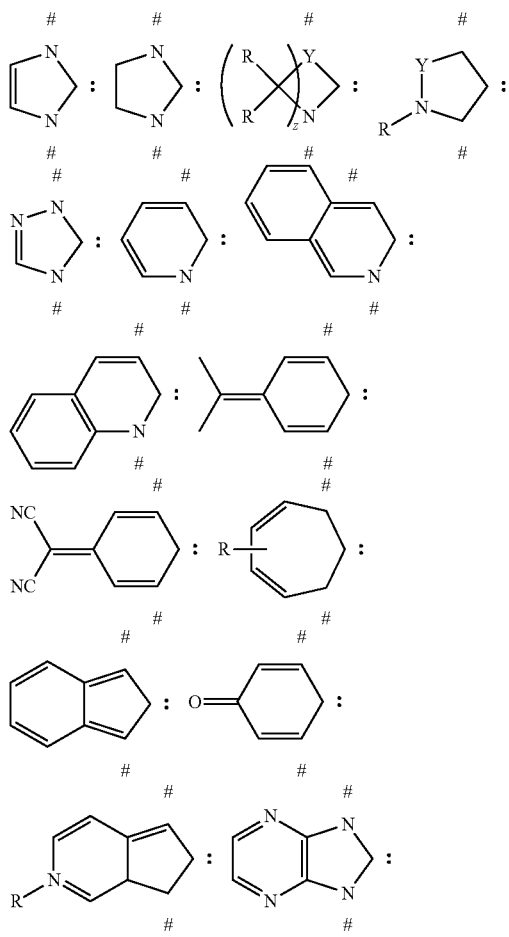

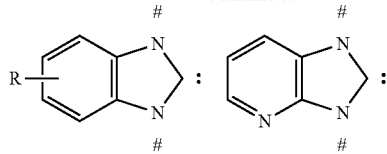

wherein the two dots ":" represent a bivalent carbene that is coordinated with the Cu, and wherein the carbene ligand is conjugated to B via one of the binding sites indicated by #, wherein the other binding site indicated by # represents the binding site to the residue selected from the group consisting of hydrogen, nitrogen, O$R^g$, —O—C(O)—$R^g$, —N$R^gR^{g'}$, —Si$R^gR^{g'}R^{g''}$, —Ge$R^gR^{g'}R^{g''}$, —S$R^g$, —SO$R^g$ and —SO$_2R^g$, wherein R is each independently from another selected from the group consisting of hydrogen, deuterium, nitrogen, —$R^g$, —O$R^g$, —O—C(O)—$R^g$, —N$R^gR^{g'}$, —Si$R^gR^{g'}R^{g''}$, —Ge$R^gR^{g'}R^{g''}$, —S$R^g$, —SO$R^g$ and —SO$_2R^g$, wherein $R^g$, $R^{g'}$ and $R^{g''}$ are each independently from another selected from the group consisting of H, OH, NH$_2$, N$R^sR^{s'}$, NH$R^s$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues R, $R^g$, $R^{g'}$ and $R^{g''}$ may also form anellated cyclic structures with each other;

wherein Y is nitrogen or C$R^f$, wherein $R^f$ is a residue selected from the group consisting of hydrogen, deuterium, halogen, —$R^e$, —OC(O)$R^e$, —COOH, —O$R^e$, —N$R^eR^{e'}$, —Si$R^eR^{e'}R^{e''}$, —Ge$R^eR^{e'}R^{e''}$, —S$R^e$, —SO$R^e$, —SO$_2R^e$ and other donor or acceptor groups such as exemplarily carboxylates and esters thereof, and CF$_3$— groups, wherein $R^e$, $R^{e'}$ and $R^{e''}$ are each independently from another selected from the group consisting of H, OH, NH$_2$, N$R^sR^{s'}$, NH$R^s$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues $R^e$, $R^{e'}$, $R^{e''}$ and $R^f$ may optionally form anellated cyclic structures; and wherein z represent an integer of 1, 2, 3 or 4.

In a preferred embodiment, the ligand L^L' is a bidentate ligand of the form L-G-L', wherein G is a substituted or unsubstituted C$_{1-9}$-alkylene, C$_{2-8}$-alkenylene, C$_{2-8}$-alkinylene or arylene moiety, —$R^d$—N$R^{d''}$—, —N$R^{d''}$—$R^d$—, —$R^d$—N$R^{d''}$—$R^{d'}$—, —$R^d$—Si$R^{d''}R^{d'''}$—$R^{d'}$—, —$R^d$—Si$R^{d''}R^{d'''}$—, —Si$R^{d''}R^{d'''}$—, —$R^d$—Ge$R^{d''}R^{d'''}$—$R^{d'}$—, —$R^d$—Ge$R^{d''}R^{d'''}$—, —Ge$R^{d''}R^{d'''}$—, —$R^d$—, $R^d$—O—$R^{d'}$—, —$R^d$—CO—$R^{d'}$—, —$R^d$—CO—O—$R^{d'}$—, —$R^d$—O—CO—O—$R^{d'}$—, —$R^d$—O—CO—$R^{d'}$—, —O—$R^{d'}$—, —$R^d$—CS—$R^{d'}$—, —$R^d$—CO—S—$R^{d'}$—, —$R^d$—S—CO—$R^{d'}$—, —$R^d$—CO—NH—$R^{d'}$—, —$R^d$—NH—CO—$R^{d'}$—, —$R^d$—O—, —$R^d$—S—$R^{d'}$—, —S—$R^{d'}$—, —$R^d$—S—, —$R^d$—SO—$R^{d'}$—, —SO—$R^{d'}$—, —$R^d$—SO—, —$R^dSO_2$—$R^{d'}$—, —SO$_2$—$R^{d'}$—, or —$R^d$—SO$_2$—, wherein R$^d$ and R$^{d'}$ are each independently from another a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups, wherein the substituents may optionally form a cyclic and/or anellated structure with each other and/or with one or both of the residues L and/or L';

wherein R$^{d''}$ and R$^{d'''}$ are each independently from another a residue of up to 20 carbon atoms selected from the group consisting of hydrogen, halogen, —R$^c$, —OC(O)R$^c$, —COOH, —OR$^c$, —NR$^c$R$^{c'}$, —SiR$^c$R$^{c'}$R$^{c''}$, —GeR$^c$R$^{c'}$R$^{c''}$, —SR$^c$, —SOR$^c$, —SO$_2$R$^c$ and other donor or acceptor groups such as exemplarily carboxylates and esters thereof, and CF$_3$— groups, wherein R$^c$, R$^{c'}$ and R$^{c''}$ are each independently from another selected from the group consisting of H, OH, NH$_2$, NR$^s$R$^{s'}$, NHR$^s$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues R$^c$, R$^{c'}$, R$^{c''}$, R$^d$, R$^{d'}$, R$^{d''}$, and R$^{d'''}$ may optionally form anellated cyclic structures;

wherein L and L' are substituents that may be the same of different from another and are independently from another selected from the group consisting of (wherein the ligand does not comprise more than 20 carbon atoms):

(i) the fragment X$^b$ or an unsaturated or aromatic N-heterocyclic moiety of 4 to 8 ring atoms selected from the group consisting of pyridyl, pyrimidyl, pyridazyl, pyrazyl, pyranyl, cumaryl, pteridyl, thiophenyl, benzothiophenyl, furyl, benzofuryl, oxazolyl, thiazolyl, imidazolyl, pyrazolyl, thienothienyl, dithiaindacenyl, chinolyl, isochinolyl, chinoxalyl, acridyl, azanaphthyl, phenanthrolyl, triazinyl, thienyl, thiadiazolyl, isoxazolyl, isothiazolyl, 1,2,3-triazolyl, 1,2,4-triazolyl, 1,2,4-oxadiazolyl, 1,2,4-thiadiazolyl, tetrazolyl, 1,2,3,4-oxatriazolyl and 1,2,3,4-thiatriazolyl, that may optionally be further substituted and/or anellated, wherein the Cu is coordinated via a nitrogen atom of the fragment X$^b$ or a nitrogen atom of the N-heterocyclic moiety, wherein the fragment X$^b$ is selected from the group consisting of:

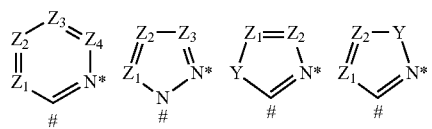

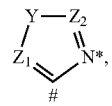

wherein the moiety is conjugated to G at the site indicated by # and * represents the atom that forms a complex binding to Cu, wherein Z$_1$, Z$_2$, Z$_3$ and Z$_4$ are each independently from another CR$^{az}$ or nitrogen, wherein R$^{az}$ a residue selected from the group consisting of hydrogen, halogen, —R$^{ay}$, —OC(O)R$^{ay}$, —COOH, —OR$^{ay}$, —NR$^{ay}$R$^{ay'}$, —SiR$^{ay}$R$^{ay'}$R$^{ay''}$, —GeR$^{ay}$R$^{ay'}$R$^{ay''}$, —SR$^{ay}$, —SOR$^{ay}$, —SO$_2$R$^{ay}$ and other donor or acceptor groups such as exemplarily carboxylates and esters thereof, and CF$_3$— groups, wherein R$^{ay}$, R$^{ay'}$ and R$^{ay''}$ are each independently from another selected from the group consisting of H, OH, NH$_2$, NR$^s$R$^{s'}$, NHR$^s$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues R$^{ay}$, R$^{ay'}$, R$^{ay''}$, and R$^{az}$ may optionally form anellated cyclic structures;

(ii) a phosphanyl, arsenyl or antimonyl moiety in the form of -ER$^i$R$^j$ as defined above; and/or (iii) a group D comprising the C* selected from the group consisting of:

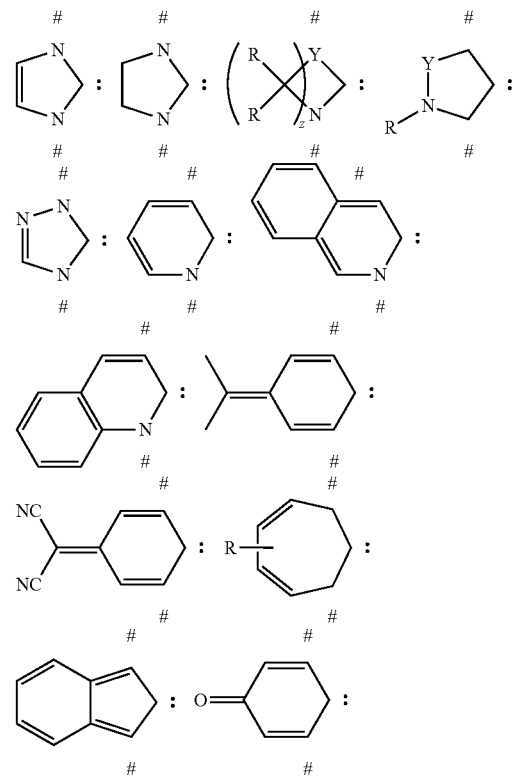

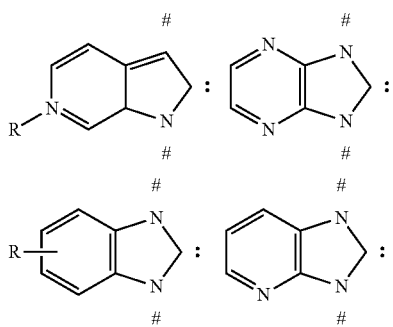

wherein the two dots ":" represent a bivalent carbene that is coordinated with the Cu, and wherein the carbene ligand is conjugated to B via one of the binding sites indicated by #, wherein the other binding site indicated by # represents the binding site to the residue selected from the group consisting of hydrogen, nitrogen, OR$^g$, —O—C(O)—R$^g$, —NR$^g$R$^{g'}$, —SiR$^g$R$^{g'}$R$^{g''}$, —GeR$^g$R$^{g'}$R$^{g''}$, —SR$^g$, —SOR$^g$ and —SO$_2$R$^g$, and wherein two or more of the residues R, R$^g$, R$^{g'}$, R$^{g''}$, Y and Z are defined as above.

In a preferred embodiment, a Cu(I) complex of formula A, A', A" or A''' has one of the following structures:

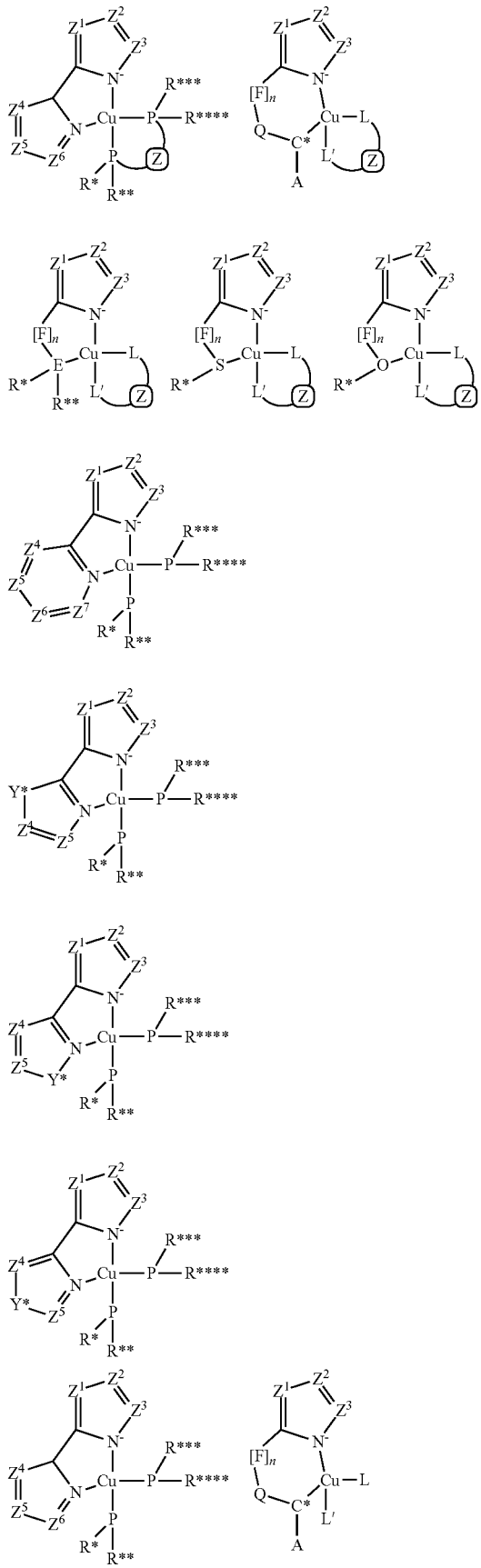

-continued

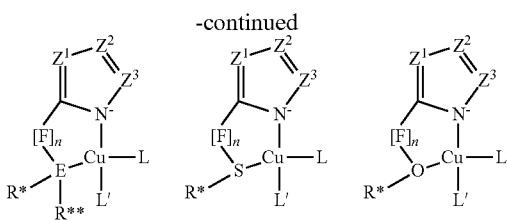

wherein $Z^1$, $Z^2$, $Z^3$, $Z^4$, $Z^5$, $Z^6$ and $Z^7$ are each independently from another nitrogen or $CR^r$,
wherein $R^r$ is a residue selected from the group consisting of hydrogen, deuterium, halogen, —$R^q$, —OC(O)$R^q$, —COOH, —O$R^q$, —N$R^q R^{q''}$, —Si$R^q R^{q'} R^{q''}$, —Ge$R^q R^{q'} R^{q''}$, —S$R^q$, —SO$R^q$, —SO$_2 R^q$ and other donor or acceptor groups such as exemplarily carboxylates and esters thereof, and CF$_3$— groups,
wherein $R^q$, $R^{q'}$ and $R^{q''}$ are each independently from another selected from the group consisting of H, OH, NH$_2$, N$R^s R^{s'}$, NH$R^s$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue;
wherein Z is defined as above, i.e. is a divalent group as laid out in the context of a structure of formula A, A', A" or A''' above or is a bond;
wherein Y* is selected from the group consisting of O, S and N$R^r$, wherein $R^r$ is defined as above;
wherein C*, L and L' are each independently from another are defined as laid out in the context of a structure of formula A, A', A" or A''' above;
wherein Q is selected from the group consisting of a substituted or unsubstituted $C_{1-9}$-alkylene residue, $C_{2-8}$-alkenylene residue, $C_{2-8}$-alkinylene residue, arylene residue, —$R^a$—N$R^{a''}$—, —N$R^{a''}$—$R^a$—, —$R^a$—N$R^{a''}$—$R^{a'}$—, —$R^a$—Si$R^{a''} R^{a'''}$—$R^{a'}$—, —$R^a$—Si$R^{a''} R^{a'''}$—, —Si$R^{a''} R^{a'''}$—$R^a$—, —$R^a$—O—$R^{a'}$—, —$R^a$—CO—$R^{a'}$—, —$R^a$—CO—O—$R^{a'}$—, —$R^a$—O—CO—O—$R^{a'}$—, —$R^a$—O—CO—$R^{a'}$—, —O—$R^{a'}$—, —$R^a$—CS—$R^{a'}$—, —$R^a$—CO—S—$R^{a'}$—, —$R^a$—S—CO—$R^{a'}$—, —$R^a$—CO—NH—$R^{a'}$—, —$R^a$—NH—CO—$R^{a'}$—, —$R^a$—O—, —R—S—$R^{a'}$—, —S—$R^{a'}$—, —$R^a$—S—, —R—SO—$R^{a'}$—, —SO—$R^{a'}$—, —$R^a$—SO—, —$R^a$—SO$_2$—$R^{a'}$—, —SO$_2$—$R^{a'}$—, and —$R^a$—SO$_2$—,
wherein $R^a$ and $R^{a'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups, wherein the substituents may optionally form a cyclic or anellated structure with each other;
wherein $R^{a''}$ and $R^{a'''}$ each independently from another are a residue of up to 20 carbon atoms selected from the group consisting of hydrogen, halogen, -deuterium, $R^c$, —OC(O) $R^c$, —COOH, —O$R^c$, —N$R^c R^{c'}$, —Si$R^c R^{c'} R^{c''}$, —S$R^c$, —SO$R^c$, —SO$_2 R^c$ and other donor or acceptor groups such as exemplarily carboxylates and esters thereof, and CF$_3$— groups,
wherein $R^c$, $R^{c'}$ and $R^{c''}$ are each independently from another selected from the group consisting of H, OH, NH$_2$, NH$R^1$, N$R^1 R^{1'}$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein two or more of the residues $R^c$, $R^{c'}$, $R^{c''}$, $R^a$, $R^{a'}$, $R^{a''}$, and $R^{a'''}$ may optionally also form anellated cyclic structures;
wherein E is selected from the group consisting of P, As and Sb;
wherein each F is a bivalent organic linker independently from another selected from the group consisting of =$CR^z$—, —$CR^z R^y$—, —N$R^z$—, —O—, —Si$R^z R^y$—, —Ge$R^z R^y$—, —S—, —S(O)—, and —S(O)$_2$— or a bond,
wherein $R^z$ and $R^y$ are each independently from another selected from the group consisting of hydrogen, halogen, —O$R^x$, —O—C(O)—$R^x$, —N$R^x R^{x'}$, —Si$R^x R^{x'} R^{x''}$, —Ge$R^x R^{x'} R^{x''}$, —S$R^x$, —SO$R^x$, and —SO$_2$R,
wherein $R^x$, $R^{x'}$ and $R^{x''}$ are each independently from another selected from the group consisting of H, OH, NH$_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein $R^x$, $R^{x'}$ and $R^{x''}$ may optionally also form anellated cyclic structures wherein F may exemplarily be a part of a phenyl and/or substituted phenyl moiety,
wherein each F may be the same of different;
wherein the residues A, R*, R, R* and R**** are each independently from another are any organic moiety comprising not more than 40 carbon atoms, preferably wherein each of said residues is each independently from another selected from the group consisting of H, OH, NH$_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue; and
wherein n represents an integer from 1 to 9.
In a more preferred embodiment, a Cu(I) complex of formula A, A', A" or A''' may have one of the aforementioned structures, wherein Z is

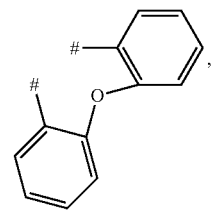

wherein # represents the binding sites to the rest of the structure of the Cu(I) complex of formula A, A', A" or A'", e.g., to N, P, L or L'.

In an even more preferred embodiment, a Cu(I) complex of formula A, A', A" or A'" may have one of the following structures:

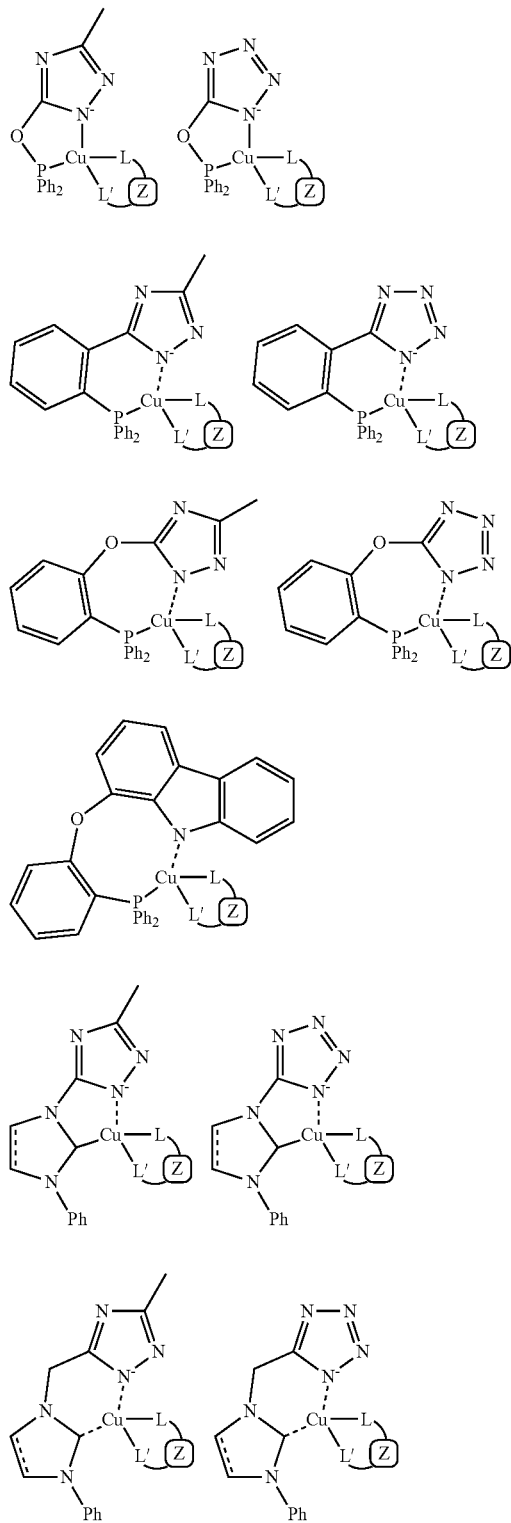

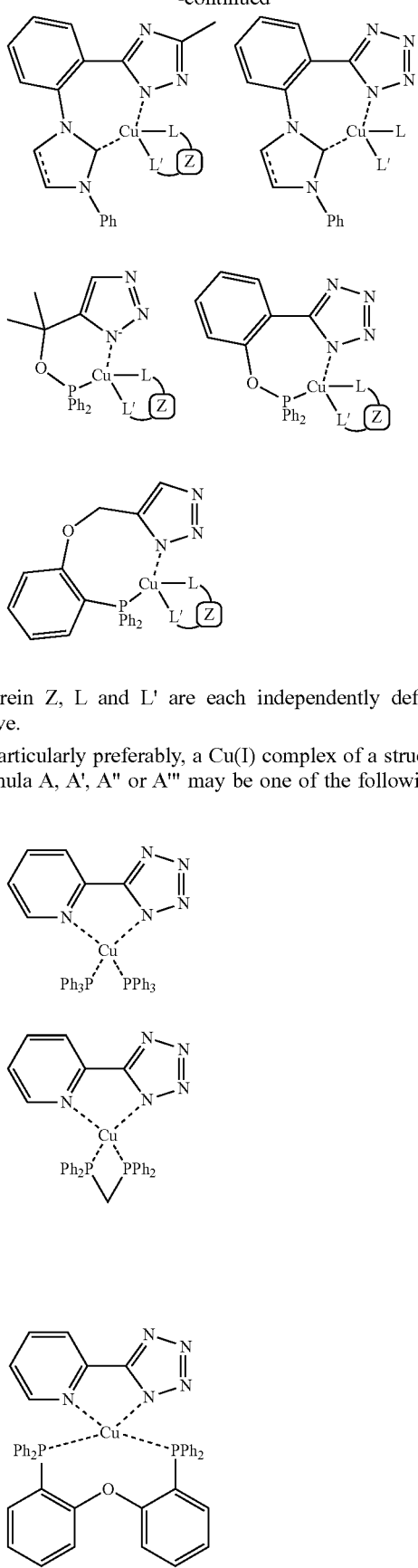

wherein Z, L and L' are each independently defined as above.

Particularly preferably, a Cu(I) complex of a structure of formula A, A', A" or A'" may be one of the following:

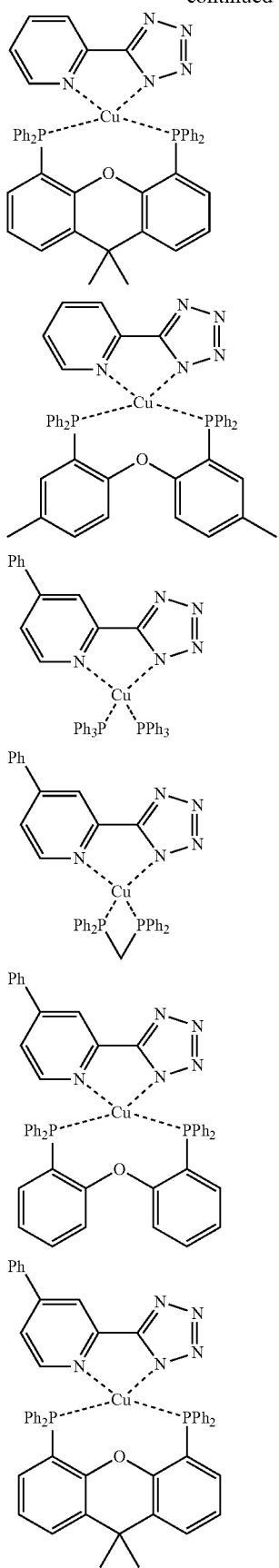
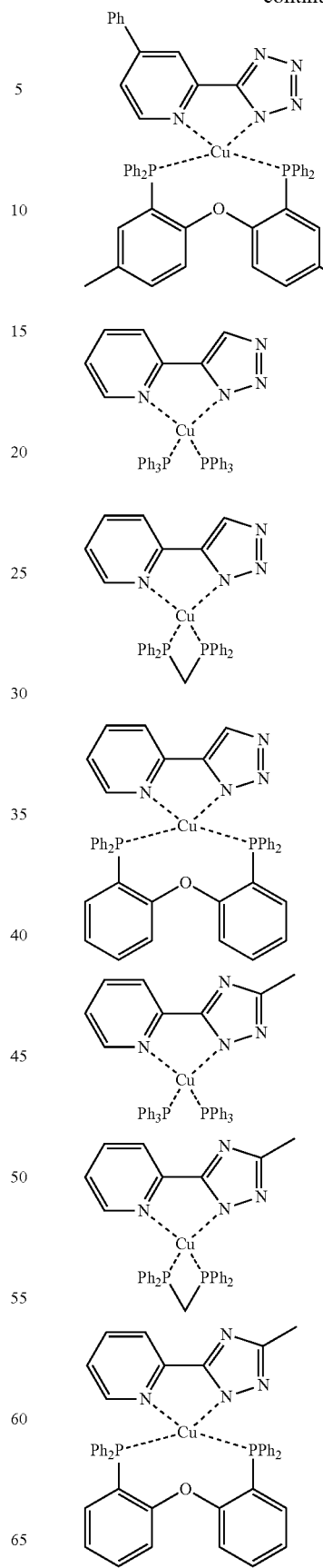

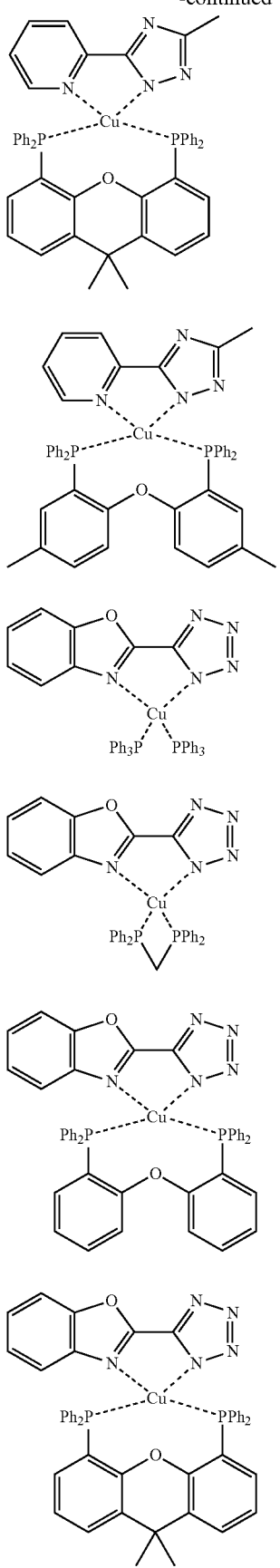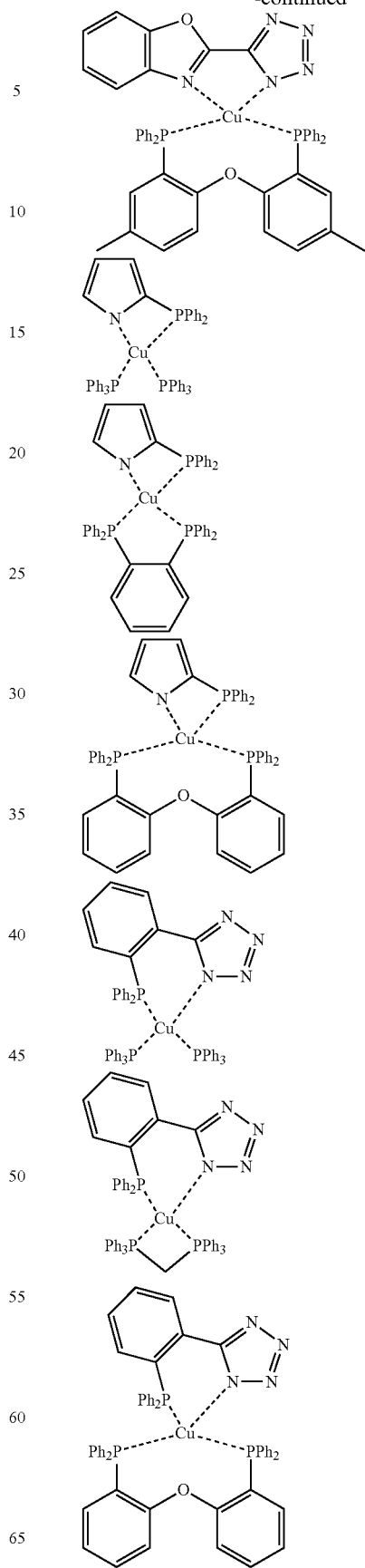

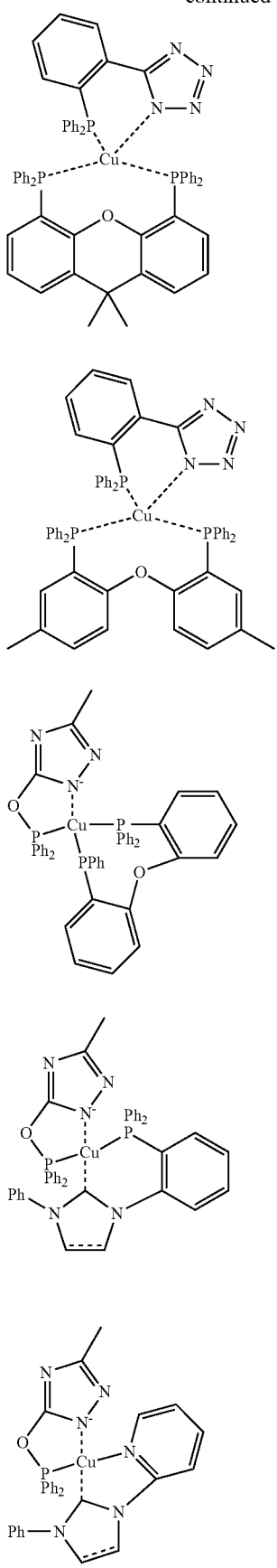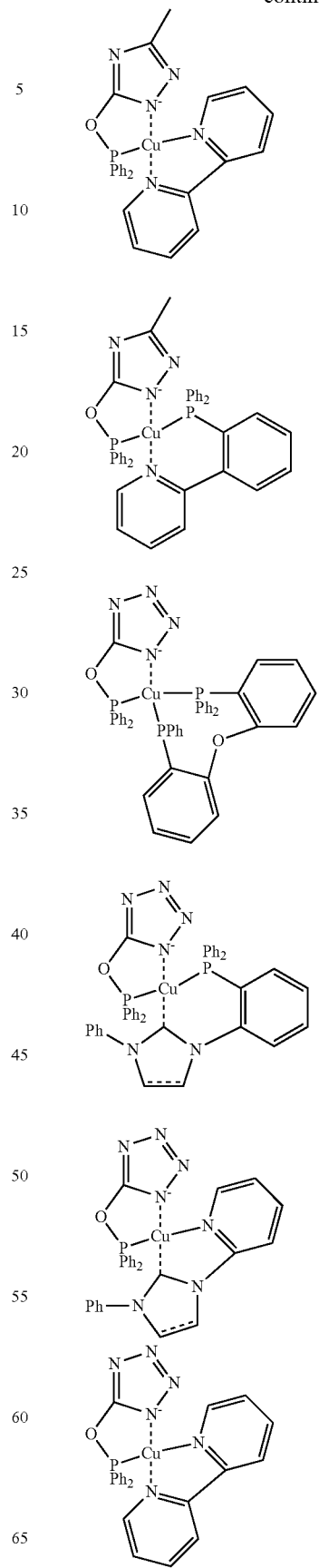

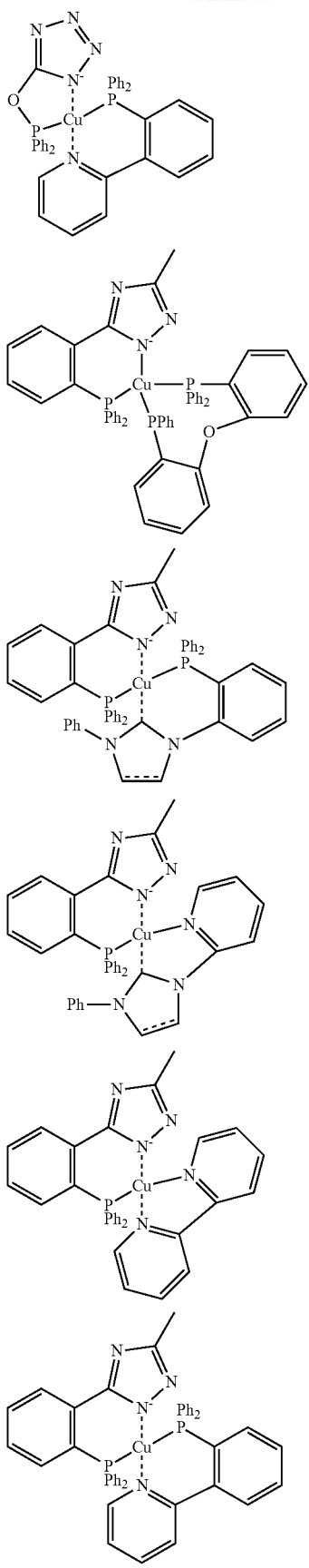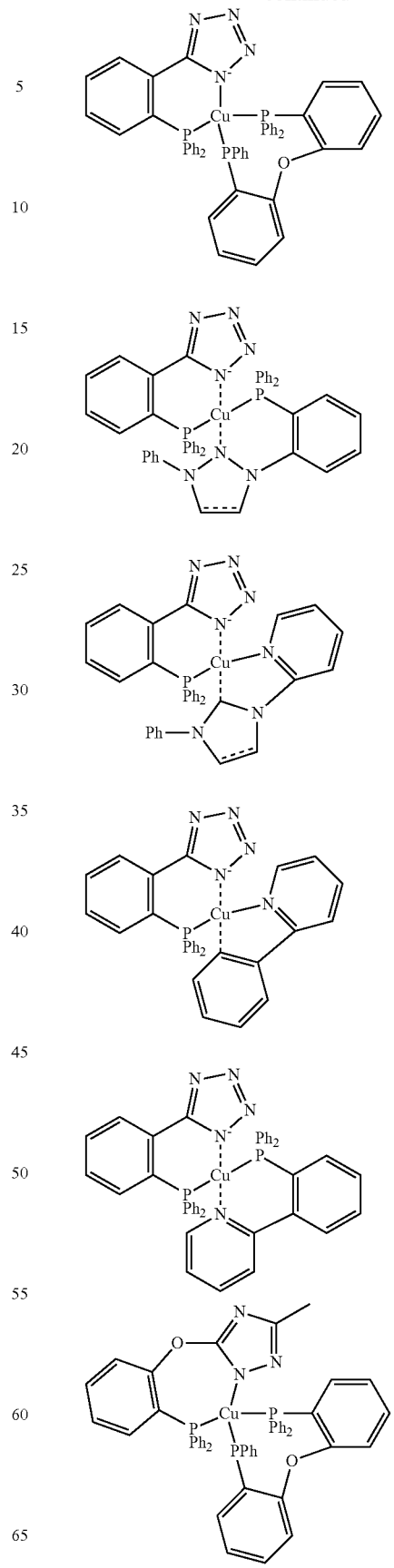

-continued
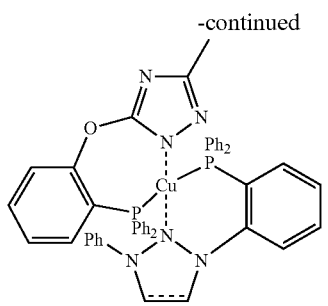
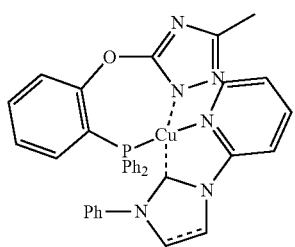
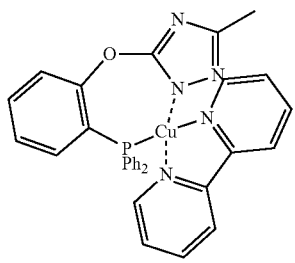
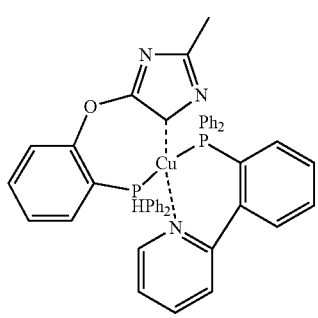
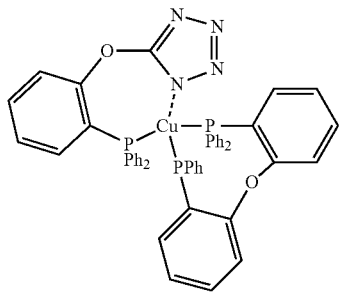
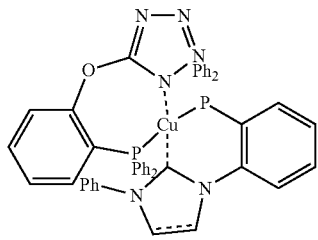
-continued
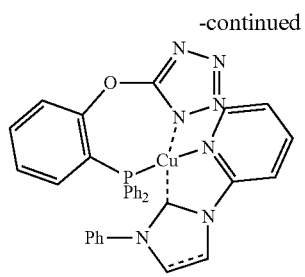
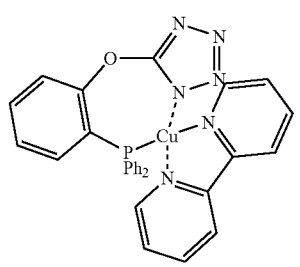
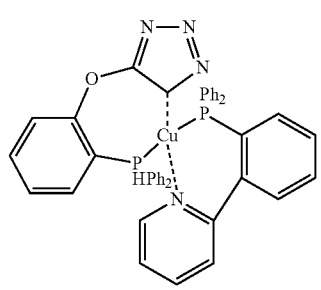
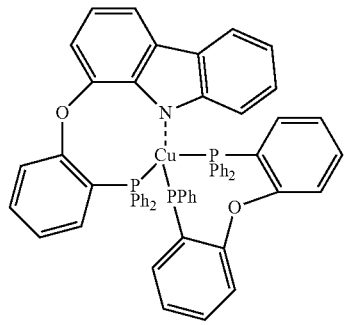
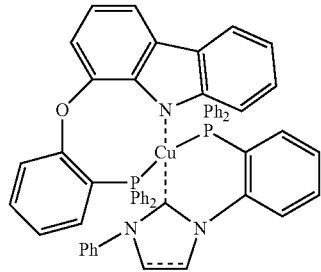
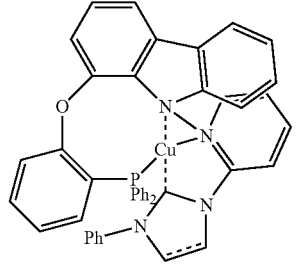

-continued
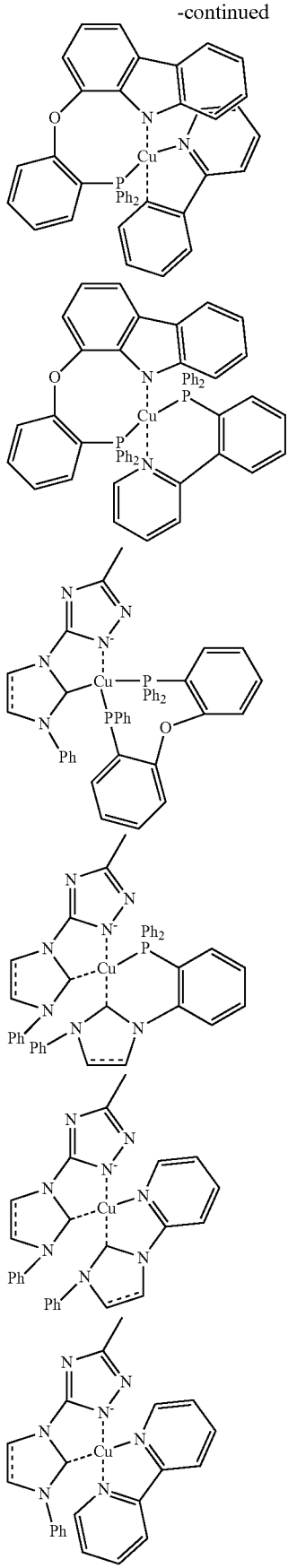
-continued
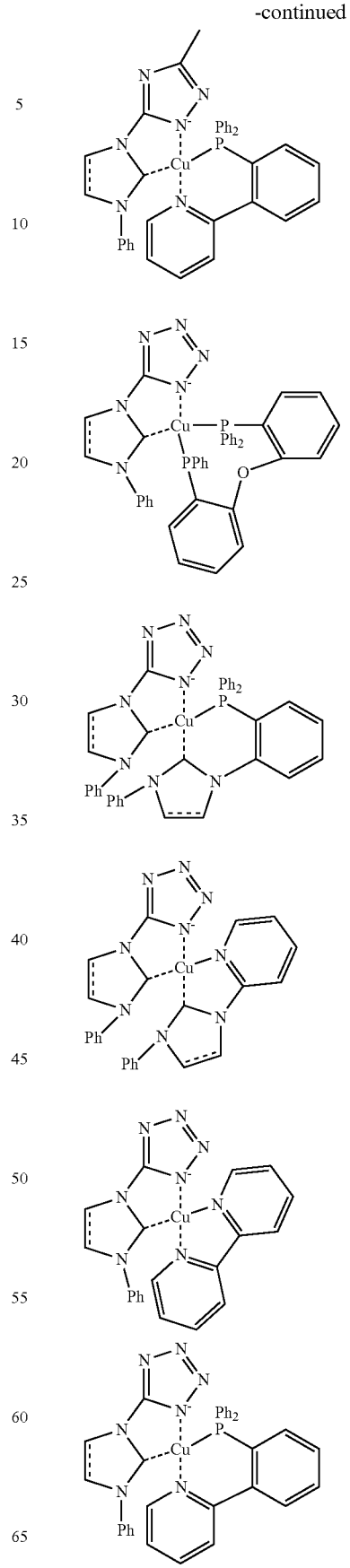

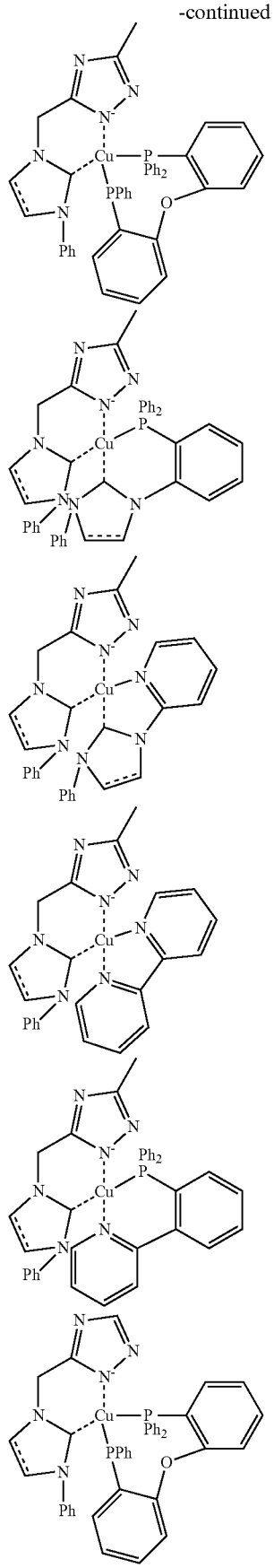
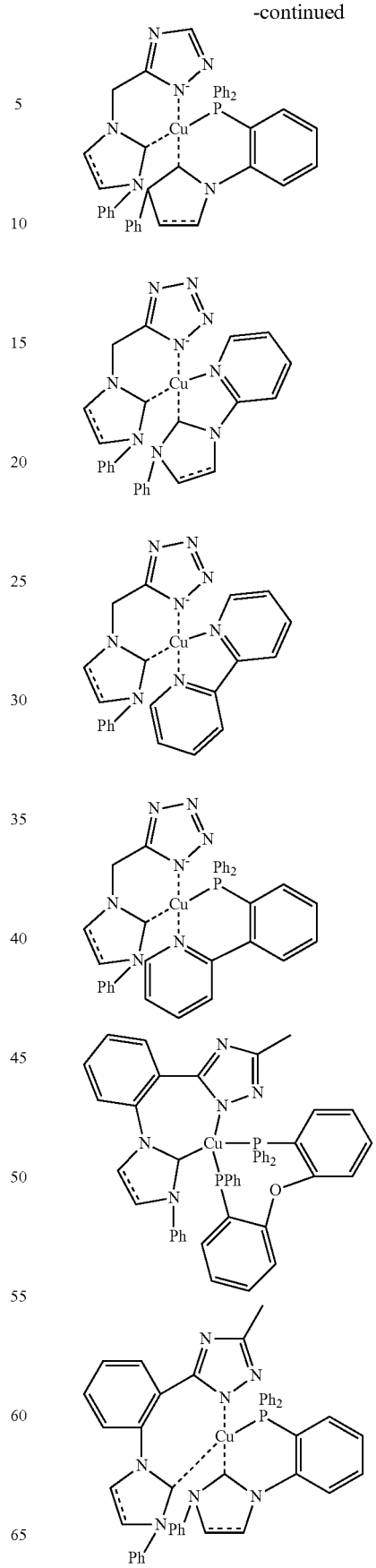

-continued
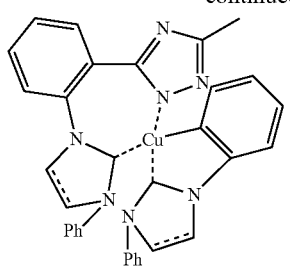
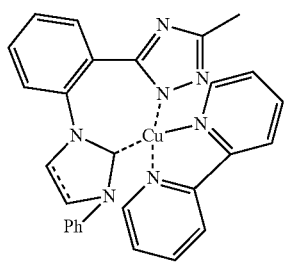
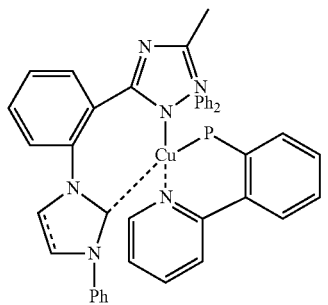
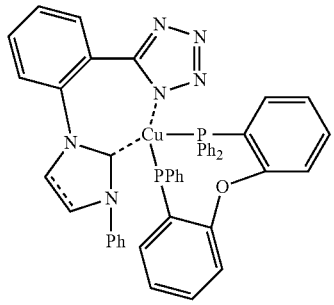
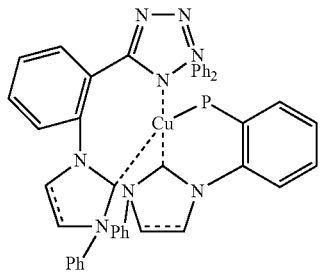
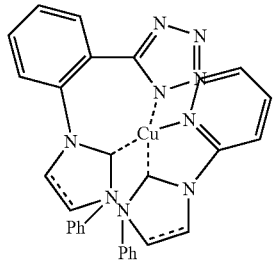
-continued
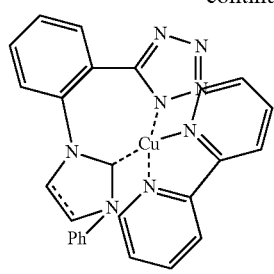
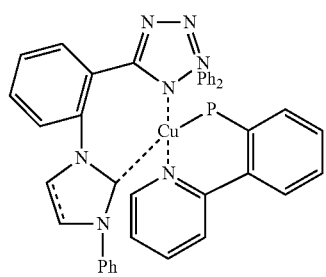
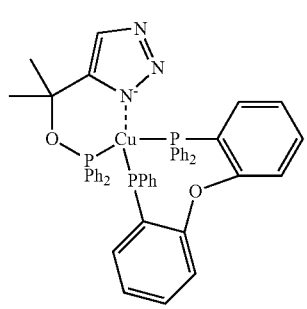
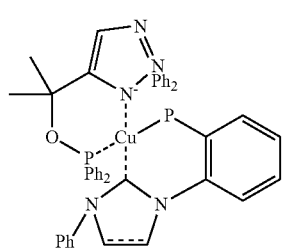
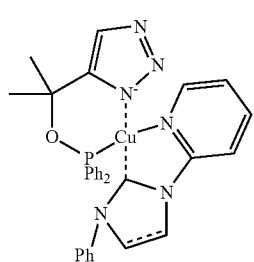
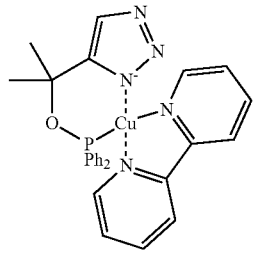

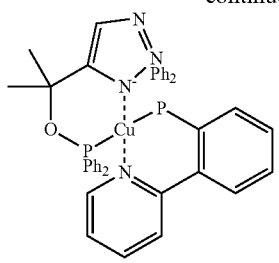
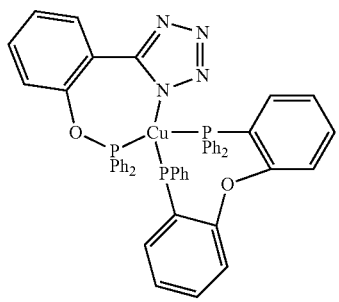
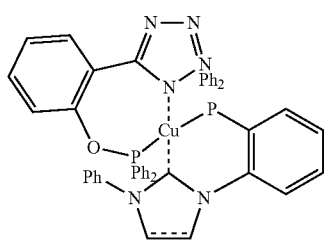
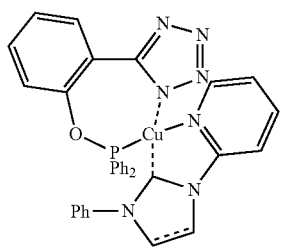
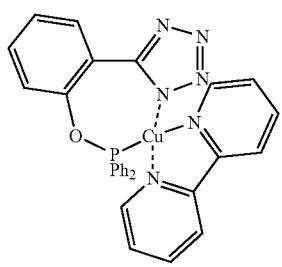
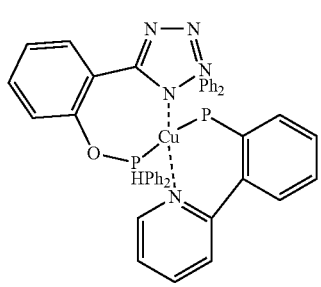
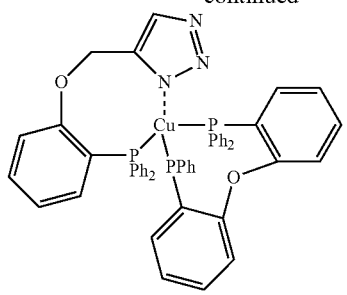
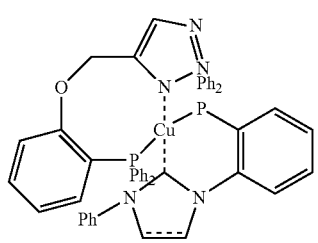
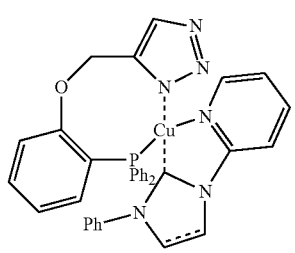
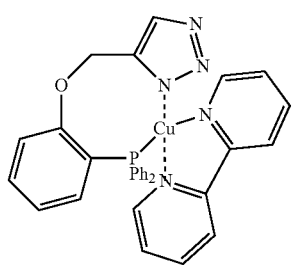
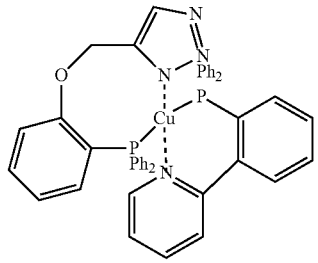
Further preferred examples for the ligand ligand comprising D, [B]$_n$, N$^-$ (and Z') (D^N$^-$) according to formula A, A', A" or A''' are the following:
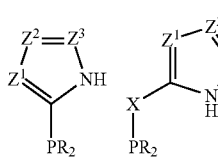
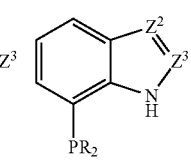

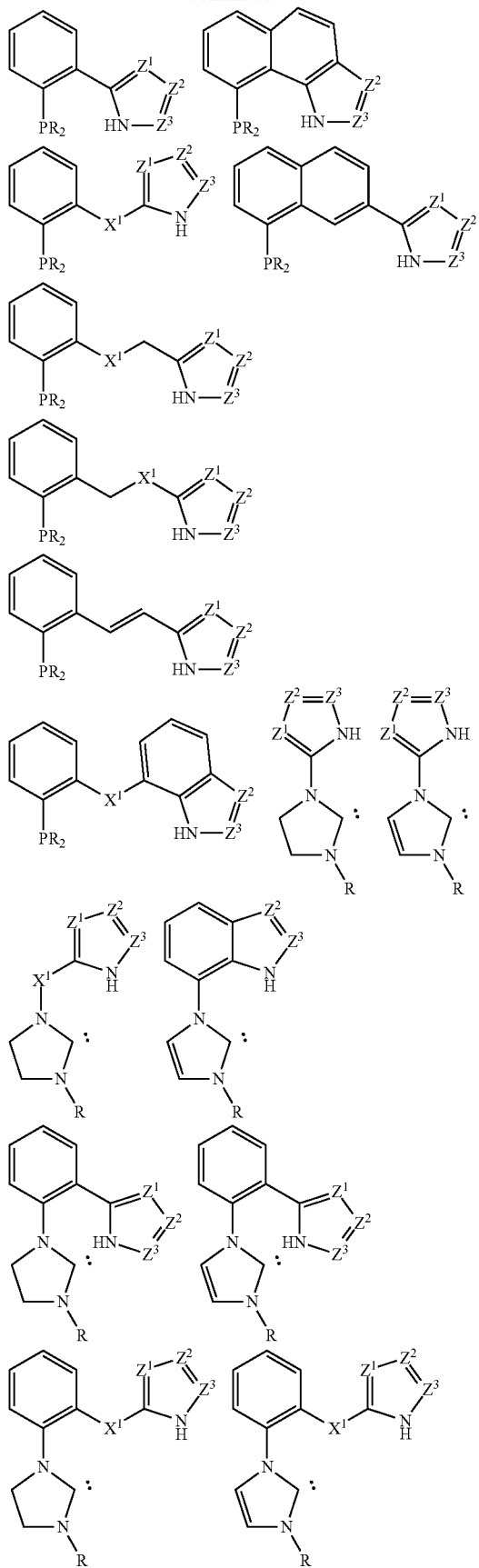
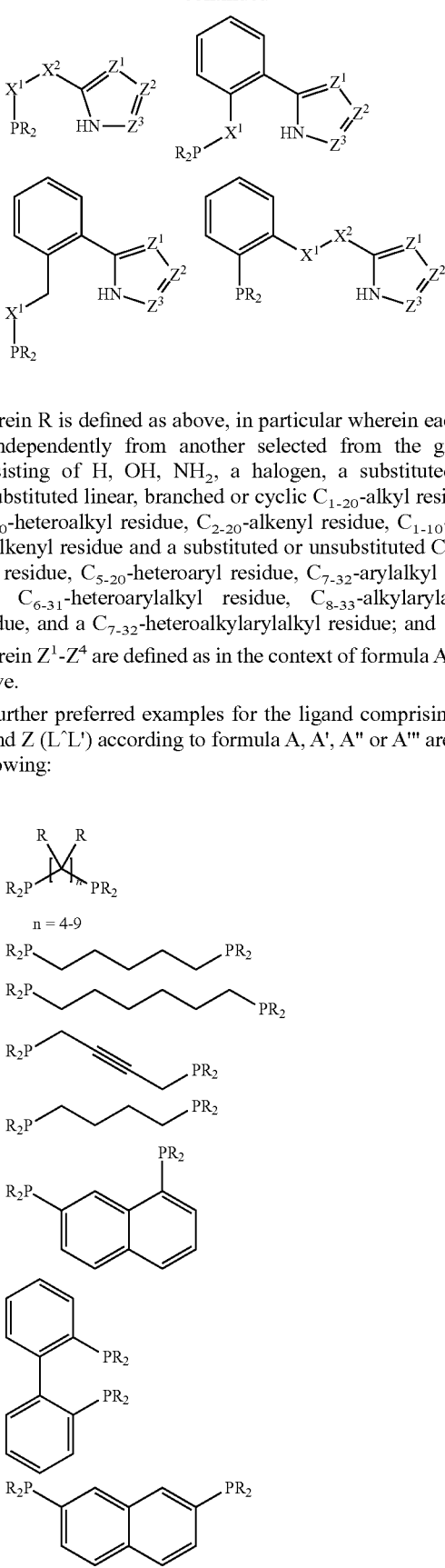

wherein R is defined as above, in particular wherein each R is independently from another selected from the group consisting of H, OH, $NH_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue; and wherein $Z^1$-$Z^4$ are defined as in the context of formula A-A''' above.

Further preferred examples for the ligand comprising L, L' and Z (L^L') according to formula A, A', A'' or A''' are the following:

-continued
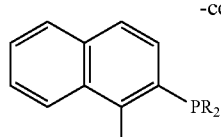
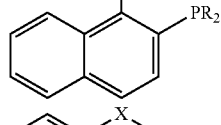
X = CR₂, NR, O
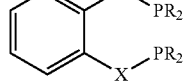
X = CR₂, NR, O
Y = CR₂', NR', O
n = 0-9,
m = 0-9
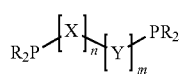
n = 1-5
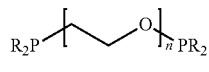
n = 1-9
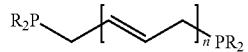
n = 4-9
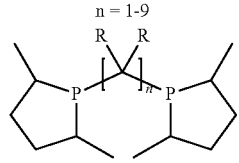
n = 4-9
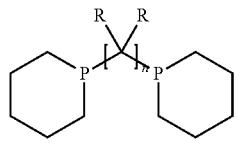
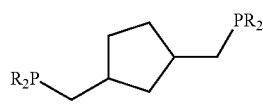
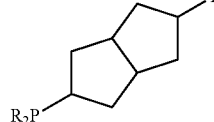
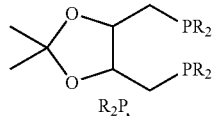
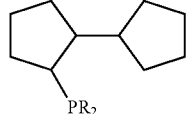
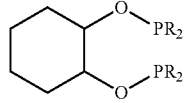
-continued
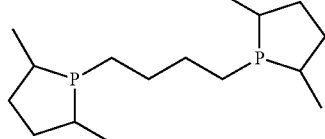
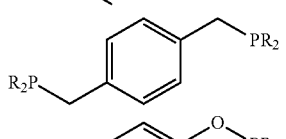
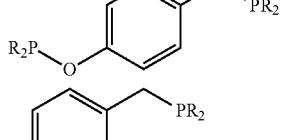
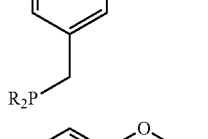
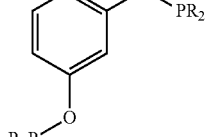
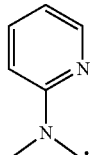
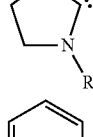
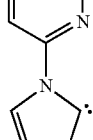
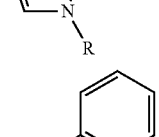
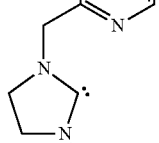
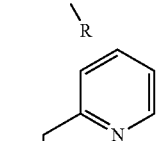
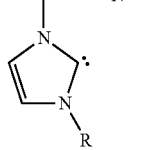

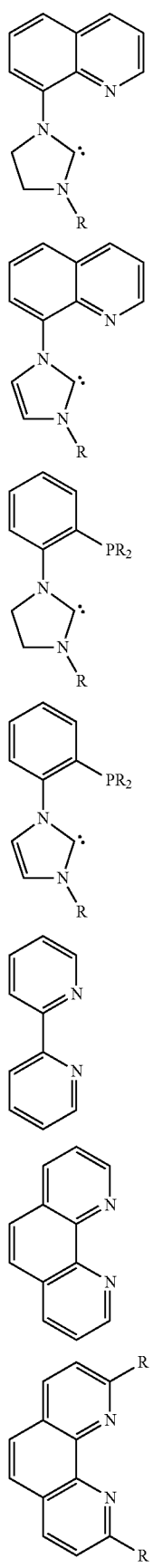
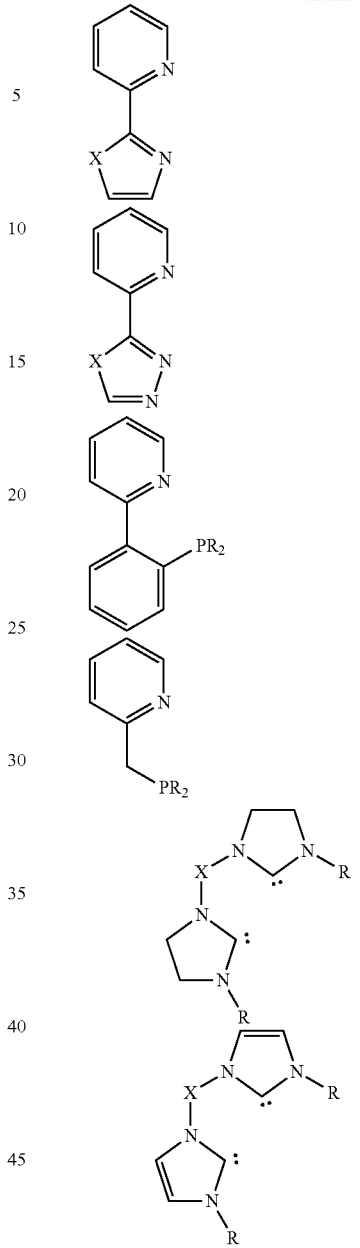

wherein each R is independently from another selected from the group consisting of H, OH, $NH_2$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue; and wherein the two dots ":" represent a bivalent carbene that may be coordinated with the Cu.

Example XI: Emitter Compound of Structure B

Exemplarily, the first emitter compound (a) and/or the second emitter compound (b) may be a Cu(I) complex having a structure according to the following formula B. Examples for respective complexes are also provided in WO 2013/007707 (cf., formulae I and A thereof) and in WO 2010/031485 (cf., exemplarily formulae II, IV and VI-IX thereof).

formula B

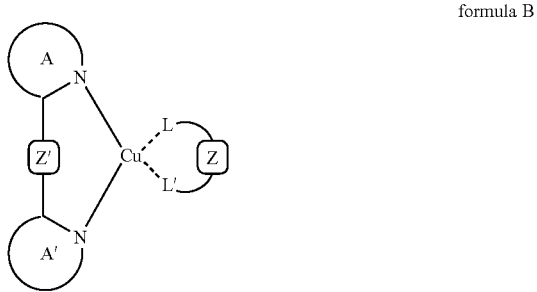

wherein the ligand comprising L, L' and Z (L^L') is a neutral, bidentate ligand that is bound to the Cu via non-ionic groups;
wherein the ligand comprising the cyclic moieties A and A' and the linking moiety Z' (N^N) may optionally be bound to the Cu via anionic moieties, wherein the ligand N^N may then neutralize the positive charge of the Cu(I);
wherein the cyclic moieties A and A' bear one of the following structures:

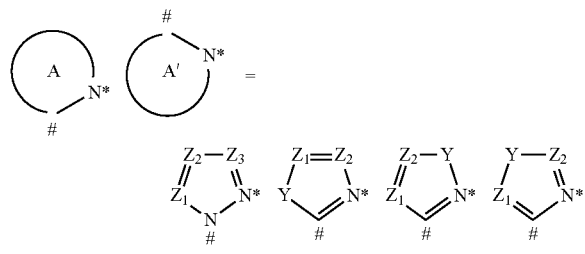

wherein $Z_1$, $Z_2$ and $Z_3$ are each independently from another nitrogen or CR,
wherein each R is independently selected from the group consisting of —H, -D, —F, —Cl, —Br, —I, —CN, —NO$_2$, —SO, —SO$_2$, =O, =S, —R$^a$—NR$^1$R$^2$, —NR$^1$R$^2$, —R$^a$—C(=O)R$^1$, —C(=O)R$^1$, —R$^a$—SiR$^1$R$^2$R$^3$, —SiR$^1$R$^2$R$^3$, —R$^a$—GeR$^1$R$^2$R$^3$, —GeR$^1$R$^2$R$^3$, —R$^a$—SeR$^1$R$^2$R$^3$, —SeR$^1$R$^2$R$^3$, —R$^a$—R$^1$C=CR$^2$R$^3$, R$^1$C=CR$^2$R$^3$, —R$^a$—C≡C—R$^1$, —C≡C—R$^1$, —R$^a$—C=O, —R$^a$—C=S, —R$^a$—C=Se, —R$^a$—C=NR$^1$, —C=O, —C=S, —C=Se, —C=NR$^1$, —R$^a$—C—N=R$^1$, —C—N=R$^1$, —R$^a$—POR$^1$R$^2$R$^3$, —R$^a$—N=R', —CO—NH—R$^1$, —R$^a$—CO—NH—R$^1$, —NH—CO—R$^1$, —R$^a$—NH—CO—R$^1$,
wherein R$^1$, R$^2$ and R$^3$ each independently from another are selected from the group consisting of H, D, F, I, Br, Cl, CN, an aliphatic hydrocarbon of 1 to 20 carbon atoms, an aromatic or heteroaromatic moiety of 5 to 30 atoms in the (hetero)aromatic ring, wherein one or more hydrogens may optionally be substituted by D, F, Cl, Br, I or CN,
wherein R$^4$ is selected from the group consisting of an aliphatic hydrocarbon of 1 to 20 carbon atoms, wherein one or more hydrogens may optionally be substituted by D, F, Cl, Br, I or CN and/or that may be substituted by on e or more aromatic or heteroaromatic rings.
wherein R$^a$ is selected from the group consisting of a substituted or unsubstituted C$_{1-9}$-alkylene residue, C$_{2-8}$-alkenylene residue, C$_{2-8}$-alkynylene residue or arylene moiety, —R$^{a'}$—NR$^{a'''}$—, —NR$^{a'''}$R$^{a'}$—, —R$^{a'}$—NR$^{a'''}$R$^{a''}$—, —R$^{a'}$—SiR$^{a'''}$R$^{a''''}$R$^{a''}$—, —R$^{a'}$—SiR$^{a''}$R$^{a''''}$—, —SiR$^{a'''}$R$^{a''''}$—R$^{a'}$—, —R$^{a'}$—R$^{a''}$—, —R$^{a'}$—O—R$^{a''}$—, —R$^{a'}$—CO—R$^{a''}$—, —R$^{a'}$—CO—O—R$^{a''}$—, —R$^{a'}$—O—CO—R$^{a''}$—, —R$^{a'}$—O—CO—R$^{a''}$—, —O—R$^{a''}$—, —R$^{a'}$—CS—R$^{a''}$—, —R$^{a'}$—CO—S—R$^{a''}$—, —R$^{a'}$—S—CO—R$^{a''}$—, —R$^{a'}$—CO—NH—R$^{a''}$—, —R$^{a'}$—NH—CO—R$^{a''}$—, —R$^{a'}$—O—, —R$^{a'}$—S—R$^{a''}$—, —S—R$^{a''}$—, —R$^{a'}$—S—, —R$^{a'}$—SO—R$^{a''}$—, —SO—R$^{a''}$—, —R$^{a'}$—SO—, —R$^{a'}$—SO$_2$—R$^{a''}$—, —SO$_2$—R$^{a''}$—, and —R$^{a'}$—SO$_2$—,
wherein R$^{a'}$ and R$^{a''}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups,
wherein the substituents may optionally form a cyclic or anellated structure with each other and/or with residue Z';
wherein R$^{a'''}$ and R$^{a''''}$ each independently from another are a residue of up to 20 carbon atoms selected from the group consisting of hydrogen, halogen, —R$^c$, —OC(O)R$^c$, —COOH, —OR$^c$, —NR$^c$R$^{c'}$, —SiR$^c$R$^{c'}$R$^{c''}$—SR$^c$, —SOR$^c$, —SO$_2$R$^c$ and other donor or acceptor groups such as exemplarily carboxylates and esters thereof, and CF$_3$— groups,
wherein R$^c$, R$^{c'}$ and R$^{c''}$ are each independently from another selected from the group consisting of H, OH, NH$_2$, NHR$^{a'''}$, NR$^{a'''}$R$^{a''''}$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue,
wherein two or more of the residues R$^c$, R$^{c'}$, R$^{c''}$, R$^{a'}$, R$^{a''}$, R$^{a'''}$, and R$^{a''''}$ may optionally also form anellated cyclic structures;
wherein two or more adjacent substituents may form a mono-, di-, tri- or polycyclic aliphatic, aromatic or heteroaromatic cyclic moiety; and
wherein Y is O, S or NR, wherein R is defined as above;
wherein Z' is BR$^1$R$^2$, wherein R$^1$ and R$^2$ are defined as above and B is a boron atom, in particular wherein Z' is selected from the group consisting of H$_2$B, BPh$_2$, B(CH$_3$)$_2$, and B(NR$^1$R$^2$)$_2$, wherein Ph is a phenyl residue,
wherein "*" indicates the atom complexed with the Cu and # indicates the atom binding to Z', the two dots ":" represent a bivalent carbene that is coordinated with the Cu, and wherein the carbene ligand is conjugated to Z via one of the binding sites indicated by #;
wherein L and L' may be defined as in the context of formula A above;
wherein Z may be defined as in the context of formula A above and/or is —R$^{ub}$— —R$^{ub}$—NR$^{ub''}$—, —NR$^{ub''}$—R$^{ub}$—, —R$^{ub}$—NR$^{ub''}$—R$^{ub'}$—, —R$^{ub}$—SiR$^{ub''}$R$^{ub'''}$—R$^{ub'}$—, —R$^{ub}$—SiR$^{ub''}$R$^{ub''''}$—, —SiR$^{ub''}$R$^{ub'''}$—R$^{ub}$—, —R$^{ub}$—O—R$^{ub'}$—, —R$^{ub}$—CO—R$^{ub'}$—, —R$^{ub}$—CO—O—R$^{ub'}$—, —R$^{ub}$—O—CO—O—R$^{ub'}$—, —R$^{ub}$—O—

CO—R$^{ub'}$—, —O—R$^{ub'}$—, —R$^{ub}$—CS—R$^{ub'}$—, —R$^{ub}$—CO—S—R$^{ub'}$—, —R$^{ub}$—S—CO—R$^{ub'}$—, —R$^{ub}$—CO—NH—R$^{ub'}$—, —R$^{ub}$—NH—CO—R$^{ub'}$—, —R$^{ub}$—O—, —R$^{ub}$—S—R$^{ub'}$—, —S—R$^{ub'}$—, —R$^{ub}$—S—, —R$^{ub}$—SO—R$^{ub'}$—, —SO—R$^{ub'}$—, —R$^{ub}$—SO—, —R$^{ub}$—SO$_2$—R$^{ub'}$—, —SO$_2$—R$^{ub'}$ or —R$^{ub}$—SO$_2$—, wherein R$^{ub}$ and R$^{ub'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups, wherein the substituents may optionally form a cyclic or anellated structure with each other and/or with residue Z;

wherein R$^{ub''}$ and R$^{ub'''}$ each independently from another are a residue of up to 20 carbon atoms selected from the group consisting of hydrogen, halogen, —R$^{t'''}$, —OC(O)R$^{t'''}$, —COOH, —OR$^{t'''}$, —NR$^{t'''}$R$^{t''''}$, —SiR$^{t'''}$R$^{t''''}$R$^{t'''''}$ —SR$^{t'''}$, —SOR$^{t'''}$, —SO$_2$R$^{t'''}$ and other donor or acceptor groups such as exemplarily carboxylates and esters thereof, and CF$_3$— groups, wherein R$^{t'''}$, R$^{t''''}$ and R$^{t'''''}$ are each independently from another selected from the group consisting of H, OH, NH$_2$, NHR$^{a'''}$, NR$^{a'''}$R$^{a''''}$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues R$^{t'''}$, R$^{t''''}$, R$^{t'''''}$, R$^{ub}$, R$^{ub'}$, R$^{ub''}$, and R$^{ub'''}$ may optionally also form anellated cyclic structures.

The following structures provide examples of the ligand N^N:

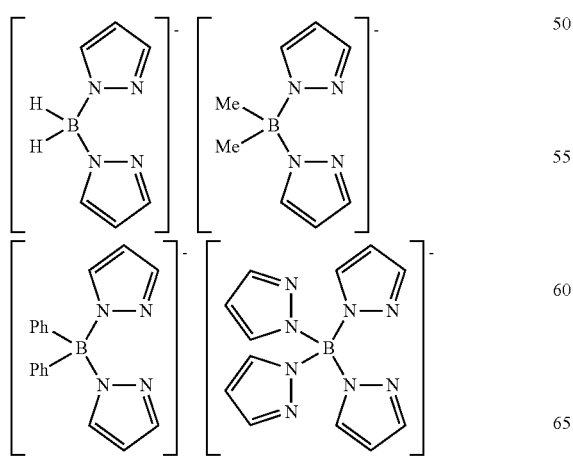

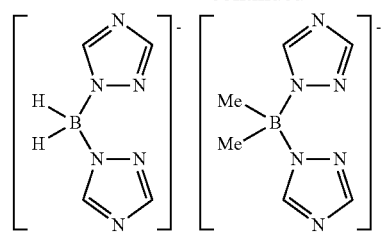

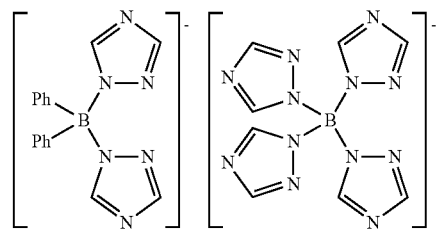

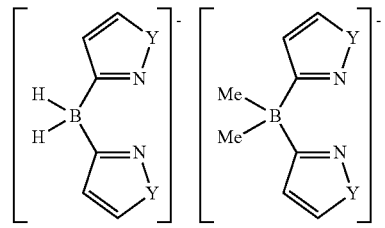

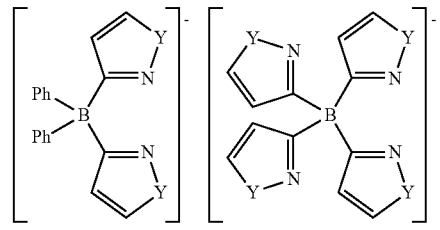

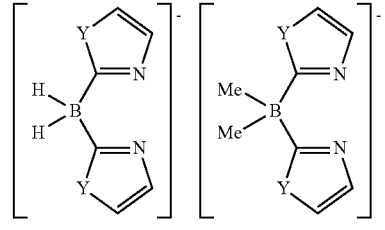

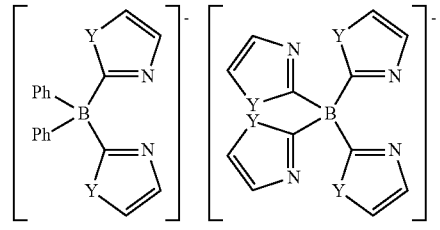

wherein Me is a methyl residue and Ph is a phenyl residue.

In a preferred embodiment, a Cu(I) complex of a structure of formula B may have one of the following structures:
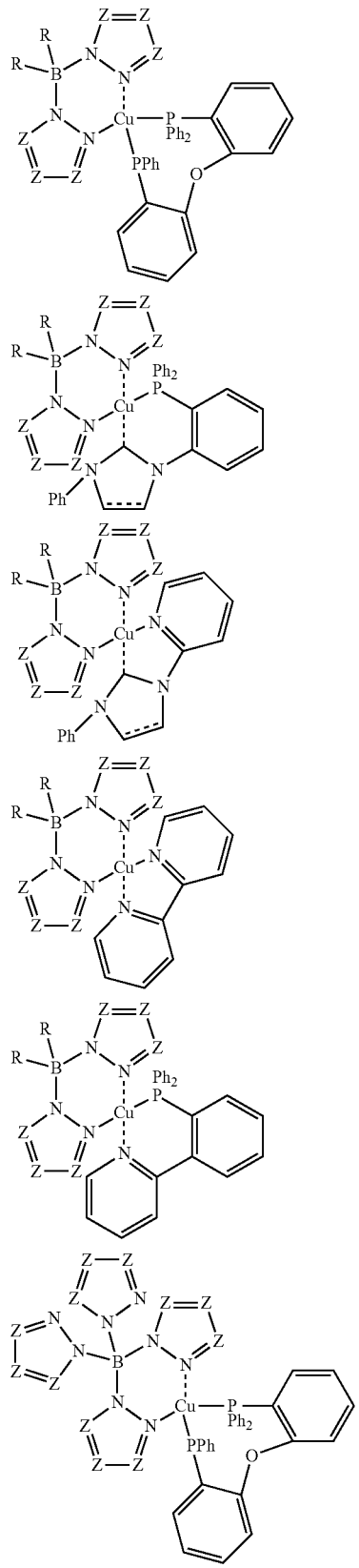
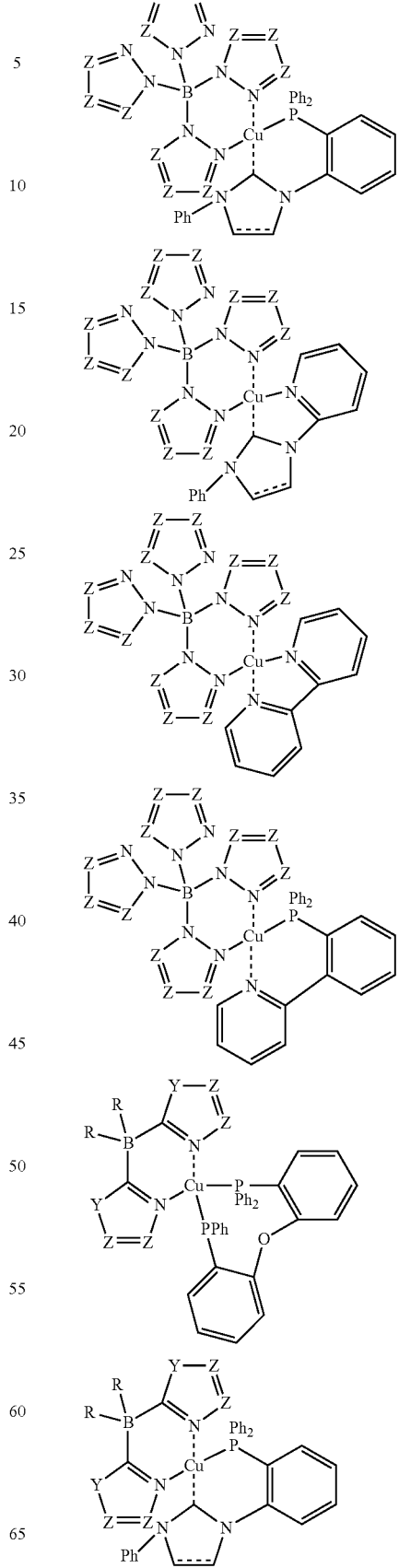

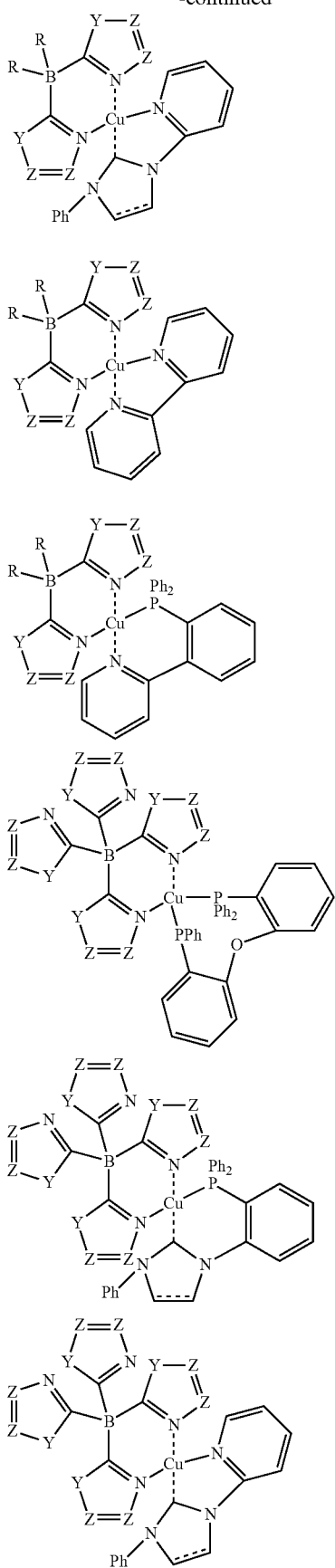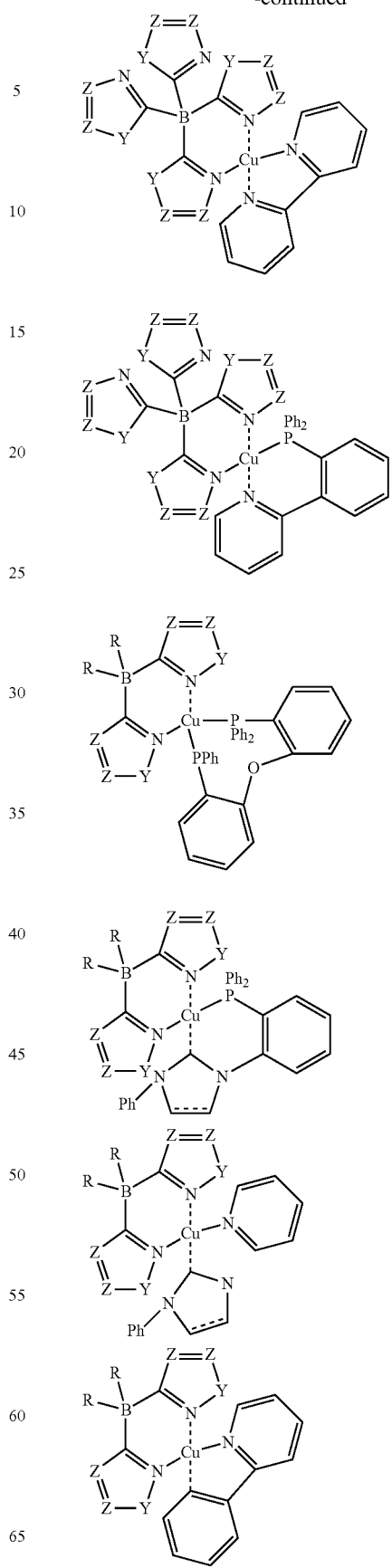

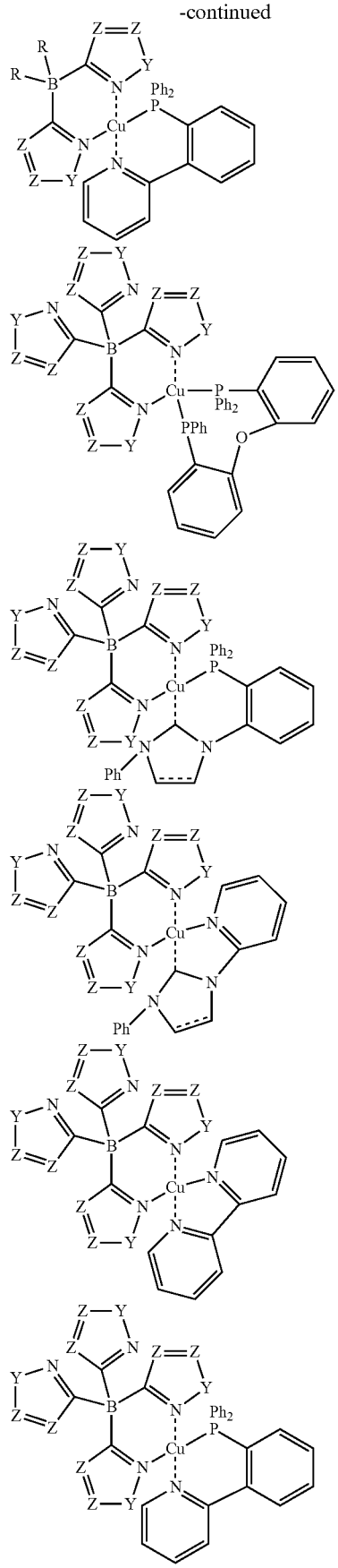
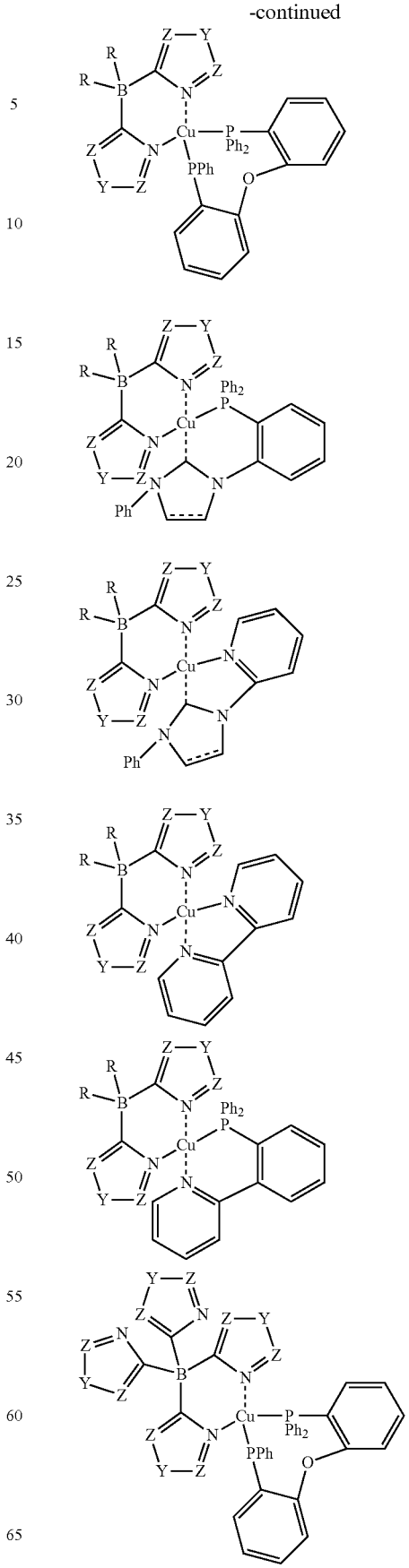

-continued

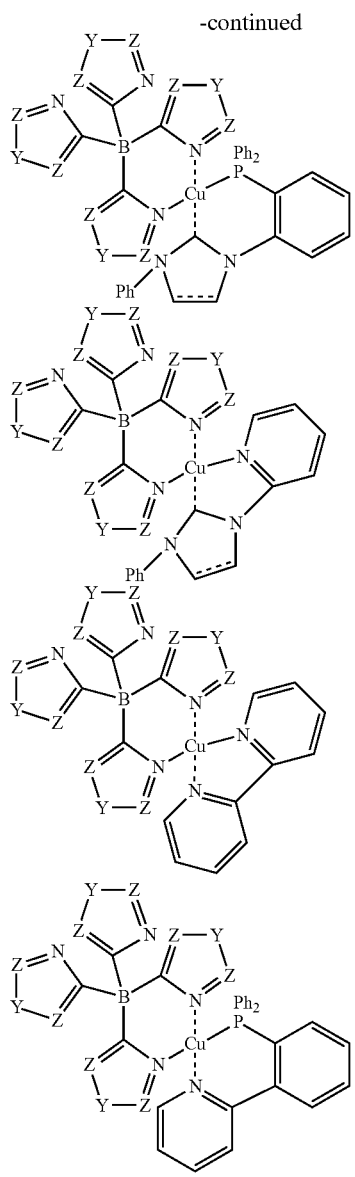

wherein each Z independently from another is selected from CR' und N;

wherein Y is selected from the groups consisting of S, O und NR'; and wherein each R' is independently selected from the group consisting of —H, -D, —F, —Cl, —Br, —I, —CN, —NO$_2$, —SO, —SO$_2$, =O, =S, —R$^a$—NR$^1$R$^2$, —NR$^1$R$^2$, —R$^a$—C(=O)R$^1$, —C(=O)R$^1$, —R$^a$—SiR$^1$R$^2$R$^3$, —SiR$^1$R$^2$R$^3$, —R$^a$—GeR$^1$R$^2$R$^3$, —GeR$^1$R$^2$R$^3$, —R$^a$—SeR$^1$R$^2$R$^3$, —SeR$^1$R$^2$R$^3$, —R$^a$—R$^1$C=CR$^2$R$^3$, R$^1$C=CR$^2$R$^3$, —R$^a$—C≡C—R$^1$, —C≡C—R$^1$, —R$^a$—C=O, —R$^a$—C=S, —R$^a$—C=Se, —R$^a$—C=NR$^1$, —C=O, —C=S, —C=Se, —C=NR$^1$, —R$^a$—C—N=R$^1$, —C—N=R$^1$, —R$^a$—POR$^1$R$^2$R$^3$, —R$^a$—N=R$^1$, —CO—NH—R$^1$, —R$^a$—CO—NH—R$^1$, —NH—CO—R$^1$, —R$^a$—NH—CO—R$^1$, wherein R$^1$, R$^2$, R$^3$ and R$^a$ are each independently from another defined as laid out in the context of a Cu(I) complex of a structure formula B as laid out above; and wherein each R is independently from another selected from the group consisting of H, methyl or phenyl.

Particularly preferred examples of Cu(I) complexes of a structure of formula B are selected from the group consisting of:

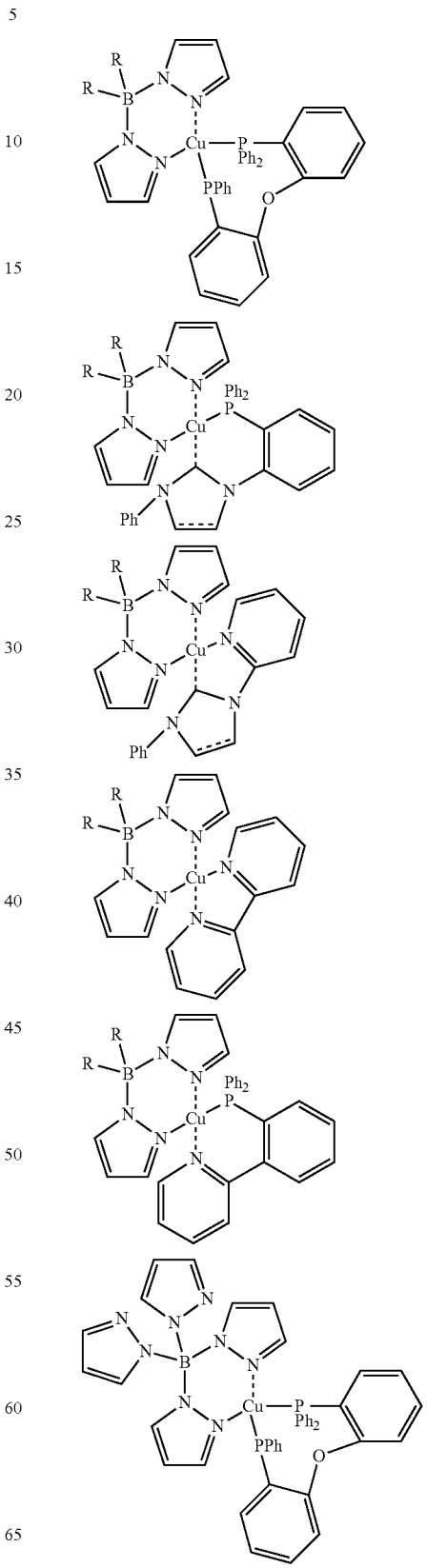

-continued
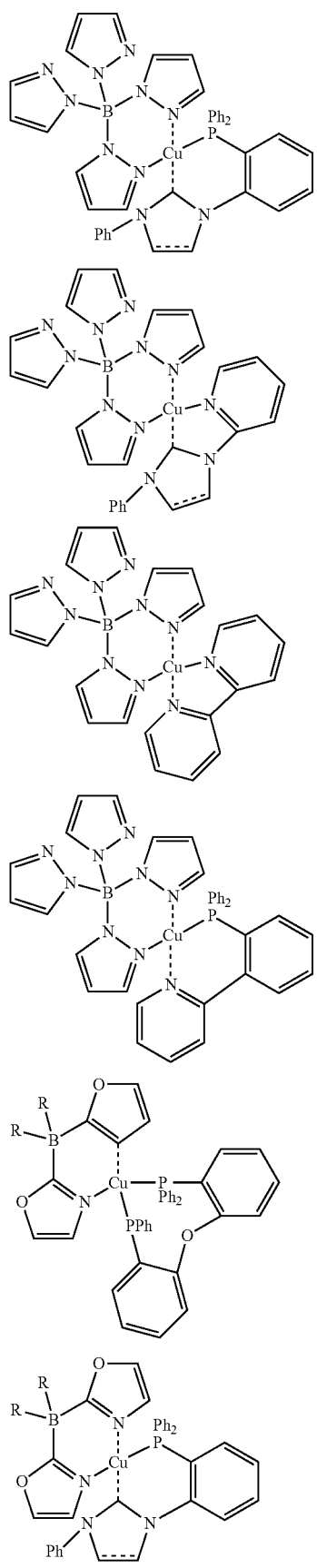
-continued
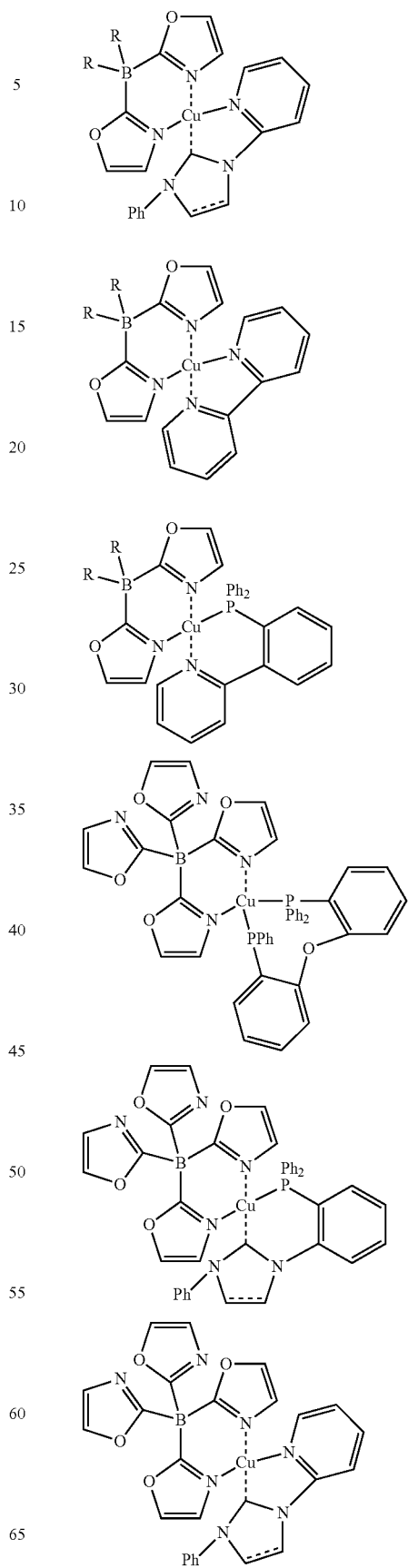

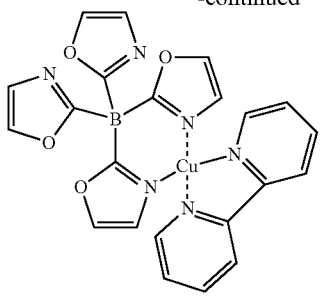
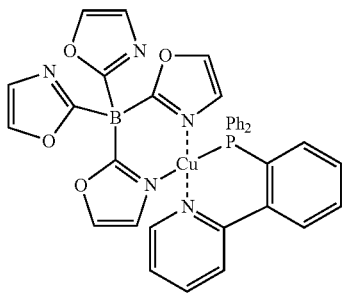
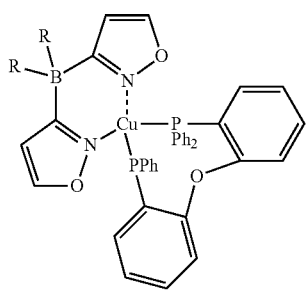
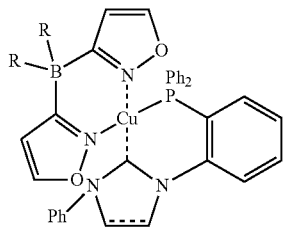
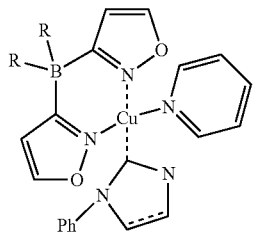
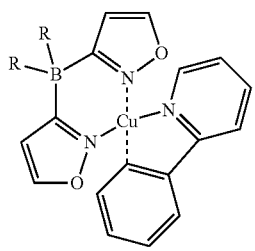
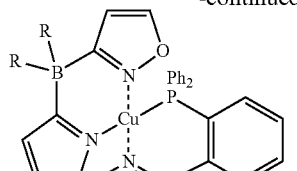
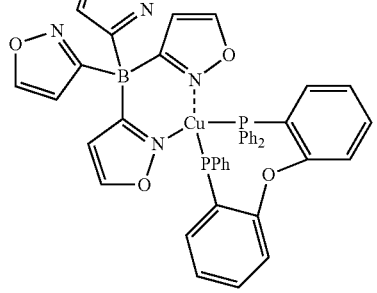
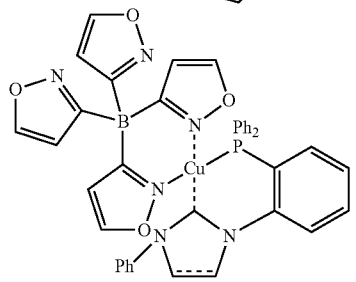
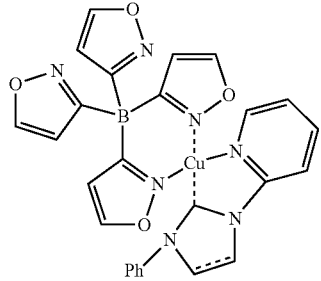
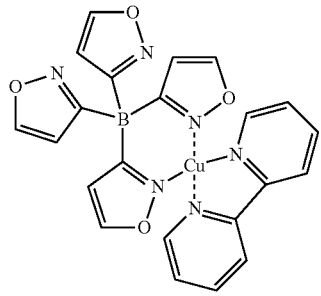
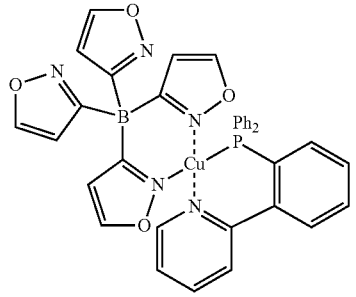

-continued

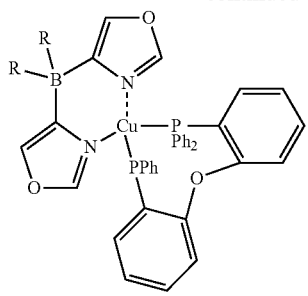
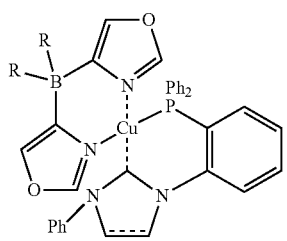
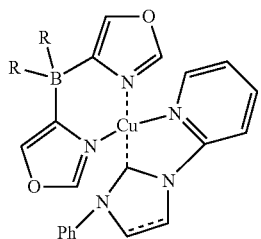
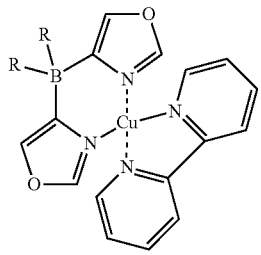
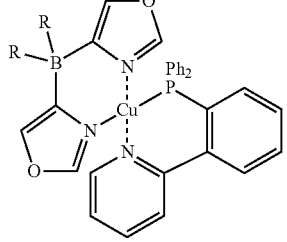
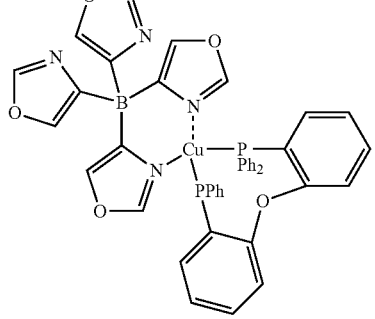

-continued

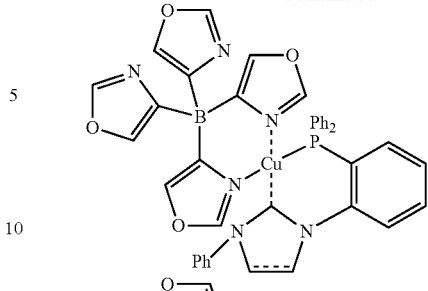
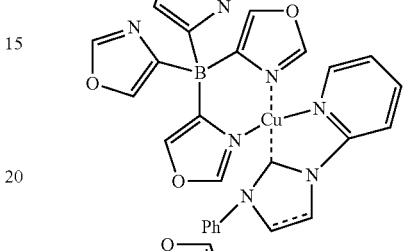
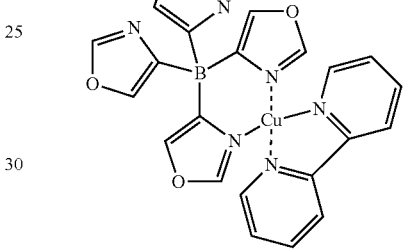
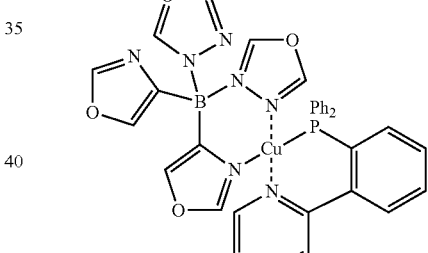
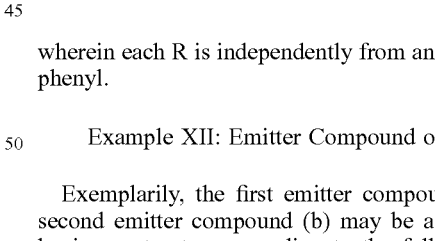

wherein each R is independently from another H, methyl or phenyl.

Example XII: Emitter Compound of Structure C

Exemplarily, the first emitter compound (a) and/or the second emitter compound (b) may be a metal(I) complex having a structure according to the following formula C. Examples for respective complexes are also provided in WO 2014/102079 (cf., exemplarily formulae A and I-IX thereof).

formula C

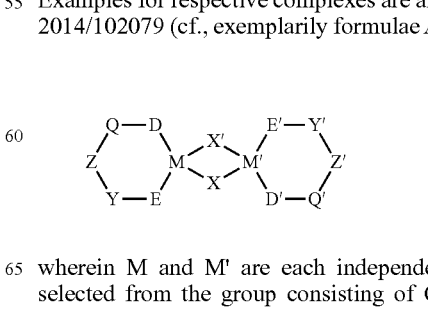

wherein M and M' are each independently from another selected from the group consisting of Cu, Ag and Au, in particular are both Cu;

wherein X and X' are both independently from another selected from the group consisting of Cl, Br, I, CN, OCN, SCN, alkinyl and $N_3$;

wherein the ligand comprising E, Y, Z, Q and D (E∩D) and the ligand comprising E', Y', Z', Q' and D' (E'∩D') are each a bidentate ligand, wherein E and E' each independently from another are RR'E* wherein E* is N, P, As or Sb, wherein N is or is not an imine nitrogen atom or a part of an N-heterocyclic ring, or E and E' each independently from another are RE* wherein E* is a divaltent carbene C*, O or S, wherein R and R' each independently from another are a residue of up to 20 carbon atoms selected from the group consisting of hydrogen, deuterium, halogen, —$R^1$, —OC(O)$R^1$, —COOH, —O$R^1$, —N$R^1R^{1'}$, —Si$R^1R^{1'}R^{1''}$ —S$R^1$, —SO$R^1$, —SO$_2R^1$ and other donor or acceptor groups such as exemplarily carboxylates and esters thereof, and $CF_3$— groups, wherein $R^1$, $R^{1'}$ and $R^{1''}$ are each independently from another selected from the group consisting of H, OH, $NH_2$, NH$R^x$, N$R^xR^y$ a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein $R^x$ and $R^y$ are each independently from another selected from the group consisting of a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^1$, $R^{1'}$, $R^{1''}$, R, and R' may optionally also form anellated cyclic structures, wherein D and D' each independently from another are R"R'"D* wherein D* is N, P, As or Sb, wherein N is or is not an imine nitrogen atom or a part of an N-heterocyclic ring, or D and D' each independently from another are R"D* wherein D* is a divaltent carbene C*, O or S, wherein R" and R'" each independently from another are a residue of up to 20 carbon atoms selected from the group consisting of hydrogen, deuterium, halogen, —$R^2$, —OC(O)$R^2$, —COOH, —O$R^2$, —N$R^2R^{2'}$, —Si$R^2R^{2'}R^{2''}$ —S$R^2$, —SO$R^2$, —SO$_2R^2$ and other donor or acceptor groups such as exemplarily carboxylates and esters thereof, and $CF_3$— groups, wherein $R^2$, $R^{2'}$ and $R^{2''}$ are each independently from another selected from the group consisting of H, OH, $NH_2$, NH$R^1$, N$R^1R^{1'}$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^2$, $R^{2'}$, $R^{2''}$, R", and R'" may optionally also form anellated cyclic structures, wherein D and E may be the same or different from another;

wherein Q, Y, Z, Q', Y' and Z' are each independently from another selected from the group consisting of a substituted or unsubstituted $C_{1-9}$-alkylene residue, $C_{2-8}$-alkenylene residue, $C_{2-8}$-alkinylene residue, arylene residue, —$R^a$—N$R^{a''}$—, —N$R^{a''}$—$R^a$—, —$R^a$—N$R^{a''}$—$R^{a'}$—, —$R^a$—SiR$^{a''}$ $R^{a'''}$—$R^a$—, —$R^a$—SiR$^{a''}R^{a'''}$, —SiR$^{a''}R^{a'''}$—$R^a$—, —$R^a$—O—$R^{a'}$—, —$R^a$—CO—$R^{a'}$—, —$R^a$—CO—O—$R^{a'}$—, —$R^a$—O—CO—$R^{a'}$—, —$R^a$—O—CO—O—$R^{a'}$—, —O—$R^{a'}$—, —$R^a$—CS—$R^{a'}$—, —$R^a$—CO—S—$R^{a'}$—, —$R^a$—S—CO—$R^{a'}$—, —$R^a$—CO—NH—$R^{a'}$—, —$R^a$—NH—CO—$R^{a'}$—, —$R^a$—O—, —$R^a$—S—$R^{a'}$—, —S—$R^{a'}$—, —$R^a$—S—, —$R^a$—SO—$R^{a'}$—, —SO—$R^{a'}$—, —$R^a$—SO—, —$R^a$—SO$_2$—$R^{a'}$—, —SO$_2$—$R^{a'}$—, and —$R^a$—SO$_2$—, wherein $R^a$ and $R^{a'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and $CF_3$— groups, wherein the substituents may optionally form a cyclic or anellated structure with each other;

wherein $R^{a''}$ and $R^{a'''}$ each independently from another are a residue of up to 20 carbon atoms selected from the group consisting of hydrogen, halogen, -deuterium, $R^c$, —OC(O)$R^c$, —COOH, —O$R^c$, —N$R^cR^{c'}$, —Si$R^cR^{c'}R^{c''}$ —S$R^c$, —SO$R^c$, —SO$_2R^c$ and other donor or acceptor groups such as exemplarily carboxylates and esters thereof, and $CF_3$— groups, wherein $R^c$, $R^{c'}$ and $R^{c''}$ are each independently from another selected from the group consisting of H, OH, $NH_2$, NH$R^1$, N$R^1R^{1'}$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^c$, $R^{c'}$, $R^{c''}$, $R^a$, $R^{a'}$, $R^{a''}$, and $R^{a'''}$ may optionally also form anellated cyclic structures.

Optionally, both bidentate ligands E∩D and E'∩D' may also conjugated with another via a linker (e.g., a $C_{1-10}$-alkylene moiety) resulting in a tetravalent ligand.

Optionally, an improvement of the metal complex may be achieved in that at least one of the ligands E∩D and E'∩D' bears a suitable substituent.

In a preferred embodiment, a metal(I) complex according to formula C may have one of the following structures:

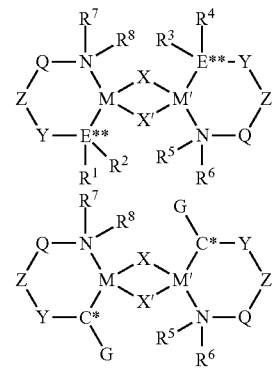

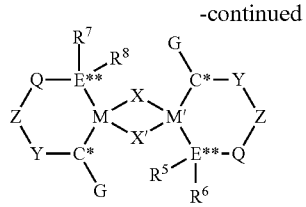

wherein X and X' are both independently from another selected from the group consisting of Cl, Br, I, CN, OCN, SCN, alkinyl and $N_3$;

wherein M and M' are each independently from another selected from the group consisting of Cu, Ag and Au, preferably Cu and Ag, in particular are both Cu;

wherein each E** is selected from the group consisting of P, As and Sb;

wherein C* is a divalent carbene;

wherein each Q, Y and Z each independently from another are defined as laid out in the context of a structure of formula C above;

wherein each of G, $R^1$, $R^2$, $R^3$, $R^4$, $R^5$, $R^6$, $R^7$ and $R^8$ each independently from another are a residue of up to 20 carbon atoms selected from the group consisting of hydrogen, halogen, deuterium, $R^c$, —OC(O)$R^c$, —COOH, —O$R^c$, —N$R^c R^{c'}$, —Si$R^c R^{c'} R^{c''}$, —S$R^c$, —SO$R^c$, —SO$_2 R^c$ and other donor or acceptor groups such as exemplarily carboxylates and esters thereof, and $CF_3$— groups, wherein $R^c$, $R^{c'}$ and $R^{c''}$ are each independently from another defined as laid out in the context of a structure of formula C above; and Herein, preferably the parts of the structure consisting of Y—C*-G may be independently from another selected from the group consisting of

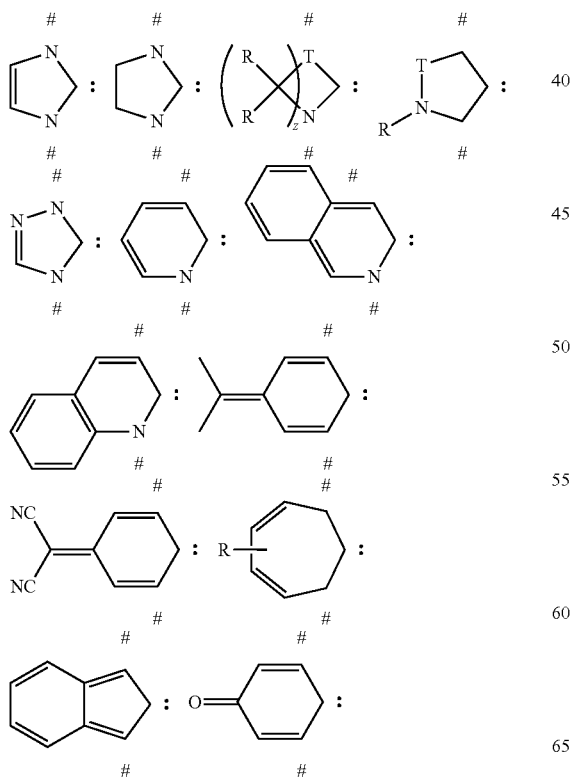

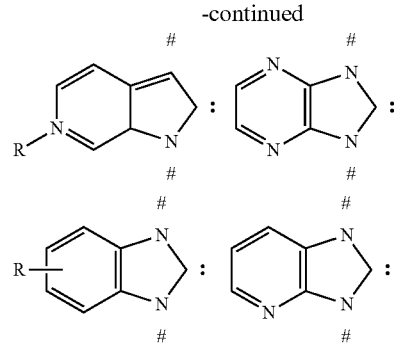

wherein the two dots ":" represent a bivalent carbene that may be coordinated with the metal (e.g., Cu);

wherein # represents the binding sites to Y and Z, respectively, wherein T is selected from the group consisting of CRR', NR and SR; and wherein R may be defined as laid out in the context of a structure of formula C above; and wherein z represent an integer of 1, 2, 3 or 4.

In a more preferred embodiment, a metal(I) complex according to formula C may have one of the following structures:

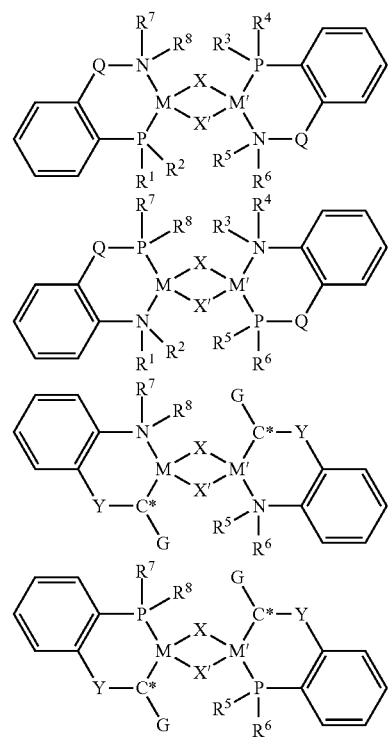

wherein X, X', M, M', C*, G, $R^1$, $R^2$, $R^3$, $R^4$, $R^5$, $R^6$, $R^7$, $R^8$, Q, Y and Z are each independently from another are defined as laid out in the context of a structure of formula C above.

Highly preferably, a metal(I) complex of formula is a Cu(I) complex, in particular a Cu(I) complex having one of the following structures:

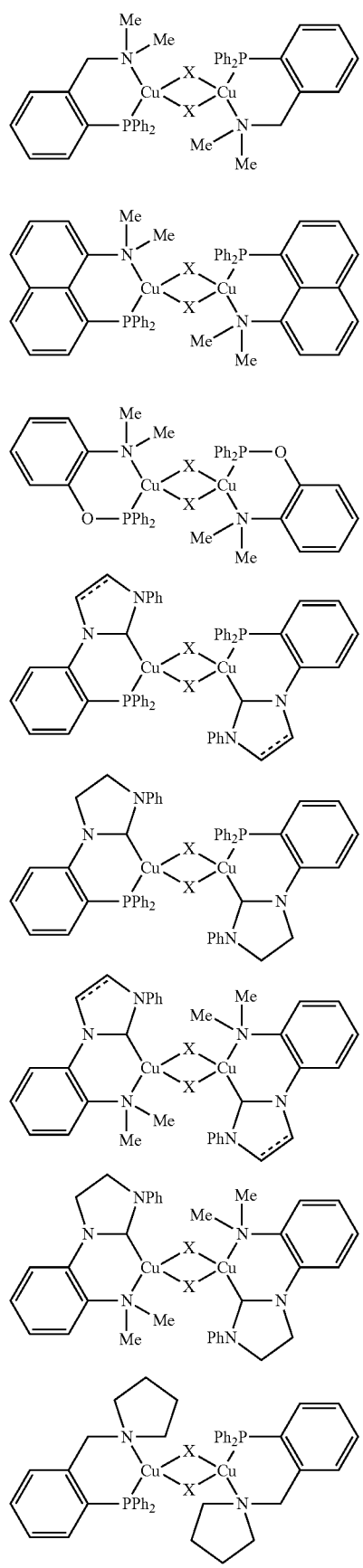
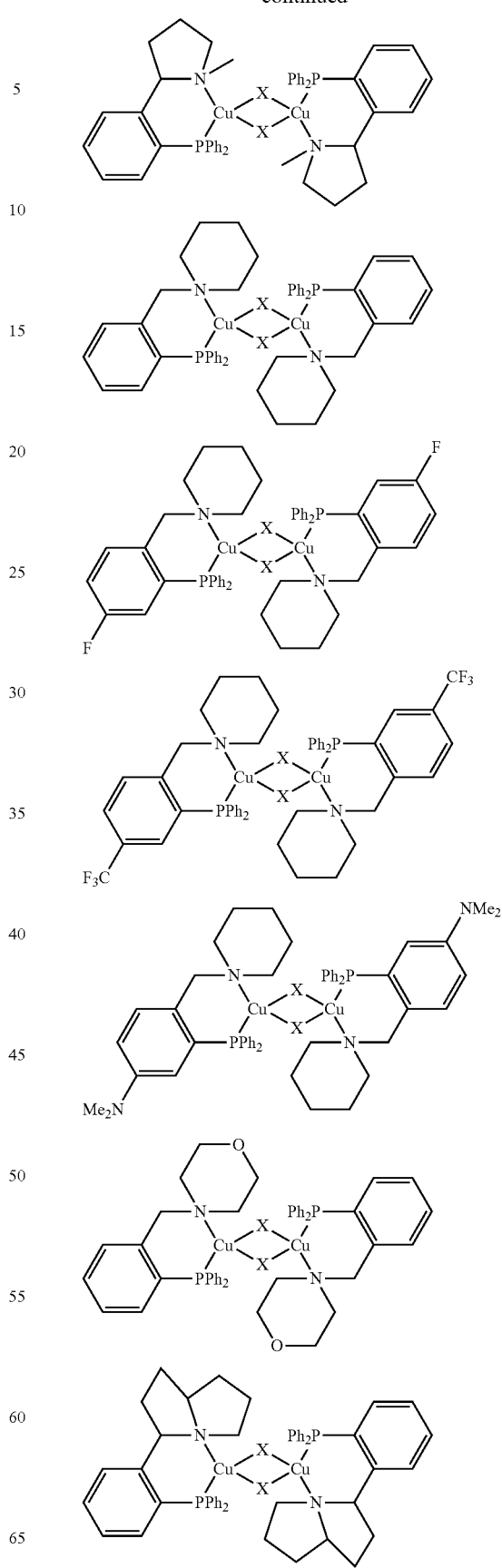

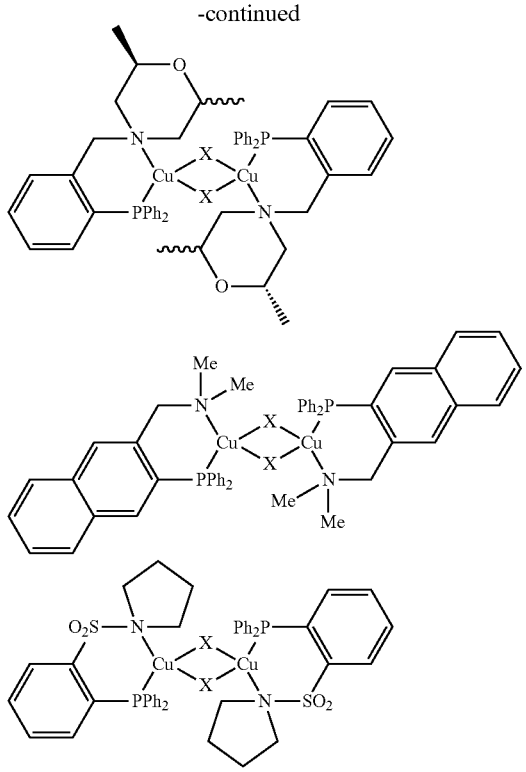

wherein each X is independently from another selected from Cl, Br and I, in particular wherein both X are each I; and wherein Me in methyl and Ph is phenyl.

Example XIII: Emitter Compound of Structure D

Exemplarily, the first emitter compound (a) and/or the second emitter compound (b) may be a metal(I) complex having a structure according to the following formula D. Examples for respective complexes are also provided in European patent application No. 14164815.

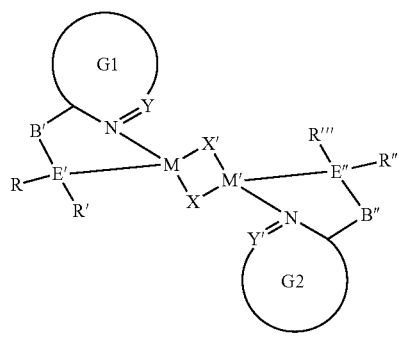

formula D wherein G1 and G2 are cyclic organic structures comprising not more than 20, preferably not more than 10 carbon atoms each;
wherein M and M' are each independently from another selected from the group consisting of Cu, Ag and Au, in particular are both Cu;
wherein X and X' are both independently from another selected from the group consisting of Cl, Br, I, CN, OCN, SCN, alkinyl and $N_3$, in particular are each a halogenide, in particular a halogenide selected from Cl, Br, and I, or are a pseudohalogenide,
wherein E' and E" are each independently from another selected from the group consisting of P, As and Sb;
wherein R, R', R" and R''' are each independently from another selected from the group consisting of optionally substituted alkyl, aryl, heteroaryl and alkoxy residues of up to 20 carbon atoms;
wherein N is nitrogen;
wherein Y and Y' of the cyclic systems G1 and G2 are each independently from another selected from the group consisting of a substituted or unsubstituted $C_{1-9}$-alkylene residue, $C_{2-8}$-alkenylene residue, $C_{2-8}$-alkinylene residue, arylene residue, $-R^a-NR^{a''}-$, $-NR^{a''}-R^a-$, $-R^a-NR^{a''}-R^{a'}-$, $-R^a-SiR^{a''}R^{a'''}-R^{a'}-$, $-R^a-SiR^{a''}R^{a'''}-$, $-SiR^{a''}R^{a'''}-R^a-$, $-R^a-O-R^{a'}-$, $-R^a-CO-R^{a'}-$, $-R^a-CO-O-R^{a'}-$, $-R^a-O-CO-O-R^{a'}-$, $-R^a-O-CO-R^{a'}-$, $-O-R^{a'}-$, $-R^a-CS-R^{a'}-$, $-R^a-CO-S-R^{a'}-$, $-R-S-CO-R^{a'}-$, $-R^a-CO-NH-R^{a'}-$, $-R^a-NH-CO-R^{a'}-$, $-R^a-O-$, $-R^a-S-R^{a'}-$, $-S-R^{a'}-$, $-R^a-S-$, $-R^a-SO-R^{a'}-$, $-SO-R^{a'}-$, $-R^a-SO-$, $-R^a-SO_2-R^{a'}-$, $-SO_2-R^{a'}-$, and $-R^a-SO_2-$,
wherein $R^a$ and $R^{a'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and $CF_3-$ groups, wherein the substituents may optionally form a cyclic or anellated structure with each other;
wherein $R^{a''}$ and $R^{a'''}$ each independently from another are a residue of up to 20 carbon atoms selected from the group consisting of hydrogen, halogen, deuterium, $-R^c$, $-OC(O)R^c$, $-COOH$, $-OR^c$, $-NR^cR^{c'}$, $-SiR^cR^{c'}R^{c''}$, $-SR^c$, $-SOR^c$, $-SO_2R^c$ and other donor or acceptor groups such as exemplarily carboxylates and esters thereof, and $CF_3-$ groups,
wherein $R^c$, $R^{c'}$ and $R^{c''}$ are each independently from another selected from the group consisting of H, OH, $NH_2$, $NHR^x$, $NR^xR^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein $R^x$ and $R^y$ are each independently from another selected from the group consisting of a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein two or more of the residues $R^c$, $R^{c'}$, $R^{c''}$, $R^a$, $R^{a'}$, $R^{a''}$, and $R^{a'''}$ may optionally also form anellated cyclic structures, wherein B and B' are each independently from another a linker of a chain length of at least 2 and not more than 17 atoms,
wherein the moieties thereof may be $CH_2$—, —$CHR^1$—, —$CR^1R^2$—, —$SiR^1R^2$—, —$GeR^1R^2$—, —O—, —S—, —Se—, —$NR^1$—, —$PR^1$—, and/or —$AsR^1$—,
wherein $R^1$ and $R^2$ are each independently from another a residue selected from the group consisting of an alkyl moiety, aryl moiety, heteroaryl moiety, —$OR^3$, —$SR^3$, —$SeR^3$ of each up to 20 carbon atoms, —H and -D,
wherein $R^3$ is an alkyl moiety, aryl moiety, heteroaryl moiety, —$OR^3$, —$SR^3$, —$SeR^3$ of each up to 20 carbon atoms, —H and -D.

Preferably, the cyclic systems G1 and G2 each comprise five or six ring atoms in a heteroaromatic cycle which may optionally be substituted with further residues such as R, R'; R", R''', $R^{a''}$ and/or $R^{a'''}$ or anellated with further aromatic cyclic structures.

In a preferred embodiment, a metal(I) complex of a structure of formula D is a Cu(I) complex, in particular a Cu(I) complex having one of the following structures:

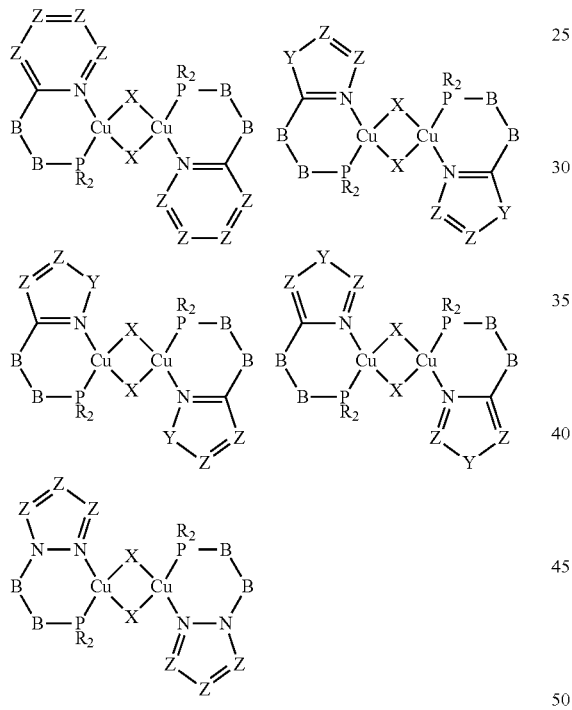

wherein each B is independently from another defined as in the context of a structure of formula D;
wherein X is selected from the group consisting of Cl, Br, I, CN, OCN, SCN, alkinyl and $N_3$, in particular are each a halogenide, in particular a halogenide selected from Cl, Br, and I, or are a pseudohalogenide,
wherein each Y is independently from another selected from the group consisting of $NR^{a''}$, O and S;
wherein each Z is independently from another selected from the group consisting of $CR^{a''}$ and N;
wherein each R and $R^{a''}$ is independently from another defined as laid out in the context of $R^{a''}$ relating to a structure of formula D above.

In a particularly preferred embodiment, a metal(I) compound of a structure of formula D is a Cu(I) complex selected from one of the following structures:

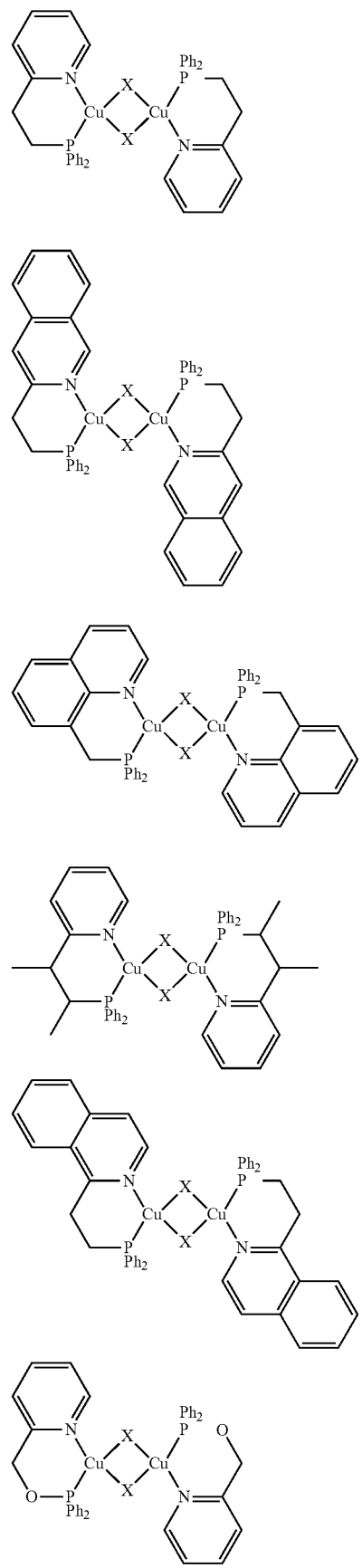

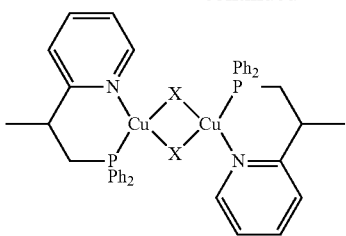

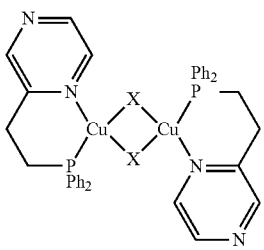

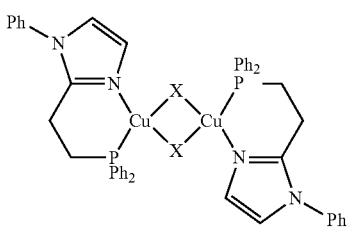

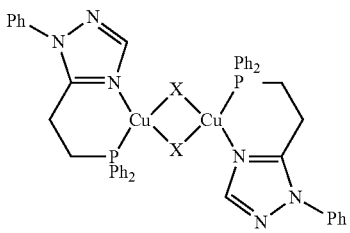

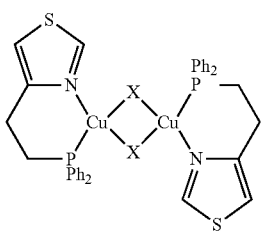

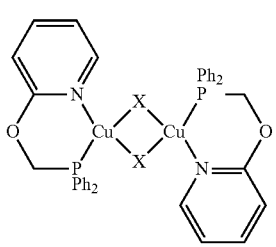

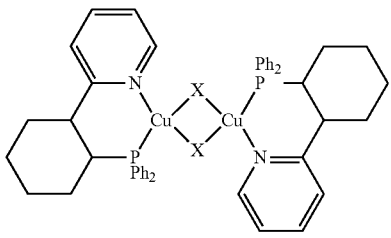

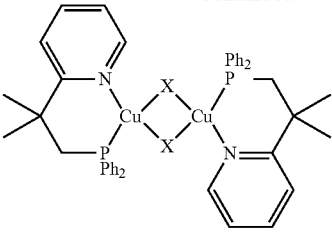

wherein each X is independently from another selected from Cl, Br and I, in particular wherein both X are each I.

Example XIV: Emitter Compound of Structure E

Exemplarily, the first emitter compound (a) and/or the second emitter compound (b) may be a metal(I) complex having a structure according to the following formula E. Examples for respective complexes are also provided in WO 2013/014066 (cf., exemplarily formula IV thereof).

formula E

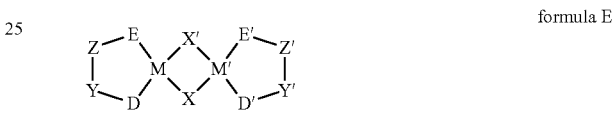

wherein M and M' are each independently from another selected from the group consisting of Cu, Ag and Au, in particular are both Cu;

wherein X and X' are each independently selected from the group consisting of Cl, Br, I, CN, OCN, SCN, $C_{1-10}$-alkinyl and $N_3$;

wherein the ligand comprising E, Y, Z, and D (E∩D) and the ligand comprising E', Y', Z', and D' (E'∩D') are each a bidentate ligand, wherein E and E' each independently from another are RR'E* wherein E* is N, P, As or Sb, wherein N is or is not an imine nitrogen atom or a part of an N-heterocyclic ring, or E and E' each independently from another are RE* wherein E* is a divaltent carbene C*, O or S, wherein R and R' each independently from another are a residue of up to 20 carbon atoms selected from the group consisting of hydrogen, deuterium, halogen, —$R^1$, —OC(O)$R^1$, —COOH, —O$R^1$, —N$R^1R^{1'}$, —Si$R^1R^{1'}R^{1'''}$ —S$R^1$, —SO$R^1$, —SO$_2R^1$ and other donor or acceptor groups such as exemplarily carboxylates and esters thereof, and $CF_3$— groups, wherein $R^1$, $R^{1'}$ and $R^{1'''}$ are each independently from another selected from the group consisting of H, OH, $NH_2$, $NHR^x$, $NR^xR^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein $R^x$ and $R^y$ are each independently from another selected from the group consisting of a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^1$, $R^{1'}$, $R^{1''}$, R, and R' may optionally also form anellated cyclic structures, wherein D and D' each independently from another are R''R'''D* wherein D* is N, P, As or Sb, wherein N is or is not an imine nitrogen atom or a part of an N-heterocyclic ring, or D and D' each independently from another are R''D* wherein D* is a divalent carbene C*, O or S, wherein R'' and R''' each independently from another are selected from the group consisting of hydrogen, deuterium, halogen, —$R^2$, —OC(O)$R^2$, —COOH, —O$R^2$, —N$R^2R^{2'}$, —Si$R^2R^{2'}R^{2''}$ —S$R^2$, —SO$R^2$, —SO$_2R^2$ and other donor or acceptor groups such as exemplarily carboxylates and esters thereof, and CF$_3$— groups, wherein $R^2$, $R^{2'}$ and $R^{2''}$ are each independently from another selected from the group consisting of H, OH, NH$_2$, NHR$^x$, NR$^x$R$^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^2$, $R^{2'}$, $R^{2''}$, R'', and R''' may optionally also form anellated cyclic structures, wherein D and E may be the same or different from another; wherein Y, Z, Y' and Z' are each independently from another selected from the group consisting of a substituted or unsubstituted $C_{1-9}$-alkylene residue, $C_{2-8}$-alkenylene residue, $C_{2-8}$-alkinylene residue, arylene residue, —$R^a$—N$R^{a''}$—, —N$R^{a''}$—$R^a$—, —$R^a$—N$R^{a''}$—$R^{a'}$—, —$R^a$—Si$R^{a''}R^{a'''}$—$R^{a'}$—, —$R^a$—Si$R^{a''}R^{a'''}$—, —Si$R^{a''}R^{a'''}$—$R^a$—, —$R^a$—O—$R^{a'}$—, —$R^a$—CO—$R^{a'}$—, —$R^a$—CO—O—$R^{a'}$—, —$R^a$—O—CO—O—$R^{a'}$—, —$R^a$—O—CO—$R^{a'}$—, —O—$R^{a'}$—, —$R^a$—CS—$R^{a'}$—, —$R^a$—CO—S—$R^{a'}$—, —$R^a$—S—CO—$R^{a'}$—, —$R^a$—CO—NH—$R^{a'}$—, —$R^a$—NH—CO—$R^{a'}$, —$R^a$—CO—NR$^x$—$R^{a'}$—, —$R^a$—NR$^x$—CO—$R^{a'}$—, —$R^a$—O—, —$R^a$—S—$R^{a'}$—, —S—$R^{a'}$—, —$R^a$—S—, —$R^a$—SO—$R^{a'}$—, —SO—$R^{a'}$—, —$R^a$—SO—, —$R^a$—SO$_2$—$R^{a'}$—, —SO$_2$—$R^{a'}$—, and —$R^a$—SO$_2$—, wherein $R^a$ and $R^{a'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups, wherein the substituents may optionally form a cyclic or anellated structure with each other;

wherein $R^{a''}$ and $R^{a'''}$ each independently from another are a residue of up to 20 carbon atoms selected from the group consisting of hydrogen, deuterium, halogen, —$R^c$, —OC(O) $R^c$, —COOH, —O$R^c$, —NR$^c$R$^{c'}$, —SiR$^c$R$^{c'}$R$^{c''}$ —S$R^c$, —SO$R^c$, —SO$_2$R$^c$ and other donor or acceptor groups such as exemplarily carboxylates and esters thereof, and CF$_3$— groups, wherein $R^c$, $R^{c'}$ and $R^{c''}$ are each independently from another selected from the group consisting of H, OH, NH$_2$, NHR$^x$, NR$^x$R$^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^c$, $R^{c'}$, $R^{c''}$, $R^a$, $R^{a'}$, $R^{a''}$, and $R^{a'''}$ may optionally also form anellated cyclic structures.

Optionally, both bidentate ligands E∩D and E'∩D' may also conjugated with another via a linker (e.g., a $C_{1-10}$-alkylene moiety) resulting in a tetravalent ligand.

Optionally, an improvement of the metal complex may be achieved in that at least one of the ligands E∩D and E'∩D' bears a suitable substituent.

In a preferred embodiment, a metal(I) complex of a structure of formula E is a Cu(I) complex, in particular a Cu(I) complex having the following structure:

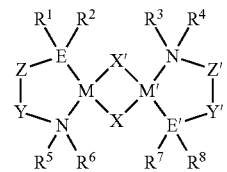

wherein Z, Z', Y, Y', E, E', M, M', X and X' are defined as in the context of a structure of formula E above, preferably wherein E and E' are each independently from another selected from the group consisting of O, As and Sb; and wherein $R^1$, $R^2$, $R^{2'}$, $R^3$, $R^4$, $R^5$, $R^6$, $R^7$ and $R^8$ each independently from another are a residue of up to 20 carbon atoms, preferably a residue selected from the group consisting of hydrogen, deuterium, halogen, —$R^c$, —OC(O)$R^c$, —COOH, —O$R^c$, —NR$^c$R$^{c'}$, —SiR$^c$R$^{c'}$R$^{c''}$—S$R^c$, —SO$R^c$, —SO$_2$R$^c$ and other donor or acceptor groups such as exemplarily carboxylates and esters thereof, and CF$_3$— groups, wherein $R^c$, $R^{c'}$ and $R^{c''}$ are each independently from another selected from the group consisting of H, OH, NH$_2$, NHR$^x$, NR$^x$R$^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue.

In a more preferred embodiment, a metal(I) complex of a structure of formula E is a Cu(I) complex having the following structure:

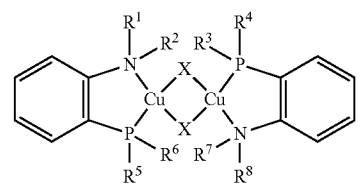

wherein each X is independently from another selected from Cl, Br and I, in particular wherein both X are each I; and wherein $R^1$, $R^2$, $R^{2'}$, $R^3$, $R^4$, $R^5$, $R^6$, $R^7$ and $R^8$ each independently from another are a residue of up to 20 carbon atoms, preferably a residue selected from the group consisting of hydrogen, deuterium, halogen, —$R^c$, —OC(O)$R^c$, —COOH, —OR$^c$, —NR$^c$R$^{c'}$, —SiR$^c$R$^{c'}$R$^{c''}$—SR$^c$, —SOR$^c$, —SO$_2$R$^c$ and other donor or acceptor groups such as exemplarily carboxylates and esters thereof, and CF$_3$— groups, wherein R$^c$, R$^{c'}$ and R$^{c''}$ are each independently from another selected from the group consisting of H, OH, NH$_2$, NHR$^x$, NR$^x$R$^y$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue.

In a particularly preferred embodiment, a metal(I) complex of a structure of formula E is a Cu(I) complex having one the following structures:

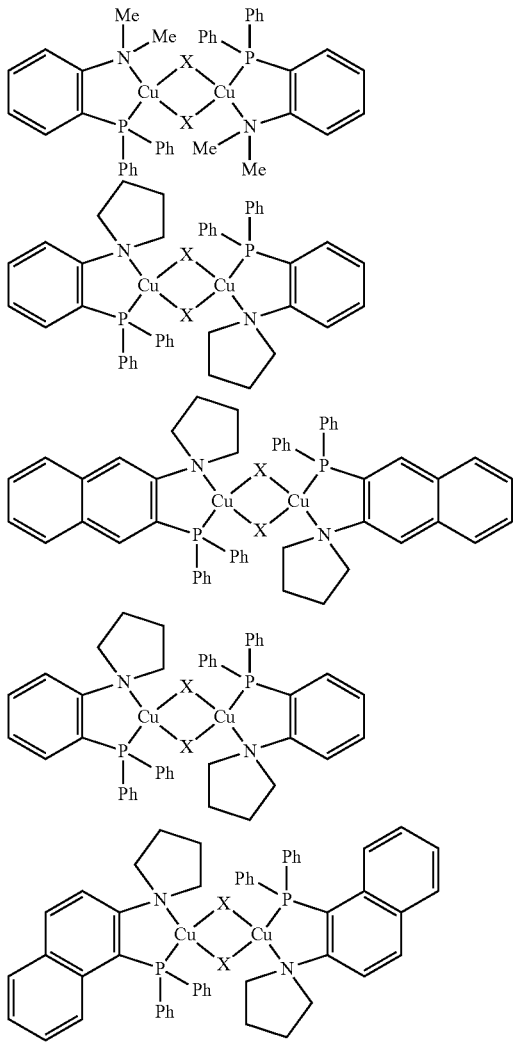

wherein each X is independently from another selected from Cl, Br and I, in particular wherein both X are each I.

Example XV: Emitter Compound of Structure F

Exemplarily, the first emitter compound (a) and/or the second emitter compound (b) may be a Cu(I) complex having a structure according to the following formula F. Examples for respective complexes are also provided in WO 2013/017675 (cf., exemplarily formula A thereof).

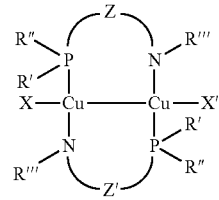

Formel F wherein X and X' are each independently selected from the group consisting of Cl, Br, I, CN, OCN, SCN, C$_{1-10}$-alkinyl and N$_3$;

wherein P is phosphor and N is nitrogen;

wherein Z and Z' are each independently from another a covalent linkage comprising at least two carbon and/or nitrogen atoms, wherein the ligand comprising P, Z and N (P∩N) and the ligand comprising P, Z' and N (P∩N') are each a phosphane ligand substituted by an N-heterocycle bearing a structure according to formula G:

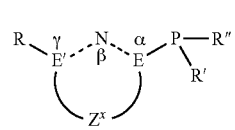

formula G wherein P is phosphor and N is nitrogen;

wherein E is a carbon or nitrogen atom;

wherein E' is a carbon or nitrogen atom that is not bound to hydrogen;

wherein the dashed line represents a single or double bond;

wherein R is an optionally substituted, optionally branched C$_{1-20}$-alkyl residue, preferably a C$_{6-20}$-alkyl residue, or an optionally alkylated C$_{6-20}$-aryl residue, in particular phenyl, wherein a substitution herein is a substitution with one or more halogens (e.g., F, Cl, Br and/or I), silane groups, ether groups or optionally substituted alkyl, alkenyl and/or alkinyl residues.

wherein R' and R" are each independently from another selected from the group consisting of alkyl residues, in particular C$_{6-20}$-alkyl residues that may also be branched or cyclic, and aryl or heteroaryl residues that may optionally be substituted with alkyl residues, halogens (e.g., F, Cl, Br and/or I), silane groups or ether groups, wherein R' and R" may be each directly bound to the phosphor atom of the phosphane ligand;

wherein R''' is selected from the group consisting of alkyl residues, in particular C$_{6-20}$-alkyl residues that may also be branched or cyclic, and aryl or heteroaryl residues that may optionally be substituted with alkyl residues, halogens (e.g., F, Cl, Br and/or I), silane groups or ether groups, wherein R''' may form an aliphatic or aromatic heterocyclic structure together with Z;

wherein Z, Z' and Z$^x$ are each independently from another selected from the group consisting of substituted or unsubstituted linear, branched or cyclic C$_{1-9}$-alkylene, C$_{2-8}$-alkenylene or C$_{2-8}$-alkinylene residue, an arylene residue, —R$^a$—NR$^{a''}$—, —NR$^{a''}$—R$^a$—, —R$^a$—NR$^{a''}$—R$^{a'}$—, —R$^a$—SiR$^{a''}$R$^{a'''}$—R$^{a'}$—, —R$^a$—SiR$^{a''}$R$^{a'''}$—, —SiR$^{a''}$R$^{a'''}$—R$^a$—, —R$^a$—O—R$^{a'}$—, —R$^a$—CO—R$^{a'}$—, —R$^a$—CO—O—R$^{a'}$—, —R$^a$—O—CO—O—R$^{a'}$—, —R$^a$—O—CO—R$^{a'}$—, —O—R$^{a'}$—, —R$^a$—CS—R$^{a'}$—, —R$^a$—CO—S—R$^{a'}$—, —R$^a$—S—CO—R$^{a'}$—, —R$^a$—CO—NH—R$^{a'}$—, —R$^a$—NH—CO—R$^{a'}$—, —R$^a$—CO—NR$^{a''}$—R$^{a'}$—, —R$^a$—NR$^{a''}$—CO—R$^{a'}$—, —R$^a$—O—, —R$^a$—S—R$^{a'}$—, —S—R$^{a'}$—, —R$^a$—S—, —R$^a$—SO—R$^{a'}$—, —SO—R$^{a'}$—, —R$^a$—SO—, —R$^a$—SO$_2$—R$^{a'}$—, —SO$_2$—R$^{a'}$, and —R$^a$—SO$_2$—, wherein R$^a$ and R$^{a'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and CF$_3$— groups, wherein the substituents may optionally form a cyclic or anellated structure with each other;

wherein R$^{a''}$ and R$^{a'''}$ each independently from another are a residue of up to 20 carbon atoms selected from the group consisting of hydrogen, deuterium, halogen, —R$^c$, —OC(O)R$^c$, —COOH, —OR$^c$, —NR$^c$R$^{c'}$, —SiR$^c$R$^{c'}$R$^{c''}$ —SR$^c$, —SOR$^c$, —SO$_2$R$^c$ and other donor or acceptor groups such as exemplarily carboxylates and esters thereof, and CF$_3$— groups, wherein R$^c$, R$^{c'}$ and R$^{c''}$ are each independently from another selected from the group consisting of H, OH, NH$_2$, NHR$^x$, NR$^x$R$^y$, a halogen, a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein R$^x$ and R$^y$ are each independently from another selected from the group consisting of a substituted or unsubstituted linear, branched or cyclic C$_{1-20}$-alkyl residue, C$_{1-20}$-heteroalkyl residue, C$_{2-20}$-alkenyl residue, C$_{1-10}$-heteroalkenyl residue and a substituted or unsubstituted C$_{6-20}$-aryl residue, C$_{5-20}$-heteroaryl residue, C$_{7-32}$-arylalkyl residue, C$_{6-31}$-heteroarylalkyl residue, C$_{8-33}$-alkylarylalkyl residue, and a C$_{7-32}$-heteroalkylarylalkyl residue, wherein two or more of the residues R$^c$, R$^{c'}$, R$^{c''}$, R$^a$, R$^{a'}$, R$^{a''}$, and R$^{a'''}$ may optionally also form anellated cyclic structures.

In a preferred embodiment, a Cu(I) complex of a structure of formula F has one the following structures:

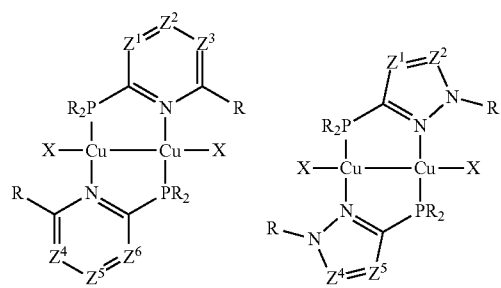

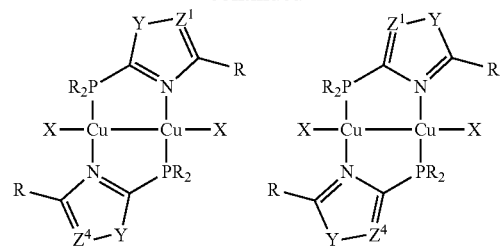

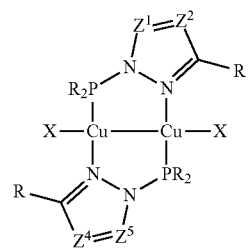

wherein each of Z$^1$, Z$^2$, Z$^3$, Z$^4$, Z$^5$ and Z$^6$ is independently from another CR or N;

wherein each Y is independently from another selected from the group consisting of O, S und NR;

wherein each R is independently from another defined as laid out in the context of a structure of formula F above; and wherein each X is selected from the group consisting of Cl, Br, I, CN, OCN, SCN, C$_{1-10}$-alkinyl and N$_3$.

In a particularly preferred embodiment, a Cu(I) complex of a structure of formula F has one the following structures:

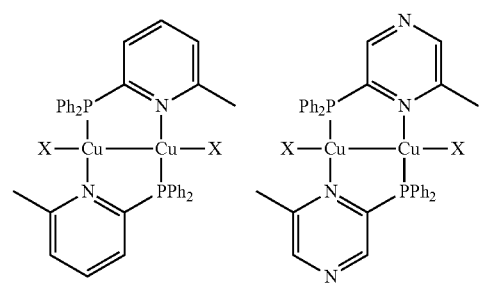

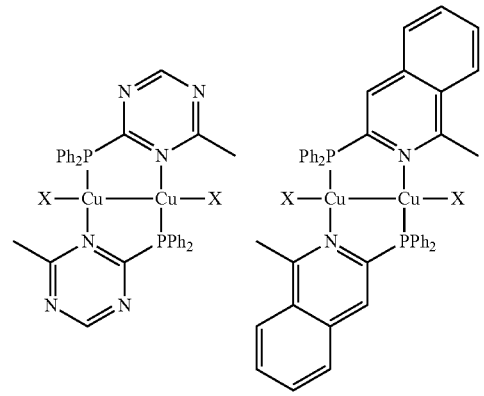

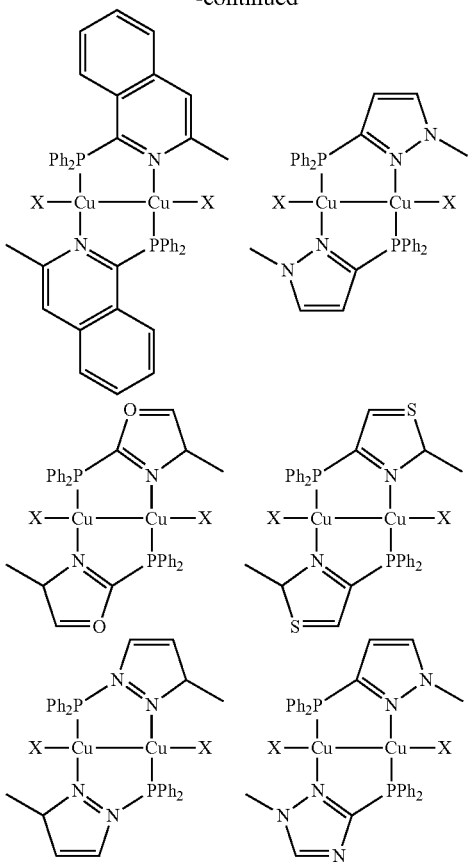

wherein each X is independently from another selected from Cl, Br and I, in particular wherein both X are each I; and Example XVI: Emitter Compound of Structure H Exemplarily, the first emitter compound (a) and/or the second emitter compound (b) may be a Cu(I) complex having a structure according to the following formula H. Examples for respective complexes are also provided in WO 2013/072508 (cf., exemplarily formula A thereof), WO 2010/149748 (cf., exemplarily formula A thereof) and WO 2013/001086 ((cf., exemplarily formula A thereof).

formula H

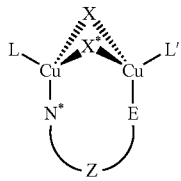

wherein X and X* are each independently selected from the group consisting of Cl, Br, I, CN, OCN, SCN, $C_{1-10}$-alkinyl and $N_3$;
wherein N* is a nitrogen that binds to the Cu;
wherein E is RR'E*, wherein E* is N, P, As or Sb, wherein N is or is not an imine nitrogen atom or a part of an N-heterocyclic ring, or E is RE* wherein E* is a divalent carbene C*, O or S,
wherein R and R' each independently from another are a residue of up to 20 carbon atoms selected from the group consisting of hydrogen, deuterium, halogen, —$R^1$, —OC(O)$R^1$, —COOH, —O$R^1$, —N$R^1R^{1'}$, —SiR$^1R^{1'}R^{1''}$ —S$R^1$, —SO$R^1$, —SO$_2R^1$ and other donor or acceptor groups such as exemplarily carboxylates and esters thereof, and CF$_3$— groups,
wherein $R^1$, $R^{1'}$ and $R^{1''}$ are each independently from another selected from the group consisting of H, OH, NH$_2$, NHR$^x$, NR$^x$R$^y$ a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein R$^x$ and R$^y$ are each independently from another selected from the group consisting of a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue,
wherein two or more of the residues $R^1$, $R^{1'}$, $R^{1''}$, R, and R' may optionally also form anellated cyclic structures,
wherein E is E*RR', wherein E* represents N, P, As or Sb, wherein N may or may not represent an imine nitrogen atom or part of an N-heteroaromatic ring, or wherein E is RE*, wherein E* represents divalent carbene C*, O or S,
wherein R and R' each independently from another are selected from the group consisting of hydrogen, halogen, deuterium, —$R^1$, —OC(O)$R^1$, —COOH, —O$R^1$, —N$R^1R^{1'}$, —SiR$^1R^{1'}R^{1''}$ —S$R^1$, —SO$R^1$, —SO$_2R^1$ and further donor and acceptor moieties such as, e.g., carboxylates and esters thereof and CF$_3$ residues,
wherein $R^1$, $R^{1'}$ und $R^{1''}$ are each independently from another selected from the group consisting of H, OH, NH$_2$, NHR$^x$, NR$^x$R$^y$, a halogen, a substituted or unsubstituted, linear, branched or cyclic $C_{1-20}$-alkyl, $C_{1-20}$-heteroalkyl, $C_{2-20}$-alkenyl or $C_{1-10}$-heteroalkenyl residue, and a substituted or unsubstituted $C_{6-20}$-aryl, $C_{5-20}$-heteroaryl, $C_{7-32}$-arylalkyl, $C_{6-31}$-heteroarylalkyl or $C_{8-33}$-alkylarylalkyl residue and a $C_{7-32}$-heteroalkylarylalkyl residue,
wherein R$^x$ and R$^y$ are each independently from another selected from the group consisting of a substituted or unsubstituted, linear, branched or cyclic $C_{1-20}$-alkyl, $C_{1-20}$-heteroalkyl, $C_{2-20}$-alkenyl or $C_{1-10}$-heteroalkenyl residue, and a substituted or unsubstituted $C_{6-20}$-aryl, $C_{5-20}$-heteroaryl, $C_{7-32}$-arylalkyl, $C_{6-31}$-heteroarylalkyl or $C_{8-33}$-alkylarylalkyl residue and a $C_{7-32}$-heteroalkylarylalkyl residue,
wherein the residues $R^1$, $R^{1'}$, $R^{1''}$ und R und R' may optionally form anellated cyclic structures;
wherein Z is a covalently bound linker comprising at least two carbon and/or nitrogen atoms or may be missing;
wherein the ligands L and L' are each independently from another an organic ligand comprising 1 to 20 carbon atoms, preferably comprising one or more of the moieties selected from the group consisting of OC(O)R$^c$, —COOH, —OR$^c$, —NR$^c$R$^{c'}$, —SiR$^c$R$^{c'}$R$^{c''}$ —SR$^c$, —SOR$^c$, —SO$_2$R$^c$ and further donor or acceptor groups such as exemplarily carboxylates and esters thereof, CF$_3$— groups, and moieties comprising phosphor, arsenic or antimony,
wherein R$^c$, R$^{c'}$ and R$^{c''}$ are each independently from another selected from the group consisting of H, OH, NH$_2$, NHR$^{a''}$, NR$^{a''}$R$^{a'''}$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$- heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^c$, $R^{c'}$, $R^{c''}$, $R^d$, $R^{d'}$, $R^{d''}$, and $R^{d'''}$ may optionally also form anellated cyclic structures, wherein L and L' may also be conjugated with another and may be defined as above in the context of formula A and/or may be defined as below in the context of formula K, wherein the ligand comprising N*, Z and E (E∩N*) may be a bidentate ligand having a structure according to formula K:

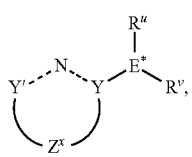

formula K wherein Y is a carbon or nitrogen atom;
wherein Y' is a carbon or nitrogen atom that is conjugated to a hydrogen atom;
wherein E* is selected from the group consisting of P, N, As, Sb, a divalent carbene C*, O and S;
wherein the dashed line represents a single or double bond;
wherein N is nitrogen comprised in an imine moiety that forms part of a heteroaromatic moiety comprising N, Y, Y' and $Z^x$,
wherein the heteroaromatic moiety is preferably selected from the group consisting of pyridyl, pyrimidyl, pyridazinyl, triazinyl, oxazolyl, thiazolyl, imidazolyl, that may optionally also be substituted (e.g. with one or more of the aforementioned) and/or may be anellated with another moiety of the complex;
wherein $R^u$ and $R^v$ are each independently from another selected from the group consisting of alkyl residues, in particular $C_{6-20}$-alkyl residues that may also be branched or cyclic, and aryl or heteroaryl residues that may optionally be substituted with alkyl residues, halogens (e.g., F, Cl, Br and/or I), silane groups or ether groups;
wherein Z and $Z^x$ are each independently from another selected from the group consisting of a substituted or unsubstituted $C_{1-9}$-alkylene, $C_{2-8}$-alkenylene, $C_{2-8}$-alkinylene or arylene residue, —$R^a$—$NR^{a''}$—, —$NR^{a''}$—$R^a$—, —$R^a$—$NR^{a''}$—$R^{a'}$—, —$R^a$—$SR^{a''}R^{a'''}$—$R^{a'}$—, —$R^a$—$SiR^{a''}$ $R^{a'''}$—, —$SiR^{a''}R^{a'''}$—$R^a$—, —$R^a$—O—$R^{a'}$—, —$R^a$—CO—$R^{a'}$—, —$R^a$—CO—O—$R^{a'}$—, —$R^a$—O—CO—O—$R^{a'}$—, —$R^a$—O—CO—$R^{a'}$—, —O—$R^{a'}$—, —$R^a$—CS—$R^{a'}$—, —$R^a$—CO—S—$R^{a'}$—, —$R^a$—S—CO—$R^{a'}$—, —$R^a$—CO—NH—$R^{a'}$—, —$R^a$—NH—CO—$R^{a'}$—, —$R^a$—O—, —$R^a$—S—$R^{a'}$—, —S—$R^{a'}$—, —$R^a$—S—, —$R^a$—SO—$R^{a'}$—, —SO—$R^{a'}$—, —$R^a$—SO—, —$R^a$—$SO_2$—$R^{a'}$—, —$SO_2$—$R^{a'}$— and —$R^a$—$SO_2$—,
wherein $R^a$ and $R^{a'}$ each independently from another are each a residue of up to 20 carbon atoms selected from the group consisting of a linear, branched or cyclic alkylene residue, a linear, branched or cyclic heteroalkylene residue, an arylene residue, a heteroarylene residue, a linear, branched or cyclic alkenylene residue, and a linear, branched or cyclic alkinylene residue, that may be each optionally substituted with one or more substituents selected from the group consisting of halogens, deuterium, linear, branched or cyclic alkyl residues, linear, branched or cyclic heteroalkyl residues, aryl residues, heteroaryl residues, linear, branched or cyclic alkenyl residues, linear, branched or cyclic alkinyl residues, and other donor or acceptor groups such as exemplarily amines, phosphines, carboxylates and esters thereof, and $CF_3$— groups, wherein the substituents may optionally form a cyclic or anellated structure with each other;

wherein $R^{a''}$ and $R^{a'''}$ each independently from another are a residue of up to 20 carbon atoms selected from the group consisting of hydrogen, deuterium, halogen, —$R^c$, —OC(O) $R^c$, —COOH, —$OR^c$, —$NR^cR^{c'}$, —$SiR^cR^{c'}R^{c''}$ —$SR^c$, —$SOR^c$, —$SO_2R^c$ and other donor or acceptor groups such as exemplarily carboxylates and esters thereof, and $CF_3$— groups, wherein $R^c$, $R^{c'}$ and $R^{c''}$ are each independently from another selected from the group consisting of H, OH, $NH_2$, $NHR^x$, $NR^xR^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein $R^x$ and $R^y$ are each independently from another selected from the group consisting of a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein two or more of the residues $R^c$, $R^{c'}$, $R^{c''}$, $R^a$, $R^{a'}$, $R^{a''}$, and $R^{a'''}$ may optionally also form anellated cyclic structures.

Preferably, the heteroaromatic moiety comprises N, Y, Y' and $Z^x$ is selected from the group consisting of pyridyl, pyrimidyl, pyridazinyl, triazinyl, oxazolyl, thiazolyl, imidazolyl, that may optionally also be substituted and/or anellated with another moiety of the complex.

Preferably, the ligands L and L' according to formula H are monodentate ligands of up to 42 carbon atoms.

Preferably, E is selected from the group consisting of P, As, and Sb.

In a preferred embodiment, a Cu(I) complex of a structure of formula H has one the following structures:

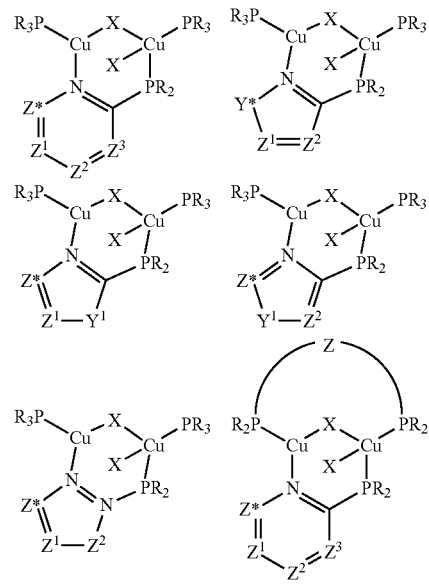

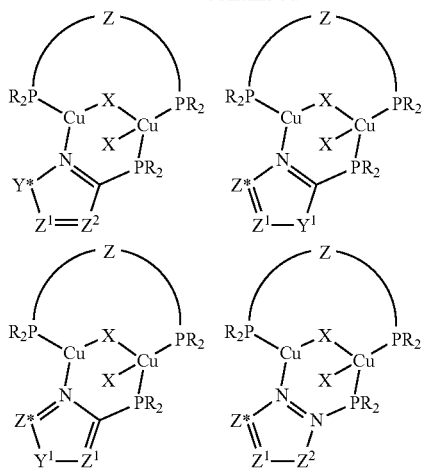

wherein each X is selected from the group consisting of Cl, Br, I, CN, OCN, SCN, $C_{1-10}$-alkinyl and $N_3$;

wherein $Y^1$ is selected from the group consisting of O, S und NR;

wherein Y* is O or S;

wherein each of $Z^1$, $Z^2$ and $Z^3$ is independently from another CR or N;

wherein Z* is CH or N;

wherein each R is independently from another selected from the group consisting of H, OH, $NH_2$, $NHR^x$, $NR^xR^y$, a halogen, a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue, wherein $R^x$ and $R^y$ are each independently from another selected from the group consisting of a substituted or unsubstituted linear, branched or cyclic $C_{1-20}$-alkyl residue, $C_{1-20}$-heteroalkyl residue, $C_{2-20}$-alkenyl residue, $C_{1-10}$-heteroalkenyl residue and a substituted or unsubstituted $C_{6-20}$-aryl residue, $C_{5-20}$-heteroaryl residue, $C_{7-32}$-arylalkyl residue, $C_{6-31}$-heteroarylalkyl residue, $C_{8-33}$-alkylarylalkyl residue, and a $C_{7-32}$-heteroalkylarylalkyl residue; and wherein Z is defined as in the context of a structure of formula H above.

Particularly preferably, herein a ligand comprising $R_2P$—Z—$PR_2$ has the following structure:

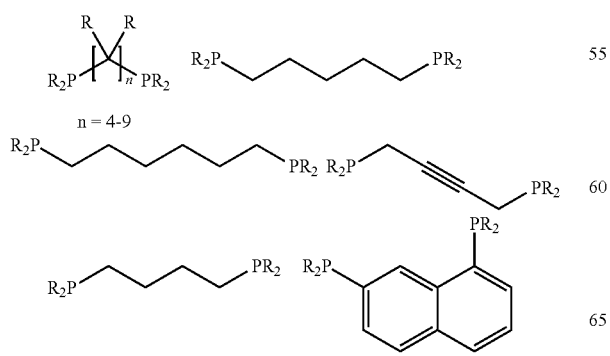

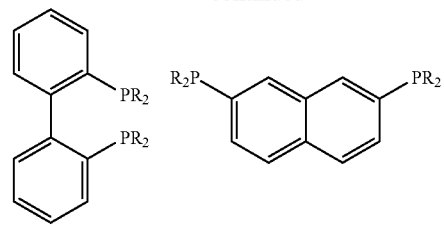

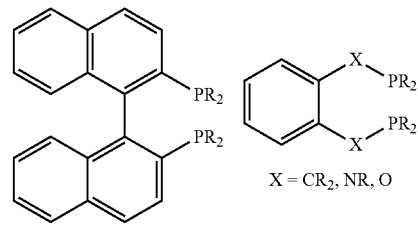

X = $CR_2$, NR, O

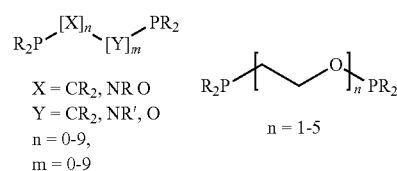

X = $CR_2$, NR O
Y = $CR_2$, NR', O
n = 0-9,
m = 0-9 n = 1-5

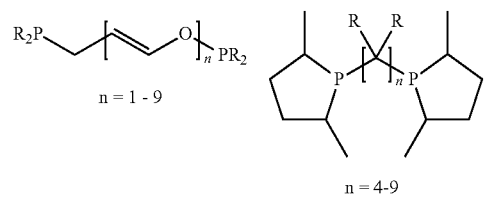

n = 1 - 9 n = 4-9

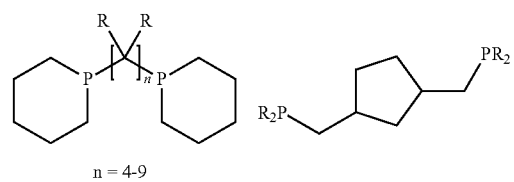

n = 4-9

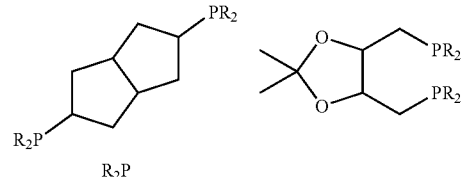

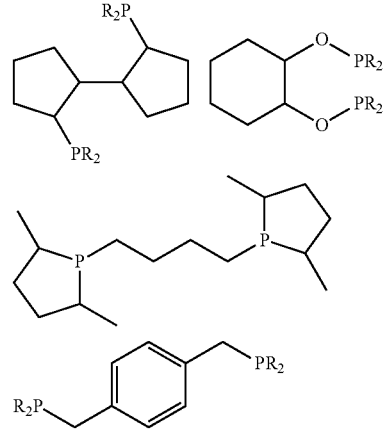

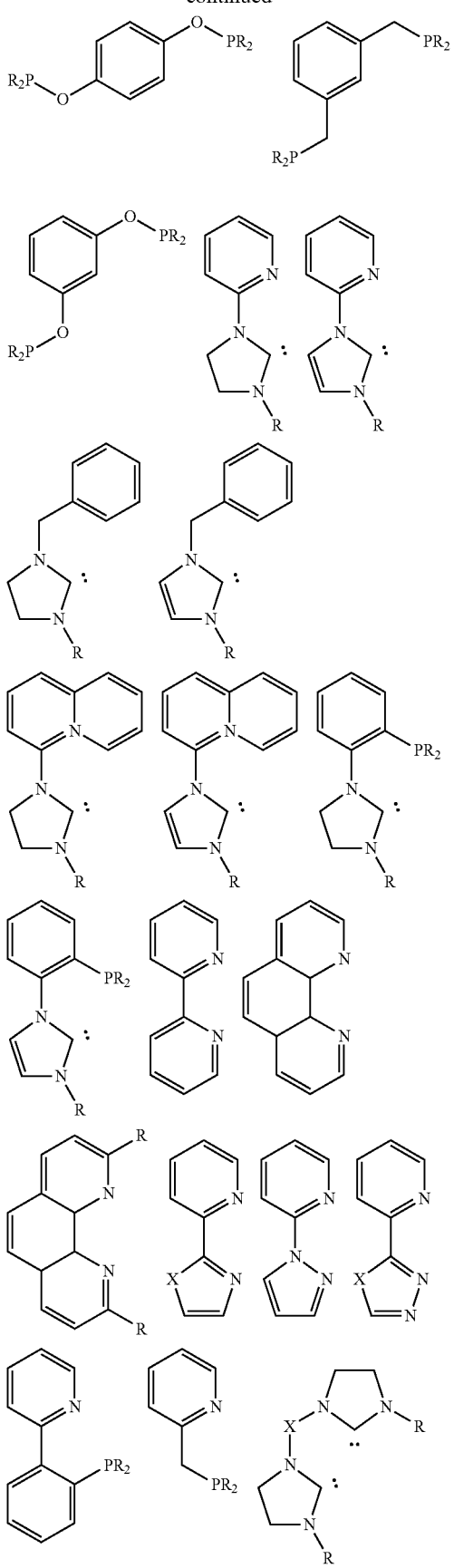
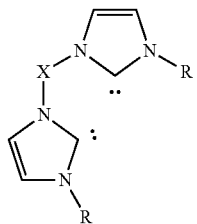

wherein the two dots ":" represent a bivalent carbene that may coordinate the metal, in particular Cu(I); and
wherein R is defined as above.

Exemplarily, the first emitter compound (a) and/or the second emitter compound (b) and/or the host may be a metal complex having a structure according to the following formula N:

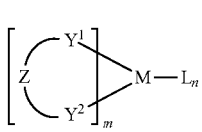

formula N wherein M is a metal, preferably Al, Zn, Cu, Ag, Au, Ir, and Pt;
wherein $Y^1$, $Y^2$ and Z form a bidentate ligand;
wherein $Y^1$ and $Y^2$ are each independently from another selected from the group consisting of, N, O, P, and S;
wherein Z may be any divalent organic linker, in particular wherein Z is defined as in the context of any of formulas A, B, F and/or H above;
wherein L is an ancillary ligand, in particular such as defined in the context of any of formula H above; and
wherein each of n and m is independently from another an integer from 0 to the maximum number of ligands that may be bound to the metal M, wherein the sum of m and n is an integer from 1 to the maximum number of ligands that may be bound to the metal M.

Exemplarily, the metal complex is selected from any one of the following structures according to formula N' or N":

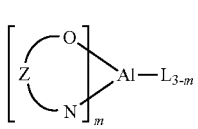

formula N'

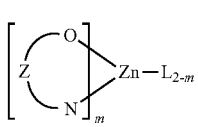

formula N"

wherein is oxygen, N is nitrogen, Al is aluminum and Zn is zink; and
wherein the other residues Z, L and m are defined as above.

Alternatively, the bidentate ligand comprising $Y^1$, $Y^2$ and Z may also be a carbene ligand.

Exemplarily, the first emitter compound (a) and/or the second emitter compound (b) may be a purely organic thermally activated delayed fluorescence (TADF) emitter compound having one of the following structures O1-9:

formula O1
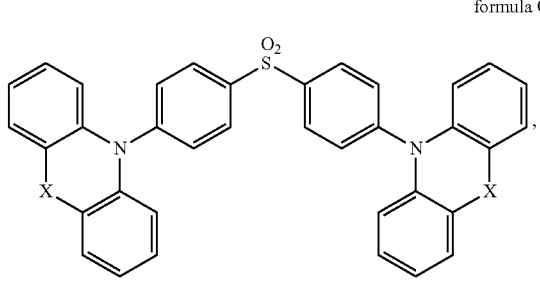

formula O5
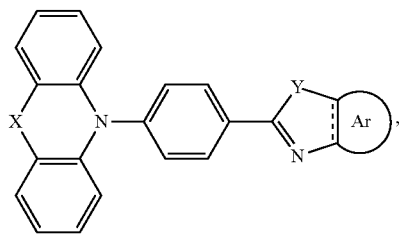

formula O2
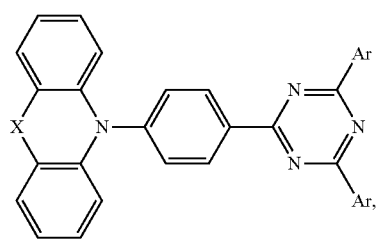

formula O6
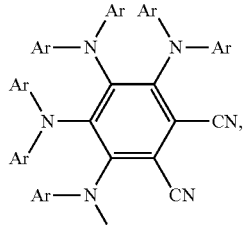

formula O7

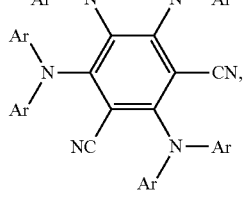

formula O3
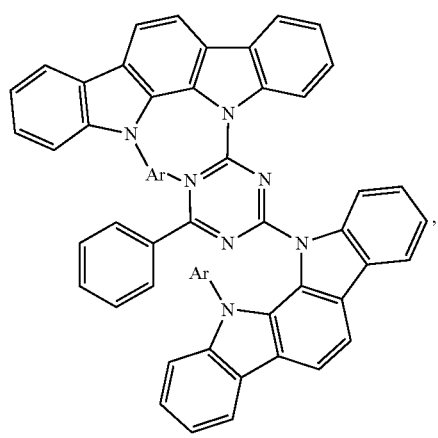

formula O8 formula O9 formula O4
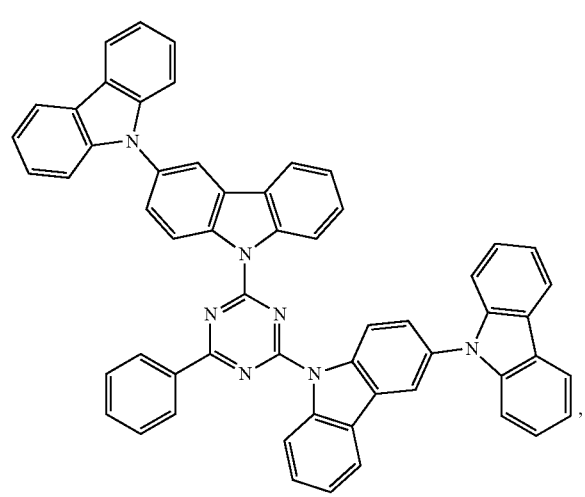

wherein X represents a direct bond or a divalent organic linkage comprising or consisting of a residue selected from the group consisting of a substituted or unsubstituted $C_{1-9}$-alkylene, $C_{2-8}$-alkenylene, $C_{2-8}$-alkinylene or arylene residue (e.g., substituted or unsubstituted phenylenes residue), —CRR'—, —C=CRR'—, —C=NR—, —NR—, —O—, —SiR$^a$—, —S—, —S(O)—, and —S(O)$_2$—, or a combination of two or more thereof;

wherein Y represents NR, O, or S;

wherein Ar is a substituted or unsubstituted aryl or heteroaryl group selected from the group consisting of aromatic and heteroaromatic rings of 5 to 24 aromatic ring atoms that may be optionally substituted, e.g., by one or more residue(s) R, preferably Ar is selected from the group consisting of benzyl, phenyl ortho-, meta- or para-biphenyl, ortho-, meta-, para- or branched terphenyl, ortho-, meta-, para- or branched quaterphenyl, 1-naphtyl, 2-naphtyl, pyrrol, furanyl, thiophenyl, indolyl, benzofuranyl, benzothiophenyl, carbazolyl, dibenzofuranyl, dibenzothiophenyl, pyridinyl, pyrimidinyl, pyrazinyl, pyridazinyl, triazinyl, anthracenyl, phenanthrenyl, pyrenyl, benzanthracenyl and combinations of two or more thereof, that may optionally be substituted, e.g., by one or more residue(s) R, in particular wherein Ar is phenyl or benzyl;

wherein R and R' each independently from another may be the same of different and are selected from the group consisting of hydrogen, deuterium, —F, —Cl, —Br, —I, —$NR^aR^b$, —CN, —$CF_3$, —$NO_2$, —OH, —COOH, —$COOR^a$, —$CO(NR^a)(NR^b)$, —$SiR^aR^bR^c$, —$B(OR^a)(OR^b)$, —CO—$R^a$, —$POR^aR^b$, —O—$POR^aR^b$, —SO—$R^a$, —$SO_2R^a$, —$OSO_2R^a$, a linear alkyl, alkoxy or thioalkoxy residue of 1 to 40 carbon atoms, a linear alkenyl or alkinyl residue of 2 to 40 carbon atoms, a branched or cyclic alkyl, alkoxy, thioalkoxy, alkenyl or alkinyl residue of 3 to 40 carbon atoms, an aromatic or heteroaromatic ring of 5 to 60 aromatic ring atoms, an aryloxy or heteroaryloxy residue of 5 to 60 aromatic ring atoms, a diarylamino, diheteroarylamino or arylheteroarylamino residue of 10 to 40 aromatic ring atoms, that may be each optionally substituted, e.g., by one or more residue(s) $R^a$, wherein two or more adjacent $CH_2$ moieties may be optionally replaced by —$R^aC=CR^b$—, —C≡C—, —$SiR^aR^b$—, —$GeR^aR^b$—, —$SnR^aR^b$—, —CO—, —CS—, —CSe—, —$CNR^a$—, —$POR^a$—, —O—(PO)$R^a$—O—, —SO—, $SO_2$, —$NR^a$—, —O—, —S— or —$CONR^a$— and wherein one or more hydrogens may optionally be substituted by deuterium, F, Cl, Br, I, CN, $CF_3$ or $NO_2$, and/or wherein two or more of the aforementioned R may optionally form with another a mono-, bi- or polycyclic aliphatic or aromatic cyclic system;

wherein $R^a$, $R^b$ and $R^c$ are each independently from another selected from the group consisting of hydrogen, deuterium, —F, —Cl, —Br, —I, —$NR^dR^e$, —CN, —$CF_3$, —$NO_2$, —OH, —COOH, —$COOR^e$, —$CO(NR^d)(NR^e)$, —$SiR^dR^eR^f$, —$B(OR^d)(OR^e)$, —CO—$R^a$, —$POR^dR^e$, —O—$POR^dR^e$, —SO—$R^d$, —$SO_2R^d$, —$OSO_2R^d$, a linear alkyl, alkoxy or thioalkoxy residue of 1 to 40 carbon atoms, a linear alkenyl or alkinyl residue of 2 to 40 carbon atoms, a branched or cyclic alkyl, alkoxy, thioalkoxy, alkenyl or alkinyl residue of 3 to 40 carbon atoms, an aromatic or heteroaromatic ring of 5 to 60 aromatic ring atoms, an aryloxy or heteroaryloxy residue of 5 to 60 aromatic ring atoms, a diarylamino, diheteroarylamino or arylheteroarylamino residue of 10 to 40 aromatic ring atoms, that may be each optionally substituted, e.g., by one or more residue(s) $R^d$, wherein two or more adjacent $CH_2$ moieties may be optionally replaced by —$R^dC=CR^e$—, —C≡C—, —$SiR^dR^e$—, —$GeR^dR^e$—, —$SnR^dR^e$—, —CO—, —CS—, —CSe—, —$CNR^d$—, —$POR^d$—, —O—(PO)$R^d$—O—, —SO—, $SO_2$, —$NR^d$—, —O—, —S— or —$CONR^d$— and wherein one or more hydrogens may optionally be substituted by deuterium, F, Cl, Br, I, CN, $CF_3$ or $NO_2$, or wherein two or more of the aforementioned R may optionally form with another a mono-, bi- or polycyclic aliphatic or aromatic cyclic system;

wherein $R^d$, $R^e$ and $R^f$ are each independently from another selected from the group consisting of hydrogen, deuterium, F, $CF_3$, and an aliphatic, aromatic and/or heteroaromatic residue of 1 to 20 carbon atoms, wherein optionally one or more hydrogen atoms may be substituted by F or $CF_3$, wherein two or more of $R^d$, $R^e$, $R^f$ and/or its substituents may form a mono-, bi-, or polycyclic aliphatic cyclic system.

Example XVII: Preferred Compounds as Emitter Compound (a)

Particularly preferably, an emitter compound (a) is a Cu(I) complex having a structure selected from the group consisting of structures A, B, C, D, E, F and H as laid out above.

Alternatively, an emitter compound (a) may also be a TADF emitter having a structure of any one of structures O1-O9 as depicted above.

Alternatively, an emitter compound (a) may also be a phosphorescence emitter as known in the art.

Example XVIII: Preferred Compounds as Emitter Compound (b)

Particularly preferably, an emitter compound (b) is a Cu(I) complex having a structure selected from the group consisting of structures A, C, E and H as laid out above, a TADF emitter having a structure of any one of structures O1-O9 as depicted above or a fluorescence emitter as known in the art.

Alternatively, an emitter compound (b) may also be a phosphorescence emitter as known in the art.

Example XIX: Combinations of an Emitter Compound (a) with an Emitter Compound (b)

Particularly preferred is a combination of emitter compounds (a) and (b) wherein
(i) emitter compound (a) is a Cu(I) complex (e.g., having a structure selected from the group consisting of A, B, C, D, E, F and H) and emitter compound (b) is a Cu(I) complex (e.g., having a structure selected from the group consisting of A, C, E and H);
(ii) emitter compound (a) is a Cu(I) complex (e.g., having a structure selected from the group consisting of A, B, C, D, E, F and H) and emitter compound (b) is an organic TADF emitter (e.g., having a structure of any one of structures O1-O9); or
(iii) emitter compound (a) is a Cu(I) complex (e.g., having a structure selected from the group consisting of A, B, C, D, E, F and H) and emitter compound (b) is a fluorescence emitter as known in the art.

Alternatively, a combination of emitter compounds (a) and (b) is such wherein
(i) emitter compound (a) is an organic TADF emitter (e.g., having a structure of any one of structures O1-O9) and emitter compound (b) is a Cu(I) complex (e.g., having a structure selected from the group consisting of A, C, E and H);
(ii) emitter compound (a) is an organic TADF emitter (e.g., having a structure of any one of structures O1-O9) and emitter compound (b) is an organic TADF emitter (e.g., having a structure of any one of structures O1-O9); or
(iii) emitter compound (a) is an organic TADF emitter (e.g., having a structure of any one of structures O1-O9) and emitter compound (b) is a fluorescence emitter as known in the art.

Alternatively, a combination of emitter compounds (a) and (b) is such wherein
(i) emitter compound (a) is a Cu(I) complex (e.g., having a structure selected from the group consisting of A, B, C, D, E, F and H) and emitter compound (b) is phosphorescence emitter;
(ii) emitter compound (a) is an organic TADF emitter (e.g., having a structure of any one of structures O1-O9) and emitter compound (b) is phosphorescence emitter;

(iii) emitter compound (a) is phosphorescence emitter and emitter compound (b) is a Cu(I) complex (e.g., having a structure selected from the group consisting of A, C, E and H); or
(iii) emitter compound (a) is phosphorescence emitter and emitter compound (b) is an organic TADF emitter (e.g., having a structure of any one of structures O1-O9)

Example XX: Combinations of an Emitter Compound (a) with an Emitter Compound (b) with Respect to their Emission Properties Particularly preferred combinations are such wherein:
(i) a blue light-emitting Cu(I) complex is combined with another blue light-emitting emitter, wherein the emission and/or excitation maximum (Δλ) differs by at least 20 nm;
(ii) a blue light-emitting Cu(I) complex is combined with a green light-emitting emitter, wherein the emission and/or excitation maximum (Δλ) differs by at least 30 nm;
(iii) a blue light-emitting Cu(I) complex is combined with a red light-emitting emitter, wherein the emission and/or excitation maximum (Δλ) differs by at least 100 nm;
(iv) a green light-emitting Cu(I) complex is combined with another green light-emitting emitter, wherein the emission and/or excitation maximum (Δλ) differs by at least 20 nm;
(v) a green light-emitting Cu(I) complex is combined with a red light-emitting emitter, wherein the emission and/or excitation maximum (Δλ) differs by at least 50 nm; or
(vi) a red light-emitting Cu(I) complex is combined with another red light-emitting emitter with a higher emission and/or excitation maximum.

Accordingly, the emission and/or excitation maximum of emitter compound (a) preferably differs at least by 20 nm from the emission and/or excitation maximum of emitter compound (b).

REFERENCES

European patent application No. 14164815
WO 2010/031485
WO 2010/149748
WO 2011/161417
WO 2012/016074
WO 2012/130571
WO 2013/001086
WO 2013/007707
WO 2013/007709
WO 2013/007710
WO 2013/014066
WO 2013/017675
WO 2013/072508
WO 2014/102079
US 2012/0217869
US 2014/0077172

The invention claimed is:
1. A light-emitting layer B comprising:
(a) a first emitter compound (a) having a non-exited state S0(a), a first excited singlet state S1(a) and a first excited triplet state T1(a);
(b) a second emitter compound (b) having a non-exited state S0(b), a first excited singlet state S1(b) and a first excited triplet state T1(b); and
(c) optionally, one or more host components (c),
wherein the energy level of S1(a) is higher than that of S1(b), the energy level of S1(a) is higher than that of T1(a), the energy level of S1(b) is higher than that of T1(b), and exciton energy is transferred from the first emitter compound (a) to the second emitter compound (b),
wherein the rate of reverse intersystem crossing from T1(a) to S1(a) is higher than the rate of excitation energy transfer from S1(a) to S1(b),
wherein the rate of reverse intersystem crossing from T1(a) to S1(a) is higher than the rate of the radiative or non-radiative transition from T1(a) to S0(a),
wherein the light emitting layer B is further characterized by one or both of the following:
(i) the rate of reverse intersystem crossing from T1(a) to S1(a) is higher than the rate of excitation energy transfer from T1(a) to T1(b), or
(ii) the energy level of T1(b) is higher than that of T1(a), wherein energy transfer from S1(a) to S1(b) and radiative decay from S1(b) to S0(b) occur in the light-emitting layer B,
wherein the energy difference $\Delta E_{ST}(b)$ between S1(b) and T1(b) is not higher than 10000 cm$^{-1}$,
wherein at least one of the emitter compounds (a) and (b) is a thermally activated delayed fluorescence (TADF) emitter having an energy gap between its first excited singlet state and its first excited triplet state $\Delta E_{ST}$ of not more than 5000 cm$^{-1}$, and
wherein the molar ratio of the first emitter compound (a) and the second emitter compound (b) (a):(b) is from 50:50 to 95:5,
wherein emitter compounds (a) and (b) are, independently from one another, a purely organic TADF emitter or a metal complex comprising a complexed metal selected from the group consisting of Cu(I), Ag(I), Au(I) and Zn(II),
wherein the energy difference $\Delta E_{LUMO}(a,b)$ between the lowest unoccupied energy level of the first emitter compound LUMO(a) and the lowest unoccupied energy level of the second emitter compound LUMO (b) is not higher than 2 eV.

2. The light-emitting layer B according to claim 1, wherein the energy difference $\Delta E_{ST}(a)$ between S1(a) and T1(a) is not higher than 7000 cm$^{-1}$.

3. The light-emitting layer B according to claim 1, wherein the energy difference $\Delta E_{HOMO}(a,b)$ between the highest occupied energy level of the first emitter compound HOMO(a) and the highest occupied energy level of the second emitter compound HOMO(b) is not higher than 1.8 eV.

4. The light-emitting layer B according to claim 1, wherein the energy difference $\Delta E_{LUMO}(a,b)$ between the lowest unoccupied energy level of the first emitter compound LUMO(a) and the lowest unoccupied energy level of the second emitter compound LUMO(b) is not higher than 1.5 eV.

5. The light-emitting layer B according to claim 1, wherein the light emitting layer B is further characterized by one or more of the following selected from
the rate of radiative transition from S1(b) to S0(b) differs from the transition rate from S1(a) to S1(b);
the rate of reverse intersystem crossing from T1(a) to S1(a) is higher than Forster or Dexter energy transfer from T1(a) to T1(b);
the rate of intersystem crossing from S1(b) to T1(b) differs from the rate of transition from S1(a) to S1(b); or
the rate of the Förster resonance energy transfer from both the excited singlet and the excited triplet state of the first emitter compound S1(a) and T1(a) to the excited singlet and excited triplet state of the second emitter compound S1(b) and T1(b) is higher than the rate of the radiative transition from T1(a) to S0(a).

6. The light-emitting layer B according to claim 1, wherein the molar ratio between the first emitter compound (a) and the second emitter compound (b) (a):(b) is from 60:40 to 95:5.

7. The light-emitting layer B according to claim 1, wherein at least one of the emitter compounds (a) or (b) is either a purely organic thermally activated delayed fluorescence emitter compound or a Cu(I) complex.

8. The light-emitting layer B according to claim 1, wherein said light-emitting layer B concomitantly has a functionality selected from the group consisting of an electron transport layer, a hole blocking layer, a hole transport layer and an electron blocking layer.

9. A method of preparing a light-emitting layer B of claim 1, comprising the step of bringing the first emitter compound (a) and the second emitter compound (b) in close proximity with each other, by means of:
(i) admixing the first emitter compound (a) and the second emitter compound (b) and optionally one or more host components (c) with each other, optionally in a solvent where (a), (b) and optionally (c) are dissolved in;
(ii) providing a first layer comprising the first emitter compound (a) directly contacted with a second layer comprising the second emitter compound (b) and optionally one or more host components (c);
(iii) providing a first layer comprising the first emitter compound (a) and optionally one or more host components (c) separated from a second layer comprising the second emitter compound (b) and optionally one or more host components (c) by a third layer that is a charge generation layer;
(iv) using vacuum processing where the first emitter compound (a) and the second emitter compound (b) and optionally one or more host components (c) are co-deposited to form a mixed layer of the two emitter compounds (a) and (b); or
(v) using vacuum processing where the first emitter compound (a) and the second emitter compound (b) and optionally one or more host components (c) are co-deposited to form a gradient of the two emitter compounds (a) and (b).

10. An opto-electronic device comprising a light-emitting layer B according to claim 1.

11. The opto-electronic device according to claim 10, comprising at least the layers:
A) an anode layer A comprising indium tin oxide, indium zinc oxide, PbO, SnO, graphite, doped silicium, doped germanium, doped GaAs, doped polyaniline, doped polypyrrole, doped polythiophene, or a combination of two or more thereof;
B) a light-emitting layer B according to claim 1; and
C) a cathode layer C comprising Al, Au, Ag, Pt, Cu, Zn, Ni, Fe, Pb, In, W, Pd, LiF, Ca, Ba, Mg, or mixtures or alloys of two or more thereof.

12. The opto-electronic device according to claim 10, wherein said opto-electronic device is a device selected from the group consisting of an organic light emitting diode, a light emitting electrochemical cell, a transistor, a light-emitting transistor, an organic solar cell, and an optical sensor.

13. A method for generating light of a desired wavelength range, comprising the step of providing an opto-electronic device according to claim 10.

14. The light-emitting layer B according to claim 1, wherein:
(i) both emitter compounds (a) and (b) are thermally activated delayed fluorescence emitters,
(ii) emitter compound (a) is a thermally activated delayed fluorescence emitter and emitter compound (b) is a fluorescence or phosphorescence emitter, or
(iii) emitter compound (a) is a phosphorescence emitter and emitter compound (b) is a thermally activated delayed fluorescence emitter.

15. The light-emitting layer B according to claim 1, wherein the energy difference $\Delta E_{ST}(a)$ between S1(a) and T1(a) is not higher than 1500 cm$^{-1}$.

16. The light-emitting layer B according to claim 1, wherein the energy difference $\Delta E_{ST}(b)$ between S1(b) and T1(b) is not higher than 1500 cm$^{-1}$.

17. The light-emitting layer B according to claim 1, wherein the energy difference $\Delta E_{HOMO}(a,b)$ between the highest occupied energy level of the first emitter compound HOMO(a) and the highest occupied energy level of the second emitter compound HOMO(b) is not higher than 1 eV.

18. The light-emitting layer B according to claim 1, wherein the energy difference $\Delta E_{LUMO}(a,b)$ between the lowest unoccupied energy level of the first emitter compound LUMO(a) and the lowest unoccupied energy level of the second emitter compound LUMO(b) is not higher than 1 eV.

19. The light-emitting layer B according to claim 1, wherein the light emitting layer B is further characterized by one or more of the following:
the radiative transition from S1(b) to S0(b) is faster than the transition from S1(a) to S1(b);
the transition from S1(a) to S1(b) is faster than the radiative transition from S1(a) to S0(a); or
the intersystem crossing from S1(b) to T1(b) is faster than the transition from S1(a) to S1(b).

20. The light-emitting layer B according to claim 1, wherein at least one of the emitter compounds (a) or (b) is a Cu(I) complex of one of the following structures (I)-(III):

wherein L$^i$-L$^{iiii}$ are each independently selected from:
A) suitable organic ligands L, which may be the same or different, or
B) residues of organic ligands, which may be the same or different,
wherein optionally two or more of L$^i$-L$^{iiii}$ may be covalently bound with another;
wherein X and X' each independently represent an inorganic ligand or an anion selected from the group consisting of Cl$^-$, Br$^-$, I$^-$, SCN$^-$, CN$^-$, RS$^-$, RSe$^-$, RR'N$^-$, RR'P$^-$ and R—C≡C$^-$, wherein R and R' are an organic residue independently selected from the group consisting of an unsubstituted or substituted $C_{1-20}$-alkyl residue, an adamantadyl residue, an unsubstituted or substituted $C_{7-40}$-alkylaryl residue, an unsubstituted or substituted $C_{7-40}$-arylalkyl residue, an unsubstituted or substituted $C_{7-40}$-alkylarylalkyl residue, an unsubstituted or substituted $C_{6-14}$-aryl residue, an unsubstituted or substituted $C_{2-13}$-heteroaryl residue, an unsubstituted or substituted $C_{2-20}$-alkenyl residue (e.g., CR=CR"R'"), an unsubstituted or substituted $C_{2-20}$-alkinyl residue, —OR", and —NR"R'", wherein R", R'" are defined as R any may optionally also be H.

* * * * *